United States Patent [19]
Deao et al.

[11] Patent Number: 6,065,106
[45] Date of Patent: May 16, 2000

[54] RESUMING NORMAL EXECUTION BY RESTORING WITHOUT REFETCHING INSTRUCTIONS IN MULTI-WORD INSTRUCTION REGISTER INTERRUPTED BY DEBUG INSTRUCTIONS LOADING AND PROCESSING

[75] Inventors: Douglas E. Deao, Brookshire; Natarajan Seshan, Houston, both of Tex.

[73] Assignee: Texas Instruments Incorporated, Dallas, Tex.

[21] Appl. No.: 08/974,741

[22] Filed: Nov. 19, 1997

Related U.S. Application Data

[60] Provisional application No. 60/034,261, Dec. 20, 1996.

[51] Int. Cl.[7] .................................................. G06F 11/26
[52] U.S. Cl. .............................. 712/24; 712/227; 714/30
[58] Field of Search ................................... 712/227, 229, 712/23, 24; 714/726, 30

[56] References Cited

U.S. PATENT DOCUMENTS

| | | | |
|---|---|---|---|
| 4,701,921 | 10/1987 | Powell et al. | 714/727 |
| 4,811,345 | 3/1989 | Johnson | 714/27 |
| 4,860,290 | 8/1989 | Daniels et al. | 714/726 |
| 5,084,814 | 1/1992 | Vaglica et al. | 395/325 |
| 5,530,804 | 6/1996 | Edgington et al. | 714/30 |
| 5,535,331 | 7/1996 | Swoboda et al. | 714/45 |
| 5,537,538 | 7/1996 | Bratt et al. | 714/38 |
| 5,564,028 | 10/1996 | Swoboda et al. | 712/227 |

OTHER PUBLICATIONS

The Implementation and Application of Micro Rollback in Fault–Tolerant VLSI Systems, IEEE, 1988, pp. 234–239.
A Survey of Design for Testability Scan Techniques, VLSI Design, Dec. 1984, pp. 38–39, 42, 46, 48, 59–61.
TMX320C6201 Digital Signal Processor, Texas Instruments Product Preview, Jan. 1997, p. 1.
TMS320C62xx CPU and Instruction Set, Texas Instruments Product Preview, Jan. 1997, p. 1.

*Primary Examiner*—Kenneth S. Kim
*Attorney, Agent, or Firm*—Gerald E. Laws; Robert D. Marshall, Jr.; Richard L. Donaldson

[57] ABSTRACT

A data processing system on an integrated circuit 42 with microprocessor 1 and peripheral devices 60–61 is provided with an emulation unit 50 which allows debugging and emulation of integrated circuit 42 when connected to an external test system 51. Microprocessor 1 has in instruction execution pipeline which has several execution phases which involve fetch/decode units 10a–c and functional execution units 12, 14, 16 and 18. The pipeline of microprocessor 1 is unprotected so that memory access latency to data memory 22 and register file 20 can be utilized by system program code which is stored in instruction memory 23. Emulation unit 50 provides means for emulating the unprotected pipeline of microprocessor 1 and for rapidly uploading and downloading memories 22–23. During emulation, the fetching of instructions from program memory can be halted. A packet of instructions can be transferred from the emulation unit to the instruction register of the processor via a test port and executed without fetching instructions from instruction memory. The packet of instructions can perform various tasks, such as loading or storing data or loading new instructions into program memory. Emulation unit 50 operates in a manner to prevent extraneous operations from occurring which could otherwise affect memories 22–23 or peripheral devices 60–61 during emulation.

22 Claims, 33 Drawing Sheets

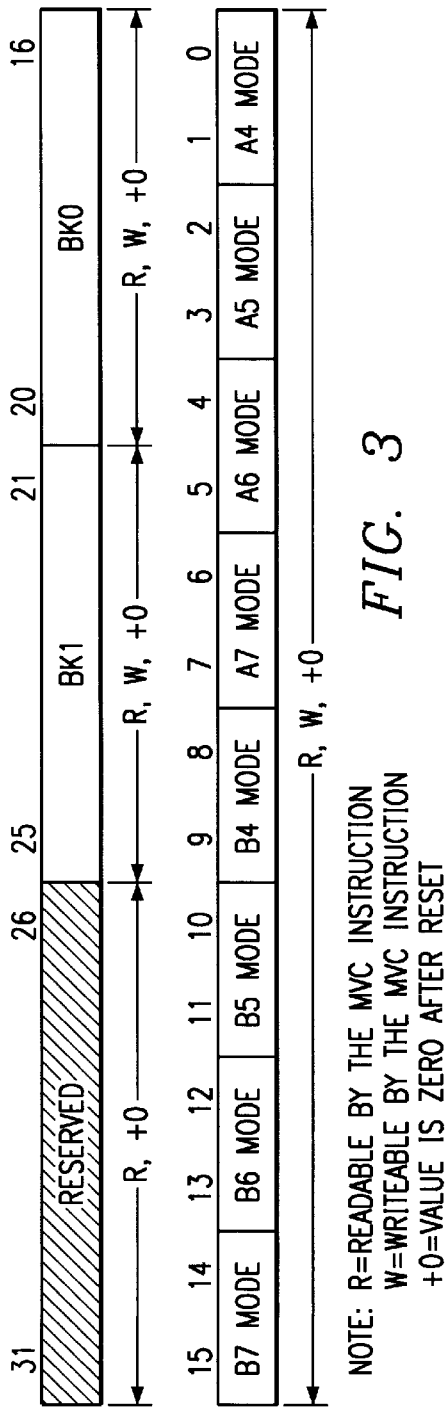
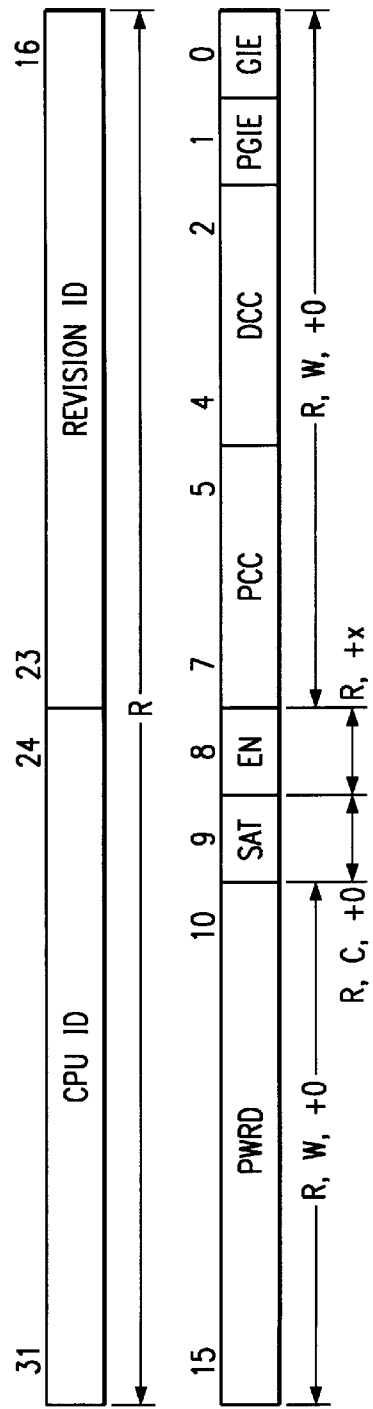
FIG. 3
FIG. 4

OPERATIONS ON THE .L UNIT

| 31 29 | 28 27 | 23 22 | 18 17 | 13 12 11 | 5 4 3 2 1 0 |
|---|---|---|---|---|---|
| CREG | Z | DST | SCR2 | SRC1/CST | X | OP | 1 1 0 S P |
| 3 | | 5 | 5 | 5 | | 7 | |

FIG. 8A

OPERATIONS ON THE .M UNIT

| 31 29 | 28 27 | 23 22 | 18 17 | 13 12 11 | 7 6 5 4 3 2 1 0 |
|---|---|---|---|---|---|
| CREG | Z | DST | SCR2 | SRC1/CST | X | OP | 0 0 0 0 S P |
| 3 | | 5 | 5 | 5 | | 5 | |

FIG. 8B

OPERATIONS ON THE .D UNIT

| 31 29 | 28 27 | 23 22 | 18 17 | 13 12 | 7 6 5 4 3 2 1 0 |
|---|---|---|---|---|---|
| CREG | Z | DST | SCR2 | SRC1/CST | OP | 1 0 0 0 S P |
| 3 | | 5 | 5 | 5 | 6 | |

FIG. 8C

LOAD/STORE WITH 15-BIT OFFSET (ON THE .D UNIT)

| 31 29 | 28 27 | 23 22 | 8 7 6 4 3 2 1 0 |
|---|---|---|---|
| CREG | Z | DST/SRC | UCST15 | Y | LD/ST | 1 1 S P |
| 3 | | 5 | 15 | | 3 | |

FIG. 8D

LOAD/STORE 'BASER' + 'OFFSETR/CST' ON THE .D UNIT

| 31 29 | 28 27 | 23 22 | 18 17 | 13 12 | 9 8 7 6 4 3 2 1 0 |
|---|---|---|---|---|---|
| CREG | Z | DST/SRC | BASE R | OFFSET R/UCST5 | MODE | R | Y | LD/ST | 0 1 S P |
| 3 | | 5 | 5 | 5 | 4 | | | 3 | |

FIG. 8E

OPERATIONS ON THE .S UNIT

| 31 | 29 28 27 | 23 22 | 18 17 | 13 12 11 | 6 5 4 3 2 1 0 |
|---|---|---|---|---|---|
| CREG | Z | DST | SRC2 | SRC1/CST | X | OP | 0 0 0 0 | S | P |
| 3 | | 5 | 5 | 5 | 6 |

FIG. 8F

ADDK ON THE .S UNIT

| 31 | 29 28 27 | 23 22 | | | 7 6 5 4 3 2 1 0 |
|---|---|---|---|---|---|
| CREG | Z | DST | CST | 1 0 1 0 0 0 | S | P |
| 3 | | 5 | 16 |

FIG. 8G

BITFIELD OPERATIONS (IMMEDIATE FORMS) ON THE .S UNIT

| 31 | 29 28 27 | 23 22 | 18 17 | 13 12 | 8 7 6 5 4 3 2 1 0 |
|---|---|---|---|---|---|
| CREG | Z | DST | SRC2 | CSTA | CSTB | OP | 0 0 1 0 | S | P |
| 3 | | 5 | 5 | 5 | 5 | 2 |

FIG. 8H

MVK AND MVKH ON THE .S UNIT

| 31 | 29 28 27 | 23 22 | | | 7 6 5 4 3 2 1 0 |
|---|---|---|---|---|---|
| CREG | Z | DST | DST | H 1 0 1 0 | S | P |
| 3 | | 5 | 16 |

FIG. 8I

BCOND DISP ON THE .S UNIT

| 31 | 29 28 27 | | | | 7 6 5 4 3 2 1 0 |
|---|---|---|---|---|---|
| CREG | Z | CST | 0 0 1 0 0 | S | P |
| 3 | | 21 |

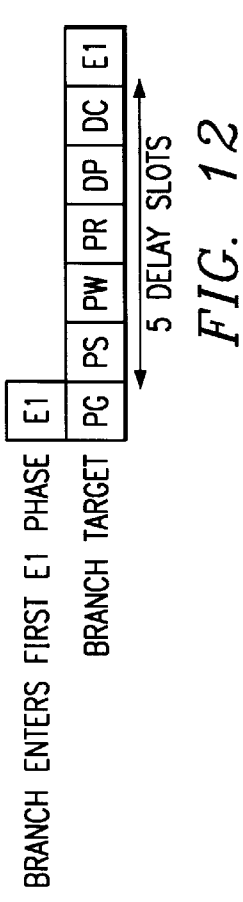
FIG. 11
FIG. 12
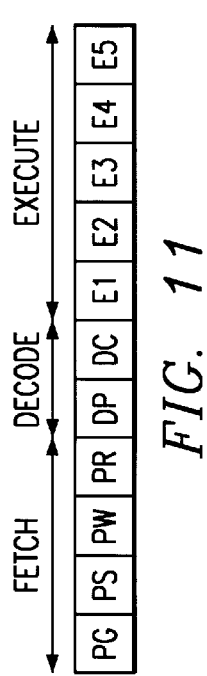
FIG. 13

| FETCH PACKET | EXECUTE PACKET | CLOCK CYCLE | | | | | | | | | | | | | | | | | | | | | |
|---|---|---|---|---|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
| n | k | PG | PS | PW | PR | DP | DC | E1 | E2 | E3 | E4 | E5 | | | | | | | | | | | | |
| n | k+1 | | | | | | DP | DC | E1 | E2 | E3 | E4 | E5 | | | | | | | | | | | |
| n | k+2 | | | | | | | DP | DC | E1 | E2 | E3 | E4 | E5 | | | | | | | | | | |
| n+1 | k+3 | | | | | PG | PS | PW | PR | DP | DC | E1 | E2 | E3 | E4 | E5 | | | | | | | | |
| n+2 | k+4 | | | | | | | | | PR | DP | DC | E1 | E2 | E3 | E4 | E5 | | | | | | | |
| n+3 | k+5 | | | | | | | | | PW | PR | DP | DC | E1 | E2 | E3 | E4 | E5 | | | | | | |
| n+4 | k+6 | | | | | | | | | PS | PW | PR | DP | DC | E1 | E2 | E3 | E4 | E5 | | | | | |
| n+5 | k+7 | | | | | | | | PG | PS | PW | PR | DP | DC | E1 | E2 | E3 | E4 | E5 | | | | | |
| n+6 | k+8 | | | | | | | | | PG | PS | PW | PR | DP | DC | E1 | E2 | E3 | E4 | E5 | | | | |

FIG. 14

INTERRUPT FLAG REGISTER (IFR)

| 31 | 30 | 29 | 28 | 27 | 26 | 25 | 24 | 23 | 22 | 21 | 20 | 19 | 18 | 17 | 16 |
|----|----|----|----|----|----|----|----|----|----|----|----|----|----|----|----|
| rsv | | | | | | | | | | | | | | | |
| R +x | | | | | | | | | | | | | | | |

| 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|----|----|
| IF15 | IF14 | IF13 | IF12 | IF11 | IF10 | IF9 | IF8 | IF7 | IF6 | IF5 | IF4 | MSGIF | AIF | NMIF | RSTF |
| R +x | R +x | R +x | R +x | R +x | R +x | R +x | R +x | R +x | R +x | R +x | R +x | R +x | R +x | R +x | R +x |

R=MVC READABLE    W=MVC WRITEABLE    +n=VALUE AFTER RESET    x=VALUE UNDEFINED    rsv=RESERVED

*FIG. 17A*

INTERRUPT ENABLE REGISTER (IER)

| 31 | 30 | 29 | 28 | 27 | 26 | 25 | 24 | 23 | 22 | 21 | 20 | 19 | 18 | 17 | 16 |
|----|----|----|----|----|----|----|----|----|----|----|----|----|----|----|----|
| rsv | | | | | | | | | | | | | | | |
| R +x | | | | | | | | | | | | | | | |

| 15 | 14 | 13 | 12 | 11 | 10 | 9 | 8 | 7 | 6 | 5 | 4 | 3 | 2 | 1 | 0 |
|----|----|----|----|----|----|----|----|----|----|----|----|----|----|----|----|
| IE15 | IE14 | IE13 | IE12 | IE11 | IE10 | IE9 | IE8 | IE7 | IE6 | IE5 | IE4 | MSGIE | AIE | NMIE | 1 |
| RW +0 | RW +0 | RW +0 | RW +0 | RW +0 | RW +0 | RW +0 | RW +0 | RW +0 | RW +0 | RW +0 | RW +0 | RW +0 | RW +0 | RW +0 | R +1 |

R=MVC READABLE    W=MVC WRITEABLE    +n=VALUE AFTER RESET    x=VALUE UNDEFINED    rsv=RESERVED

INTERRUPT SET REGISTER (ISR)

| 31 | 30 | 29 | 28 | 27 | 26 | 25 | 24 | 23 | 22 | 21 | 20 | 19 | 18 | 17 | 16 |
|----|----|----|----|----|----|----|----|----|----|----|----|----|----|----|----|
|    |    |    |    |    |    |    |    | rsv |    |    |    |    |    |    |    |
|    |    |    |    |    |    |    |    | +x |    |    |    |    |    |    |    |

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|
| IS15 | IS14 | IS13 | IS12 | IS11 | IS10 | IS9 | IS8 | IS7 | IS6 | IS5 | IS4 | MSGIS | AIS | rsv | rsv |
| W | W | W | W | W | W | W | W | W | W | W | W | W | W |  |  |
| +x | +x | +x | +x | +x | +x | +x | +x | +x | +x | +x | +x | +x | +x | +x | +x |

R=MVC READABLE    W=MVC WRITEABLE    +n=VALUE AFTER RESET    x=VALUE UNDEFINED    rsv=RESERVED

FIG. 17D

ICR: INTERRUPT CLEAR REGISTER (ICR)

| 31 | 30 | 29 | 28 | 27 | 26 | 25 | 24 | 23 | 22 | 21 | 20 | 19 | 18 | 17 | 16 |
|----|----|----|----|----|----|----|----|----|----|----|----|----|----|----|----|
|    |    |    |    |    |    |    |    | rsv |    |    |    |    |    |    |    |
|    |    |    |    |    |    |    |    | +x |    |    |    |    |    |    |    |

| 15 | 14 | 13 | 12 | 11 | 10 | 9 | 8 | 7 | 6 | 5 | 4 | 3 | 2 | 1 | 0 |
|----|----|----|----|----|----|---|---|---|---|---|---|---|---|---|---|
| IC15 | IC14 | IC13 | IC12 | IC11 | IC10 | IC9 | IC8 | IC7 | IC6 | IC5 | IC4 | MSGIC | AIC | rsv | rsv |
| W | W | W | W | W | W | W | W | W | W | W | W | W | W |  |  |
| +x | +x | +x | +x | +x | +x | +x | +x | +x | +x | +x | +x | +x | +x | +x | +x |

R=MVC READABLE    W=MVC WRITEABLE    +n=VALUE AFTER RESET    x=VALUE UNDEFINED    rsv=RESERVED

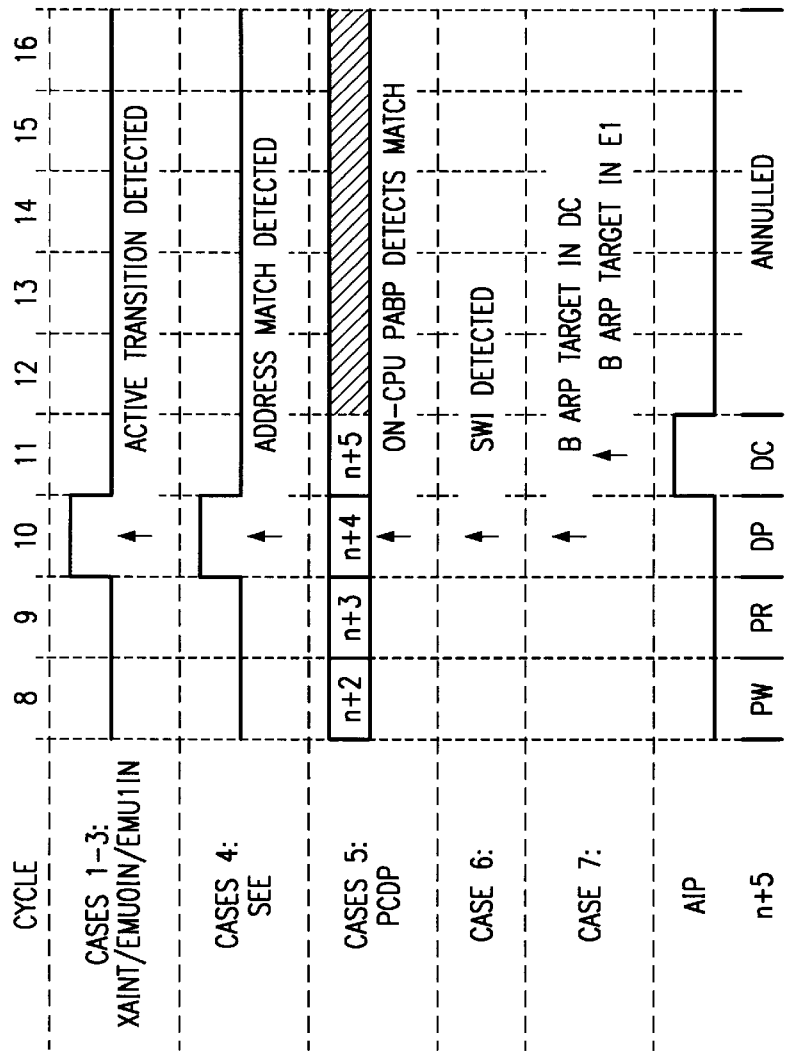
FIG. 18
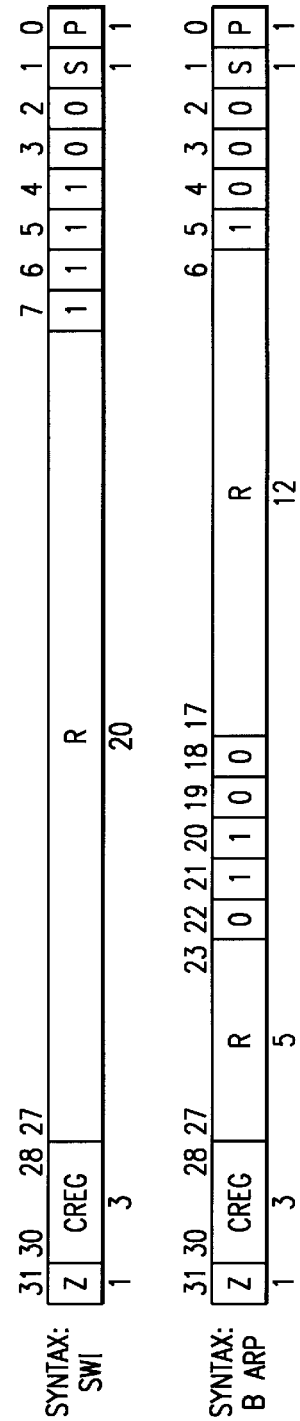
FIG. 19A
FIG. 19B

| MSENB 1 | MSENB 0 | SCAN IN ⇨ SCAN OUT | | | |
|---|---|---|---|---|---|
| 0 | 0 | SSR 1 | SSR 0 | | |
| 0 | 1 | SSR 1 | SSR 0 | DATA 0 | |
| 1 | 0 | SSR 1 | DATA 1 | SSR 0 | |
| 1 | 1 | SSR 1 | DATA 1 | SSR 0 | DATA 0 |

|| INDICATES AN XDS SCAN.    *FIG. 27B*

ANALYSIS CONTROL REGISTER: ACR

390

| 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|
| RESERVED | | | FPX EES | | PABP EES | | CYC EES | | SE EES | | EMU1IN EES | | EMU0IN EES | | XAINT_EVT |
| R | | | RW | | RW | | RW | | RW | | RW | | RW | | R |
| +000 | | | +00 | | +00 | | +00 | | +00 | | +00 | | +00 | | +0 |

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| SWI_EVT | EVENT | | CPU_EMUC | | | | MSGERR | MSGFLG | MSGSW | ACRWE | RSTOCC | AINTSUSP | PRI | AFUN0 | STRAP |
| R | RW | R | RW | | | | R | RW | RW | RW | RW | RW | RW | R | R |
| +0 | +0 | +0 | +0 | | | | +0 | +0 | +x | +0 | +0 | +0 | +0 | +x | +x |

R=MVC READABLE   W=MVC WRITEABLE   +n=VALUE AFTER RESET   x=VALUE UNDEFINED   rsv=RESERVED

*FIG. 30A*

ANALYSIS DATA REGISTER (ADR)

391

| 31 | 30 | 29 | 28 | 27 | 26 | 25 | 24 | 23 | 22 | 21 | 20 | 19 | 18 | 17 | 16 |
|---|---|---|---|---|---|---|---|---|---|---|---|---|---|---|---|
| ADR | | | | | | | | | | | | | | | |
| RW | | | | | | | | | | | | | | | |
| +xxxxxxxxxxxxxxxx | | | | | | | | | | | | | | | |

| 15 | 14 | 13 | 12 | 11 | 10 | 9 | 8 | 7 | 6 | 5 | 4 | 3 | 2 | 1 | 0 |
|---|---|---|---|---|---|---|---|---|---|---|---|---|---|---|---|
| ADR | | | | | | | | | | | | | | | |
| RW | | | | | | | | | | | | | | | |
| +xxxxxxxxxxxxxxxx | | | | | | | | | | | | | | | |

R=MVC READABLE   W=MVC WRITEABLE   +n=VALUE AFTER RESET   x=VALUE UNDEFINED   rsv=RESERVED

*FIG. 30B*

| CYCLE<br>EXEC<br>PACKET | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 |
|---|---|---|---|---|---|---|---|---|---|---|---|---|---|---|---|---|---|---|---|---|---|---|---|
| a | PG | PS | PW | PR | DP | DC | E1 | E2 | E3 | E4 | E5 | | | | | | | | | | | | |
| b | | PG | PS | PW | PR | DP | DC | E1 | E2 | E3 | E4 | E5 | | | | | | | | | | | |
| c | | | PG | PS | PW | PR | DP | DC | E1 | E2 | E3 | E4 | E5 | | | | | | | | | | |
| d | | | | PG | PS | PW | PR | DP | DC | E1 | E2 | E3 | E4 | E5 | | | | | | | | | |
| e | | | | | PG | PS | PW | PR | DP | DC | E1 | E2 | E3 | E4 | E5 | | | | | | | | |
| f | | | | | | PG | PS | PW | PR | DP | DC | E1 | E2 | E3 | E4 | E5 | | | | | | | |
| g | | | | | | | PG | PS | PW | PR | DP | DC | E1 | E2 | E3 | E4 | E5 | | | | | | |
| h | | | | | | | | PG | PS | PW | PR | DP | DC | E1 | E2 | E3 | E4 | E5 | | | | | |
| i | | | | | | | | | PG | PS | PW | PR | DP | DC | E1 | E2 | E3 | E4 | E5 | | | | |
| j | | | | | | | | | | PG | PS | PW | PR | DP | DC | E1 | E2 | E3 | E4 | E5 | | | |
| k | | | | | | | | | | | PG | PS | PW | PR | DP | DC | E1 | E2 | E3 | E4 | E5 | | |
| l | | | | | | | | | | | | PG | PS | PW | PR | DP | DC | E1 | E2 | E3 | E4 | E5 | |

FIG. 31

| (MSB) | | | | | | | (LSB) |
|---|---|---|---|---|---|---|---|
| 7 | 6 | 5 | 4 | 3 | 2 | 1 | 0 |
| X | X | X | SEA_DET | CSM_EXE | CSM_LOCK | STRAP- | STRAP |

*FIG. 34A*

| (MSB) | | | | | | | (LSB) |
|---|---|---|---|---|---|---|---|
| 7 | 6 | 5 | 4 | 3 | 2 | 1 | 0 |
| 0 | ABP_DET | SWBP_DEC | DONE_TGLE | SYNC_ERR | IRBUSY | TCLK_SEL | STRAP |

*FIG. 34B*

| (MSB) | | | | | | | (LSB) |
|---|---|---|---|---|---|---|---|
| 7 | 6 | 5 | 4 | 3 | 2 | 1 | 0 |
| MINT_TGLE | AINT_TGLE | MSGFLG | MSGSW_TGLE | SYNC_ERR | IRBUSY | TCLK_SEL | STRAP |

*FIG. 34C*

| (MSB) | | | | | | | (LSB) |
|---|---|---|---|---|---|---|---|
| 7 | 6 | 5 | 4 | 3 | 2 | 1 | 0 |
| STRY_TGLE | STSW_TGLE | MINT_EN | AINT_EN | RST_TGLE | C1 | C0 | Ce |

*FIG. 34D*

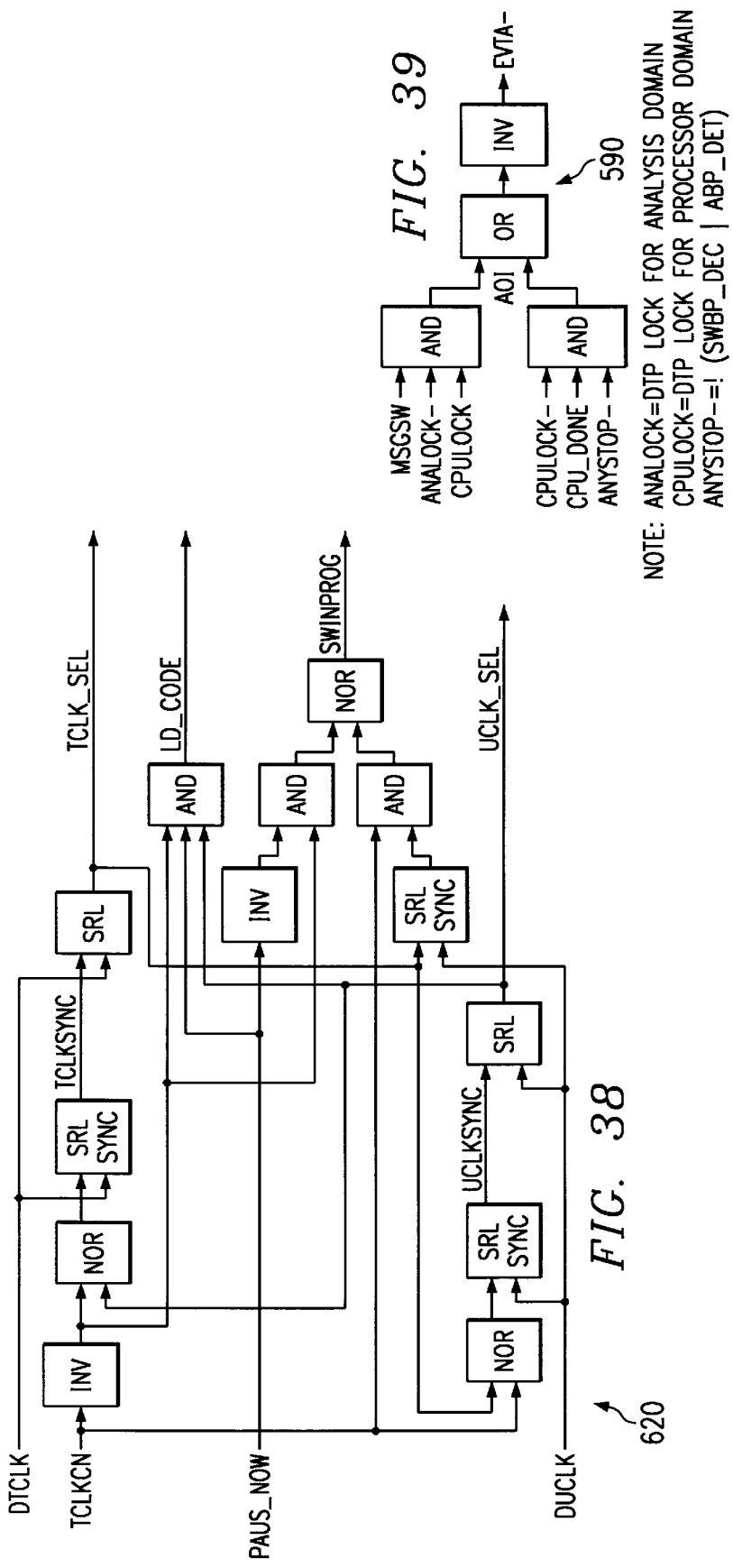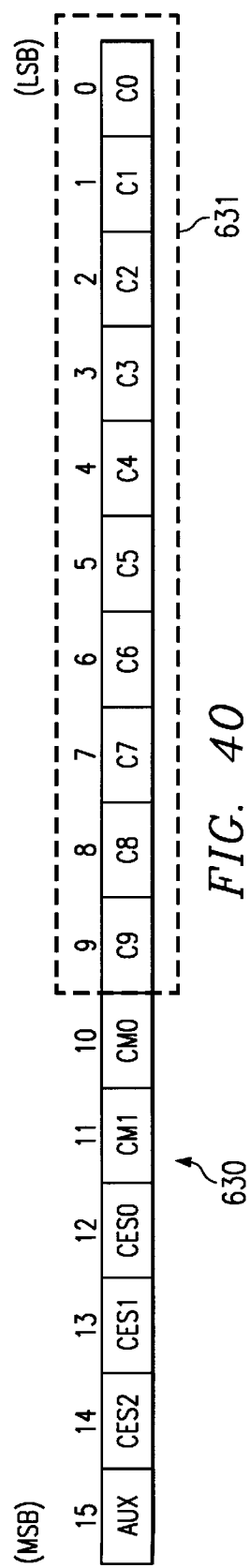

6,065,106

RESUMING NORMAL EXECUTION BY RESTORING WITHOUT REFETCHING INSTRUCTIONS IN MULTI-WORD INSTRUCTION REGISTER INTERRUPTED BY DEBUG INSTRUCTIONS LOADING AND PROCESSING

This application claims priority from the Provisional Application Ser. No. 60/034,261 filed Dec. 20, 1996.

NOTICE (C) Copyright 1997 Texas Instruments Incorporated. A portion of the disclosure of this patent document contains material which is subject to copyright protection. The copyright owner has no objection to the facsimile reproduction by anyone of the patent disclosure, as it appears in the Patent and Trademark Office patent file or records, but otherwise reserves all copyright rights whatsoever.

CROSS-REFERENCE TO RELATED APPLICATIONS

This application is related to coassigned applications:

Ser. No. 08/783,382 (TI-22105), now abandoned, entitled Special Purpose Multiplier for Extended Precision Results;

Ser. No. 09/008,909 (TI-22106), issued U.S. Pat. No. 5,958,044, entitled Multicycle NOP;

Ser. No. 08/788,751 (TI-22108), issued U.S. Pat. No. 5,841,379, entitled Method and Apparatus for Selectively Counting Consecutive Bits;

Ser. No. 09/012,676 (TI-22109), entitled Microprocessor With a Nestable Delayed Branch Instruction;

Ser. No. 09/012,380 (TI-23604), entitled Microprocessor With an Instruction for Multiply and Left Shift With Saturate;

Ser. No. 09/012,381 (TI-24333), entitled High Performance Adder for Multiple Parallel and Operations;

Ser. No. 09/012,324 (TI-24334), entitled Execution Unit Chaining in a VLIW DSP;

Ser. No. 09/012,693 (TI-24335), entitled High Speed Saturate Adder;

Ser. No. 09/012,325 (TI-24942), entitled Microprocessor With an Instruction for a Left Shift With Saturate;

Ser. No. 08/974,742 (TI-24946), entitled Method for Managing an Instruction Execution Pipeline During Debugging of a Data Processing System;

Ser. No. 08/974,630 (TI-24948), entitled Processor Test Port With Scan Chains and Data Streaming;

Ser. No. 09/012,332 (TI-24956), entitled Method and Apparatus for DMA Boot Loading a Microprocessor Without an Internal ROM;

Ser. No. 08/974,589 (TI-25049), issued U.S. Pat. No. 5,970,241, entitled Maintaining Synchronism Between a Processor Pipeline and Subsystem Pipelines During Debugging of a Data Processing System;

Ser. No. 08/974,014 (TI-26112), entitled Single Stepping a Processor Pipeline and Subsystem Pipelines During Debugging of a Data Processing System;

Ser. No. 08/974,744 (TI-25113), entitled Non-Intrusive Software Breakpoints in a Processor Instruction Execution Pipeline;

Ser. No. 09/012,327 (TI-25248), entitled Microprocessor With an Instruction for Setting or Clearing a Bit Field;

Ser. No. 09/012,329 (TI-25309), entitled Data Processing With Control Arrangement for Specifying Parafllel and Sequential Execution of Program Instructions;

Ser. No. 09/012,326 (TI-25310), entitled Processor With Conditional Execution of Every Instruction; and Ser. No. 09/012,813 (TI-25311), entitled Improved Microprocessor, all filed contemporaneously herewith and incorporated herein by reference.

TECHNICAL FIELD OF THE INVENTION

This invention relates to microprocessors, and particularly relates to architectures of very long instruction word processors.

BACKGROUND OF THE INVENTION

As the technology for manufacturing integrated circuits advances, more and more logic functions may be included in a single integrated circuit device. Modern integrated circuit (IC) devices include large numbers of gates on a single semiconductor chip, with these gates interconnected so as to perform multiple and complex functions, such as, for example, those in a general-purpose microprocessor. The manufacture of such circuits incorporating such Very Large Scale Integration (VLSI) requires that the fabrication of the circuit be error free, as some manufacturing defects may prevent it from performing all of the functions that it is designed to perform. This requires verification of the design of the circuit and also various types of electrical testing after manufacture.

However, as the complexity of the circuit increases, so does the cost and difficulty of verifying and electrically testing each of the devices in the circuit. From an electrical test standpoint, in order to totally verify that each gate in a VLSI circuit functions properly, one must ideally be able to exercise each of the gates not only individually (in the digital sense, determining that it is neither stuck-open nor stuck-closed), but also in conjunction with the other gates in the circuit in all possible combinations of operations. This is normally accomplished by automated testing equipment (ATE) that employs test vectors to perform the desired tests. A test vector describes the desired test input (or signals), associated clock pulse (or pulses), and expected test output (or signals) for every package pin during a period of time, often in an attempt to "test" a particular gate (or macro). For complex circuitry, this may involve a large number of test vectors and accordingly a long test time. Macro and cell are used herein to mean the same thing and may be used interchangeably.

Circuit designers have used stuck-fault modeling techniques in improving the efficiency of the testing of such VLSI circuits. Stuck-fault modeling is directed not to stuck-open or stuck-closed defects in individual gates, but to the effect of such defective gates (and defective interconnections) resulting in stuck-high and stuck-low nodes of the logic circuit. Minimum patterns of test vectors are then derived for the exercising of the logic circuit. Applying such test vectors to the circuit detects stuck-high and stuck-low nodes if defects are present. Such techniques have been successful in improving the test efficiency of current generation VLSI circuits.

In addition, specific circuit configurations in the VLSI circuit may have some of its gates inaccessible for all but a special combination of signals, thereby hiding a fault unless a very specific pattern of signals is presented. However, the cost of performing such testing on 100% of the manufactured circuits is staggering, considering the high cost of the test equipment required to exercise each circuit in conjunction with the long time required to present each possible combination to each gate. This has in the past forced integrated circuit manufacturers to test less than all of the active devices in a chip, with the attendant quality levels of the product being less than optimal. Thus, one of the major problems in integrated circuit design is the ability to adequately test the final IC design, and this problem increases with increasing complexity of the integrated circuit.

One way to address this problem is through design for test (DFT). The key concepts in DFT are controllability and observability. Controllability is the ability to set and reset the state of every node in the circuit, while observability is the ability to observe either directly or indirectly the state of any node in the circuit. The purpose of DFT is to increase the ability to control and observe internal and external nodes from external inputs/outputs. That is, DFT techniques may be employed for logic verification and DC parametric tests.

Designing testability into any circuit will affect the circuitry to some degree. Additional logic will probably have to be added. This additional logic will increase the amount of silicon required to implement the design. The savings from enhanced testability do not usually show up until the development time and testing costs of the circuit and its end system are analyzed.

In conjunction with the stuck-fault modeling and associated test generation, other circuitry may be included in the VLSI circuit specifically designed to improving its testability. One type of test circuitry is a scan path in the logic circuit. A scan path consists of a chain of synchronously clocked master/slave latches (or registers), each of which is connected to a particular node in the logic circuit. These latches can be loaded with a serial data stream ("scan in") presetting the logic circuit nodes to a predetermined state. The logic circuit then can be exercised in normal fashion, with the result of the operation (at each of the nodes having a scan latch) stored in its respective latch. By serially unloading the contents of the latches ("scan out"), the result of the particular test operation at the associated nodes is read out and may be analyzed for improper node operation. Repetition of this operation with a number of different data patterns effectively tests all necessary combinations of the logic circuit, but with a reduced test time and cost compared to separately testing each active component or cell and all their possible interactions. Scan paths permit circuit initialization by directly writing to the latches (or registers) and directly observing the contents of the latches (or registers). Using scan paths helps to reduce the quantity of test vectors compared to traditional "functional mode" approaches. Techniques for scanning such data are discussed by E. J. McCluskey in *A Survey of Design for Testability Scan Techniques*, VLSI Design (Vol. 5, No. 12, pp. 38–61, December 1984).

Also as VLSI technology is advancing, users of integrated circuits are desiring specially designed and constructed integrated circuits, for performing functions customized for the user's application. Such integrated circuits have been called Application-Specific Integrated Circuits (ASICs). For an ASIC device to be cost-competitive with general purpose microcomputers which may have special functions implemented in programmable firmware, and cost-competitive with a board design made up of smaller scale integrated circuits, the design time of the ASIC circuit must be short and the ASIC circuit must be manufacturable and testable at low cost. Accordingly, it is useful for such circuits to be modular in design, with each of the modules performing a certain function, so that a new ASIC circuit may be constructed by combining previously-designed circuit modules. Such an approach can also be used for non-ASIC microcomputers and microprocessors. Regardless of the end product, the use of a modular approach allows the designer to use logic which has previously been verified, and proven manufacturable. However, if logic modules containing existing scan paths are placed into a new circuit application, new test patterns will generally be required for the new device, thereby lengthening the design/manufacture cycle time.

A modular approach to utilizing scan paths and other testability circuits has been used to provide thorough coverage of all possible faults in an efficient manner. However, this approach utilizes system buses to set up and operate the scan test, so that even though each module is tested independently, the test pattern designed for a given module depends upon the operation of other modules in the logic circuit for purposes of bus control and module selection. This results in the testability of a particular module depending upon the fault-free operation of other modules. In addition, the automatic test program generator (ATPG) program which sets the conditions for test of a given module depends upon the position of the module relative to other modules, and upon the operating features of such other modules. While reduced test times and costs are thus achieved by such modularity, the use of system buses to load and unload the scan paths in the individual modules may not only affect the operation of the particular module, but is likely to also preclude "porting" of the test program for a given module from one logic circuit to another.

Recently, MegaModules have been used in the design of ASICs. (MegaModule is a trademark of Texas Instruments Incorporated.) Types of MegaModules include SRAMs, FIFOs, register files, RAMs, ROMs, universal asynchronous receiver-transmitters (UARTs), programmable logic arrays and other such logic circuits. MegaModules are usually defined as integrated circuit modules of at least 500 gates in complexity and having a complex ASIC macro function. These MegaModules may be predesigned and stored in an ASIC design library. The MegaModules can then be selected by the designer and placed within a certain area on the desired IC chip. This allows ASIC designers to integrate MegaModules into their logic as easily as simple macros.

Another solution to this testing problem of an ASIC is the use of a so-called Parallel Module Test (PMT), which is often referred to as a "direct connect" scheme. (Parallel Module Test is a trademark of Texas Instruments Incorporated.) PMT is a direct connect scheme, because it connects external pins to a MegaModule bypassing all other logic, buffers, etc. It is primarily intended as a logic verification testability scheme and has recently been enhanced to address limited VIH/VIL and ICCQ testability schemes. However, even PMT may have problems since the logic states of the ASIC's circuitry may be disturbed as part of the test process during test selection and enabling.

Another solution is the test access port and boundary-scan architecture defined by the IEEE 1149.1 standard, a so-called JTAG test port. IEEE 1149.1 is primarily intended as a system test solution. The IEEE 1149.1 standard requires a minimum of four package pins to be dedicated to the test function. The IEEE 1149.1 standard requires boundary scan cells for each I/O buffer, which adds data delay to all normal operation function pins as well as silicon overhead. Although it has "hooks" for controlling some internal testability schemes, it is not optimized for chip-level testing. IEEE 1149.1 does not explicitly support testing of internal DC parametrics.

Software breakpoints (SWBP) provide another mechanism to allow the debug of microprocessor code and to evaluate performance. A SWBP is typically accomplished through opcode replacement, provided the program resides in a writable memory module which allows the opcode at the stop point to be replaced in memory with the software breakpoint opcode. In most machines, when a SWBP opcode reaches the first execute stage of an instruction execution pipeline, it causes the pipeline to stop advancing or trap to an interrupt service routine, and set a debug status bit indicating the pipeline has stopped or trapped. In processors classified as protected pipelines, instructions fetched into the pipeline after the SWBP are not executed. Instructions that are already in the pipeline are allowed to complete. To restart execution the pipeline can be cleared and then restarted by simply prefetching the opcode at the SWBP memory address after the opcode is replaced in memory with the original opcode.

Microprocessor designers have increasingly endeavored to exploit parallelism to improve performance. One parallel architecture that has found application in some modern microprocessors is the very long instruction word, or VLIW, architecture. VLIW architecture microprocessors are called that because they handle VLIW format instructions.

A VLIW format instruction is a long fixed-width instruction that encodes multiple concurrent operations. VLIW systems use multiple independent functional units. Instead of issuing multiple independent instructions to the units, a VLIW system combines the multiple operations into one very long instruction. In a VLIW system, computer instructions for multiple integer operations, floating point operations, and memory references may be combined in a single, wide, VLIW instruction.

Testing and debugging such a complex pipeline is difficult, even when the techniques described in the preceding paragraphs are used. These and other disadvantages of the prior art are overcome by the present invention, however, and improved methods and apparatus for chip-level testing, as well as system-level debugging, are provided.

SUMMARY OF THE INVENTION

In accordance with the present invention, during the debug process of a data processing system it is advantageous to utilize the processor's own facilities to provide access to memory, registers, status, and any other debug information. In some cases, information is only accessible through execution of program instructions. In a very long word instruction (VLIW) microprocessor, the instruction register can hold multiple concurrent instructions. A debug system can configure the instruction register to operate as a small instruction memory and thereby provide a significant performance advantage over prior art techniques.

A method for debugging a data processing system such a processor includes the following steps:

executing system code in the processor instruction execution pipeline in a normal operational manner;

halting the normal operation of the processor;

executing a sequence of debug code instructions in the processor multi-word instruction register to perform a debug operation on the processor; and continuing execution of the system code in the processor multi-word instruction register in a manner that no extraneous operations occur within the data processing system.

BRIEF DESCRIPTION OF THE DRAWINGS

Other features and advantages of the present invention will become apparent by reference to the following detailed description when considered in conjunction with the accompanying drawings, in which:

FIG. 3 shows the addressing mode register (AMR) of the DSP of FIG. 1;

FIG. 4 shows the control status register (CSR) which contains control and status bits of the DSP of FIG. 1;

FIGS. 8A, 8B, 8C, 8D, 8E, 8F, 8G, 8H, 8I, and 8J show an opcode map for the DSP of FIG. 1;

FIG. 9 shows the basic format of a fetch packet of the DSP of FIG. 1;

FIG. 10A depicts a fetch packet of FIG. 9 with fully serial p-bits;

FIG. 10B depicts a fetch packet of FIG. 9 with fully parallel p-bits;

FIG. 10C depicts a fetch packet of FIG. 9 with partially serial p-bits;

FIG. 11 shows the phases of the pipeline of the DSP of FIG. 1;

FIG. 12 shows the branch instruction phases;

FIG. 13 shows the operation of the pipeline of the DSP of FIG. 1 based on clock cycles and fetch packets;

FIG. 14 depicts fetch packet n, which contains three execute packets, shown followed by six fetch packets (n+1 through n+6), each with one execution packet (containing 8 parallel instructions);

FIG. 17A shows the interrupt flag register (IFR) which contains the status of INT4–INT15 and NMI;

FIG. 17B show the interrupt enable register (IER) of the DSP of FIG. 1;

FIG. 17C shows the interrupt set register (ISR), which allows to setting or clearing interrupts manually in the IFR;

FIG. 17D shows the interrupt clear register (ICR), which allows to setting or clearing interrupts manually in the IFR;

FIG. 18 is a timing diagram of detection of Analysis interrupts for the processor of FIG. 1;

FIGS. 19A and 19B illustrate two analysis interrupt related instructions, SWI and B ARP;

FIG. 27B is a timing diagram illustrating a Test Port Requested Test Halt;

FIG. 30A illustrates an analysis control register for the processor of FIG. 1;

FIG. 30B illustrates an analysis data register for the processor of FIG.

FIG. 31 is a timing diagram of the instruction execution pipeline for the processor of FIG. 1 showing various pipeline phases;

FIG. 34A illustrates JTAG instruction register contents when Strap status is selected in the registers of FIG. 33;

FIG. 34B illustrates JTAG instruction register contents when Stop Emulation status is selected in the registers of FIG. 33;

FIG. 34C illustrates JTAG instruction register contents when Real Time Emulation status is selected in the registers of FIG. 33;

FIG. 34D illustrates JTAG instruction register contents when Emulation Error status is selected in the registers of FIG. 33;

FIG. 38 is a schematic of a clock source switch for the CSM of FIG. 37;

FIG. 39 is a schematic of circuitry to generate an EVTA interrupt for the processor of FIG. 1;

FIG. 40 illustrates the counter register of FIG. 33;

DETAILED DESCRIPTION OF EMBODIMENTS OF THE INVENTION

Figure 1:
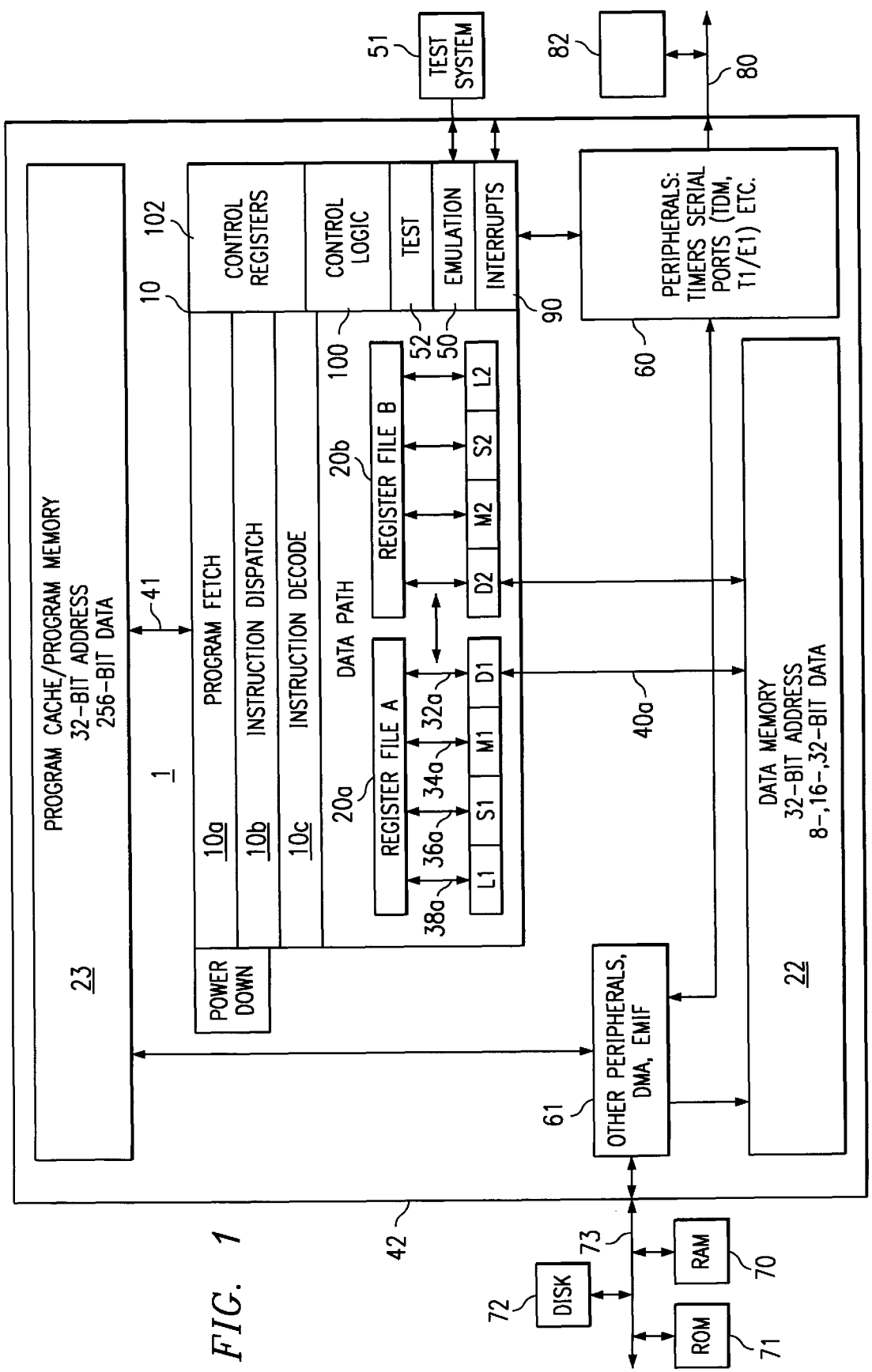
FIG. 1 is a block diagram of a digital signal processor (DSP), showing components thereof pertinent to an embodiment of the present invention.

FIG. 1 is a block diagram of a microprocessor 1 which has an embodiment of the present invention. Microprocessor 1 is a VLIW digital signal processor ("DSP"). In the interest of clarity, FIG. 1 only shows those portions of microprocessor 1 that are relevant to an understanding of an embodiment of the present invention. Details of general construction for DSPs are well known, and may be found readily elsewhere. For example, U.S. Pat. No. 5,072,418 issued to Frederick Boutaud, et al, describes a DSP in detail and is incorporated herein by reference. U.S. Pat. No. 5,329,471 issued to Gary Swoboda, et al, describes in detail how to test and emulate a DSP and is incorporated herein by reference. Details of portions of microprocessor 1 relevant to an embodiment of the present invention are explained in sufficient detail hereinbelow, so as to enable one of ordinary skill in the microprocessor art to make and use the invention.

In microprocessor 1 there are shown a central processing unit (CPU) 10, data memory 22, program memory 23, peripherals 60 and an external memory interface (EMIF) with a direct memory access (DMA) 61. CPU 10 further has an instruction fetch/decode unit 10a–c, a plurality of execution units, including an arithmetic and load/store unit D1, a multiplier M1, an ALU/shifter unit S1, an arithmetic logic unit ("ALU") L1, a shared multiport register file 20a from which data are read and to which data are written. Decoded instructions are provided from the instruction fetch/decode unit 10a–c to the functional units D1, M1, S1, and L1 over various sets of control lines which are not shown. Data are provided to/from the register file 20a from/to to load/store units D1 over a first set of busses 32a, to multiplier M1 over a second set of busses 34a, to ALU/shifter unit S1 over a third set of busses 36a and to ALU L1 over a fourth set of busses 38a. Data are provided to/from the memory 22 from/to the load/store units D1 via a fifth set of busses 40a. Note that the entire data path described above is duplicated with register file 20b and execution units D2, M2, S2, and L2. Instructions are fetched by fetch unit 10a from instruction memory 23 over a set of busses 41. Emulation circuitry 50 provides access to the internal operation of integrated circuit 1 which can be controlled by an external test/development system (XDS) 51.

External test system 51 is representative of a variety of known test systems for debugging and emulating integrated circuits. One such system is described in U.S. Pat. No. 5,535,331 which is incorporated herein by reference. Test circuitry 52 contains control registers and parallel signature analysis circuitry for testing integrated circuit 1.

Note that the memory 22 and memory 23 are shown in FIG. 1 to be a part of a microprocessor 1 integrated circuit, the extent of which is represented by the box 42. The memories 22–23 could just as well be external to the microprocessor 1 integrated circuit 42, or part of it could reside on the integrated circuit 42 and part of it be external to the integrated circuit 42. These are matters of design choice. Also, the particular selection and number of execution units are a matter of design choice, and are not critical to the invention.

When microprocessor 1 is incorporated in a data processing system, additional memory or peripherals may be connected to microprocessor 1, as illustrated in FIG. 1. For example, Random Access Memory (RAM) 70, a Read Only Memory (ROM) 71 and a Disk 72 are shown connected via an external bus 73. Bus 73 is connected to the External Memory Interface (EMIF) which is part of functional block 61 within microprocessor 42. A Direct Memory Access (DMA) controller is also included within block 61. The DMA controller is generally used to move data between memory and peripherals within microprocessor 1 and memory and peripherals which are external to microprocessor 1.

Figure 2:
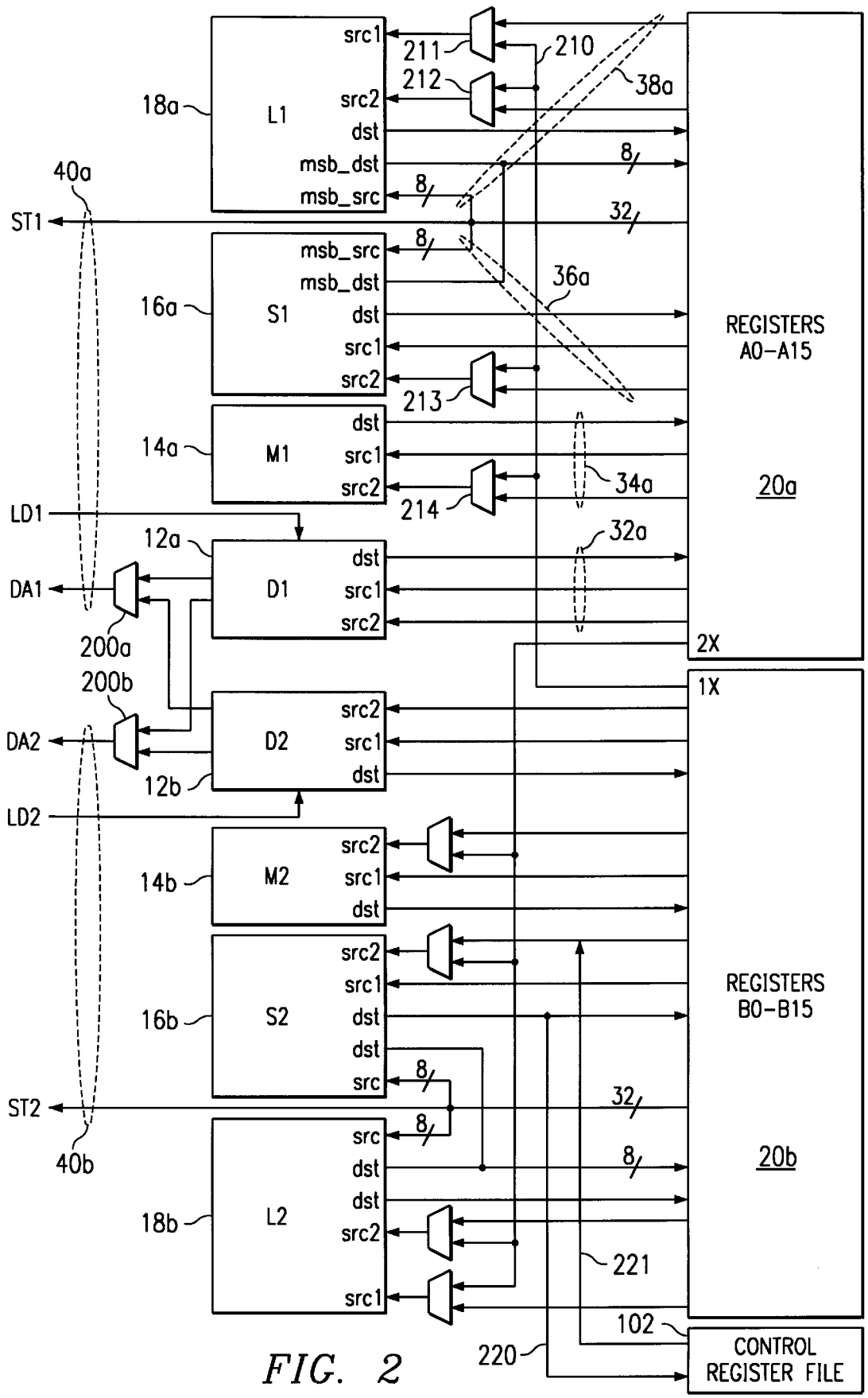
FIG. 2 is a block diagram of the functional units, data paths and register files of FIG. 1.

FIG. 2 is a block diagram of the execution units and register files of the microprocessor of FIG. 1 and shows a more detailed view of the buses connecting the various functional blocks. In this figure, all data busses are 32 bits wide, unless otherwise noted. Bus 40*a* has an address bus DA1 which is driven by mux 200*a*. This allows an address generated by either load/store unit D1 or D2 to provide an address for loads or stores for register file 20*a*. Data Bus LD1 loads data from an address in memory 22 specified by address bus DA1 to a register in load unit D1. Unit D1 may manipulate the data provided prior to storing it in register file 20*a*. Likewise, data bus ST1 stores data from register file 20*a* to memory 22. Load/store unit D1 performs the following operations: 32-bit add, subtract, linear and circular address calculations. Load/store unit D2 operates similarly to unit D1, with the assistance of mux 200*b* for selecting an address.

ALU unit L1 performs the following types of operations: 32/40 bit arithmetic and compare operations; left most 1, 0, bit counting for 32 bits; normalization count for 32 and 40 bits; and logical operations. ALU L1 has input src1 for a 32 bit source operand and input src2 for a second 32 bit source operand. Input msb_src is an 8 bit value used to form 40 bit source operands. ALU L1 has an output dst for a 32 bit destination operands. Output msb_dst is an 8 bit value used to form 40 bit destination operands. Two 32 bit registers in register file 20*a* are concatenated to hold a 40 bit operand. Mux 211 is connected to input src1 and allows a 32 bit operand to be obtained from register file 20*a* via bus 38*a* or from register file 20*b* via bus 210. Mux 212 is connected to input src2 and allows a 32 bit operand to be obtained from register file 20*a* via bus 38*a* or from register file 20*b* via bus 210. ALU unit L2 operates similarly to unit L1.

ALU/shifter unit S1 performs the following types of operations: 32 bit arithmetic operations; 32/40 bit shifts and 32 bit bit-field operations; 32 bit logical operations; branching; and constant generation. ALU S1 has input src1 for a 32 bit source operand and input src2 for a second 32 bit source operand. Input msb_src is an 8 bit value used to form 40 bit source operands. ALU S1 has an output dst for a 32 bit destination operands. Output msb_dst is an 8 bit value used to form 40 bit destination operands. Mux 213 is connected to input src2 and allows a 32 bit operand to be obtained from register file 20*a* via bus 36*a* or from register file 20*b* via bus 210. ALU unit S2 operates similarly to unit S1, but can additionally perform register transfers to/from the control register file 102.

Multiplier M1 performs 16×16 multiplies. Multiplier M1 has input src1 for a 32 bit source operand and input src2 for a 32 bit source operand. ALU S1 has an output dst for a 32 bit destination operands. Mux 214 is connected to input src2 and allows a 32 bit operand to be obtained from register file 20*a* via bus 34a or from register file 20*b* via bus 210. Multiplier M2 operates similarly to multiplier M1.

As depicted in FIG. 2, one unit (.S2) can read from and write to the control register file 102 using buses 220 and 221. Table 2 lists the control registers contained in the control register file, and briefly describes each. The control registers are described more fully later herein. Each control register is accessed by the MVC instruction; see the MVC instruction description later herein.

TABLE 2

Control Registers

| Abbreviation | Name | Description |
|---|---|---|
| AMR | Addressing mode register | Specifies whether to use linear or circular addressing for one of eight registers; also contains sizes for circular addressing |
| CSR | Control status register | Contains the global interrupt enable bit, cache control bits, and other miscellaneous control and status bits |
| IFR | Interrupt flag register | Displays status of interrupts |
| ISR | Interrupt set register | Allows you to set pending interrupts manually |
| ICR | Interrupt clear register | Allows you to clear pending interrupts manually |
| IER | Interrupt enable register | Allows enabling/disabling of individual interrupts |
| ISTP | Interrupt service table pointer | Points to the beginning of the interrupt service table |
| IRP | Interrupt return pointer | Contains the address to be used to return from a maskable interrupt |
| NRP | Nonmaskable interrupt return pointer | Contains the address to be used to return from a nonmaskable interrupt |
| IN | General-purpose input register | Contains 32 input signal |
| OUT | General-purpose output register | Contains 32 output signal |
| PCE1 | Program counter | Contains the address of the fetch packet that contains the execute packet in the E1 pipeline stage |
| PDATA_O | Program data out | Contains 32 output signals; used by the STP instruction to write to program space |

FIG. 3 shows the addressing mode register, (AMR). Eight registers (A4–A7, B4–B7) can perform circular addressing. For each of these registers, the AMR specifies the addressing mode. A 2-bit field for each register is used to select the address modification mode: linear (the default) or circular mode. With circular addressing, the field also specifies which BK (block size) field to use for a circular buffer. In addition, the buffer must be aligned on a byte boundary equal to the block size. The mode select field encoding is shown in Table 3.

TABLE 3

Addressing Mode Field Encoding

| Mode | Description |
|---|---|
| 00 | Linear modification (default at reset) |
| 01 | Circular addressing using the BK0 field |
| 10 | Circular addressing using the BK1 field |
| 11 | Reserved |

The block size fields, BK0 and BK1, specify block sizes for circular addressing. The five bits in BK0 and BK1 specify the width. The formula for calculating the block size width is:

Block size (in bytes)=$2^{(N+1)}$ where N is the value in BK1 or BK0

Table 4 clock size calculations for all 32 possibilities.

TABLE 4

Block Size Calculations

| N | Block Size | N | Block Size |
|---|---|---|---|
| 00000 | 2 | 10000 | 131,072 |
| 00001 | 4 | 10001 | 262,144 |
| 00010 | 8 | 10010 | 524,288 |
| 00011 | 16 | 10011 | 1,048,576 |
| 00100 | 32 | 10100 | 2,097,152 |
| 00101 | 64 | 10101 | 4,194,304 |
| 00110 | 128 | 10110 | 8,388,608 |
| 00111 | 256 | 10111 | 16,777,216 |
| 01000 | 512 | 11000 | 33,554,432 |
| 01001 | 1?024 | 11001 | 67,108,864 |
| 01010 | 2?048 | 11010 | 134,217,728 |
| 01011 | 4?096 | 11011 | 268,435,456 |
| 01100 | 8?192 | 11100 | 536,870,912 |
| 01101 | 16?384 | 11101 | 1,073,741,824 |
| 01110 | 32?768 | 11110 | 2,147,483,648 |
| 01111 | 65?536 | 11111 | 4,294,967,296 |

The control status register (CSR), shown in FIG. 4, contains control and status bits. The function of the bit fields in the CSR are shown in Table 5.

TABLE 5

Control Status Register: Bit Fields, Read/Write Status and Function

| Bit Position | Width | BitField Name | Function |
|---|---|---|---|
| 31–24 | 8 | CPU ID | CPU ID. Defines which CPU. |
| 23–16 | 8 | Rev ID | Revision ID. Defines silicon revision of the CPU. |
| 15–10 | 6 | PWRD | Control power down modes. The values will always be read as zero. |
| 9 | 1 | SAT | The saturate bit, set when any unit performs a saturate, can be cleared only by the MVC instruction and can be set only by a functional unit. The set by a functional unit has priority over a clear (by the MVC instruction) if they occur on the same cycle. The saturate bit gets set one full cycle (1 delay slot) after a saturate occurs. |
| 8 | 1 | EN | Endian bit: 1 = little endian, 0 = big endian. |
| 7–5 | 3 | PCC | Program cache control mode |
| 4–2 | 3 | DCC | Data cache control mode |
| 1 | 1 | PGIE | Previous GIE (global interrupt enable). Saves GIE when an interrupt is taken. |
| 0 | 1 | GIE | Global interrupt enable. Enables (1) or disables (0) all interrupts except the reset interrupt and NMI (nonmaskable interrupt). |

Figure 5:
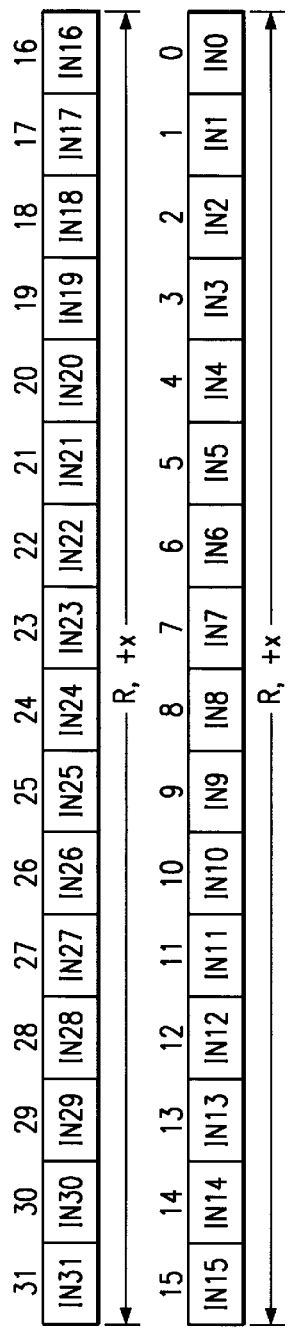
FIG. 5 depicts a general-purpose input register (IN) which supports 32 general-purpose input signals of the DSP of FIG. 1.
Figure 6:
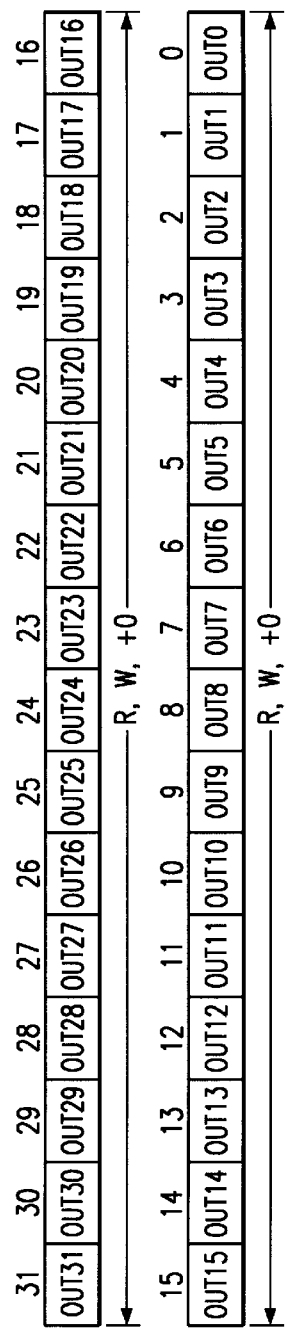
FIG. 6 depicts a general-purpose output register (OUT) which supports 32 general-purpose output signals of the DSP of FIG. 1.

A general-pu rpose input register (IN) depicted in FIG. 5 supports 32 general-purpose input signals, while a general-purpose output register (OUT) depicted in FIG. 6 supports 32 general-purpose output signals. The function of these signals is described later herein.

Table 6 below explains various symbols used herein.

TABLE 6

Instruction Operation and Execution Notations

| Symbol | Meaning |
|---|---|
| int | 32-bit register value |
| long | 40-bit register value |
| creg | 3-bit field specifying a conditional register |
| cstn | n-bit constant |
| LSBn | n least significant bits |
| MSBn | n most significant bits |
| ® | Assignment |

TABLE 6-continued

Instruction Operation and Execution Notations

| Symbol | Meaning |
|---|---|
| + | Addition |
| − | Subtraction |
| × | Multiplication |
| +a | Perform twos-complement addition using the addressing mode defined by the AMR |
| −a | Perform twos-complement subtraction using the addressing mode defined by the AMR |
| and | Bitwise AND |
| or | Bitwise OR |
| xor | Bitwise exclusive OR |
| not | Bitwise logical complement |
| $b_{y\ldots z}$ | Selection of bits y through z of bit string b |
| << | Shift left |
| >>s | Shift right with sign extension |
| >>z | Shift right with a zero fill |
| x clear b,e | Clear a field in x, specified by b (beginning bit) and e (ending bit) |
| x exts l,r | Extract and sign-extend a field in x, specified by 1 (shift left value) and r (shift right value) |
| x extu l,r | Extract an unsigned field in x, specified by 1 (shift left value) and r (shift right value) |
| +s | Perform twos-complement addition and saturate the result to the result size, if an overflow or underflow occurs |
| −s | Perform twos-complement subtraction and saturate the result to the result size, if an overflow or underflow occurs |
| x set b,e | Set field in x, to all 1s specified by b (beginning bit) and e (ending bit) |
| abs(x) | Absolute value of x |
| lmb0(x) | Leftmost 0 bit search of x |
| lmb1(x) | Leftmost 1 bit search of x |
| norm(x) | Leftmost nonredundant sign bit of x |
| R | Any general purpose register |
| cond | Check for either creg equal to zero or creg not equal to zero |
| nop | No operation |

Table 7 and Table 8 define the mapping between instructions and functional units.

TABLE 7

Instruction to Functional Unit Mapping

| .L Unit | .M Unit | .S Unit | .D Unit |
|---|---|---|---|
| ABS | MPY | ADD | ADD |
| ADD | SMPY | ADDK | ADDA |
| AND | | ADD2 | LD mem |
| CMPEQ | | AND | LD mem (15-bit offset) (D2 only) |
| CMPGT | | B disp | MV |
| CMPGTU | | B IRP | NEG |
| CMPLT | | B NRP | ST mem |
| CMPLTU | | B reg | ST mem (15-bit offset) (D2 only) |
| LMBD | | CLR | SUB |
| MV | | EXT | SUBA |
| NEG | | EXTU | ZERO |
| NORM | | MVC | |
| NOT | | MV | |
| OR | | MVK | |
| SADD | | MVKH | |
| SAT | | NEG | |
| SSUB | | NOT | |
| SUB | | OR | |
| SUBC | | SET | |
| XOR | | SHL | |
| ZERO | | SHR | |
| | | SHRU | |
| | | SSHL | |
| | | STP (S2 only) | |
| | | SUB | |
| | | SUB2 | |
| | | XOR | |
| | | ZERO | |

TABLE 8

Functional Unit to Instruction Mapping

| | Functional Units | | | |
|---|---|---|---|---|
| Instruction | .L Unit | .M Unit | .S Unit | .D Unit |
| ABS | n | | | |
| ADD | n | | n | n |
| ADDA | | | | n |
| ADDK | | | n | |
| ADD2 | | | n | |
| AND | n | | n | |
| B | | | n | |
| B IRP | | | n (S2 only) | |
| B NRP | | | n (S2 only) | |
| B reg | | | n (S2 only) | |
| CLR | | | n | |
| CMPEQ | n | | | |
| CMPGT | n | | | |
| CMPGTU | n | | | |
| CMPLT | n | | | |
| CMPLTU | n | | | |
| EXT | | | n | |
| EXTU | | | n | |
| IDLE | | | | |
| LD mem | | | | n |
| LD mem (15-bit offset) | | | | n (D2 only) |
| LMBD | n | | | |
| MPY | | n | | |
| MVC | | | n | |
| MV | n | | n | n |
| MVK | | | n | |
| MVKH | | | n | |
| NEG | n | | n | n |
| NOP | | | | |
| NORM | n | | | |
| NOT | n | | n | |
| OR | n | | n | |
| SADD | n | | | |
| SAT | n | | | |
| SET | | | n | |
| SHL | | | n | |
| SHR | | | n | |
| SHRU | | | n | |
| SMPY | | n | | |
| SSHL | | | n | |
| SSUB | n | | | |
| ST mem | | | | n |
| ST mem (15-bit offset) | | | | n (D2 only) |
| STP | | | n | |
| SUB | n | | n | n |
| SUBA | | | | n |
| SUBC | n | | | |
| SUB2 | | | n | |
| SWI | | | | |
| XOR | n | | n | |
| ZERO | n | | n | n |

The general-purpose register file supports 32- and 40-bit data. 32-bit data is contained in single registers. 40-bit data is contained across two registers; the 32 LSBs of the data are stored in an even register and the 8 MSBs are stored in the 8 LSBs of the next register (which is always an odd register). There are 16 valid register pairs for 40-bit data as shown in Table 9. In assembly language syntax, the register pairs are denoted by a colon in between the register names. The odd register is specified first.

TABLE 9

Long Register Pairs
Register File

| A | B |
|---|---|
| A1:A0 | B1:B0 |
| A3:A2 | B3:B2 |
| A5:A4 | B5:B4 |
| A7:A6 | B7:B6 |
| A9:A8 | B9:B8 |
| A11:A10 | B11:B10 |
| A13:A12 | B13:B12 |
| A15:A14 | B15:B14 |

Figure 7:
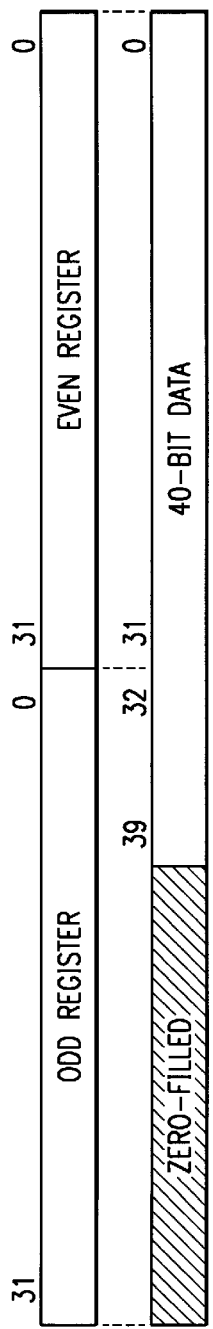
FIG. 7 illustrates the register storage scheme for 40-bit data of the DSP of FIG. 1.

FIG. 7 illustrates the register storage scheme for 40-bit data. Operations requiring a long input ignore the 24 MSBs of the odd register. Operations producing a long result zero-fill the 24 MSBs of the odd register. The even register is encoded in the opcode.

The DSP's opcode map is shown in FIGS. 8A–8J. Refer to Table 6 and the instruction descriptions later herein for explanations of the field syntaxes and values.

All instructions can be conditional. The condition is controlled by a 3-bit (creg) field specifying the register tested, and a 1-bit field (z) specifying a test for zero or nonzero. The four MSBs of every opcode are creg and z. The register is tested at the beginning of the E1 pipeline stage for all instructions. The pipeline is described later herein. If z=1, the test is for equality with zero. If z=0, the test is for nonzero. The case of condition register field (creg)=0 and z=0 is treated as always true to allow instructions to be executed unconditionally. The creg register field is encoded as shown in Table 10.

TABLE 10

Registers That Can Be Tested by Conditional Operations

| creg | | | z | Register Tested |
|---|---|---|---|---|
| 31 | 30 | 29 | 28 | |
| 0 | 0 | 0 | 0 | Unconditional. |
| 0 | 0 | 0 | 1 | Reserved: When selected this indicates a SWBP instruction |
| 0 | 0 | 1 | z | B0 |
| 0 | 1 | 0 | z | B1 |
| 0 | 1 | 1 | z | B2 |
| 1 | 0 | 0 | z | A1 |
| 1 | 0 | 1 | z | A2 |
| 1 | 1 | x | x | Reserved |

Note:
x is don't care for reserved cases.

Conditional instructions are represented by "[ ]" surrounding the condition register. The following execute packet contains two ADD instructions in parallel. The first ADD is conditional on B0 being non-zero. The second ADD is conditional on B0 being zero. '!' indicates the 'not' of the condition.

```
          [B0]    ADD    .L1    A1,A2,A3
||        [!B0]   ADD    .L2    B1,B2,B3
```

The above instructions are mutually exclusive. This means that only one will execute.

If they are scheduled in parallel, mutually exclusive instructions must still follow all resource constraints mentioned later herein.

If mutually exclusive instructions share any resources as described later herein, they cannot be scheduled in parallel (put in the same execute packet), even though only one will end up executing.

The execution of instructions can be defined in terms of delay slots. Table 11 shows the types of instructions, how many delay slots each type instruction has, and the execute phases it uses. Delay slots are the number of extra cycles it takes before a result is available to be read after the source operands are read. For a single-cycle type instruction (such as ADD), if source operands are read in cycle i, the result can be read in cycle i+1. For a multiply instruction (MPY), if source operands are read in cycle i, the result can be read in cycle I+2.

TABLE 11

Delay Slot Summary

| Instruction Type | Delay Slots | Execute Phases Used |
|---|---|---|
| Branch (The cycle when the target enters E1) | 5 | E1–branch target E1 |
| Load (LD) (Incoming Data) | 4 | E1–E5 |
| Load (LD) (Address Modification) | 0 | E1 |
| Multiply | 1 | E1–E2 |
| Single-cycle | 0 | E1 |
| Store (ST) (Address modification) | 0 | E1 |
| NOP (no execution pipeline operation) | — | — |
| STP (no CPU internal results written) | — | — |

Figures 9, 10A, 10B, 10C:
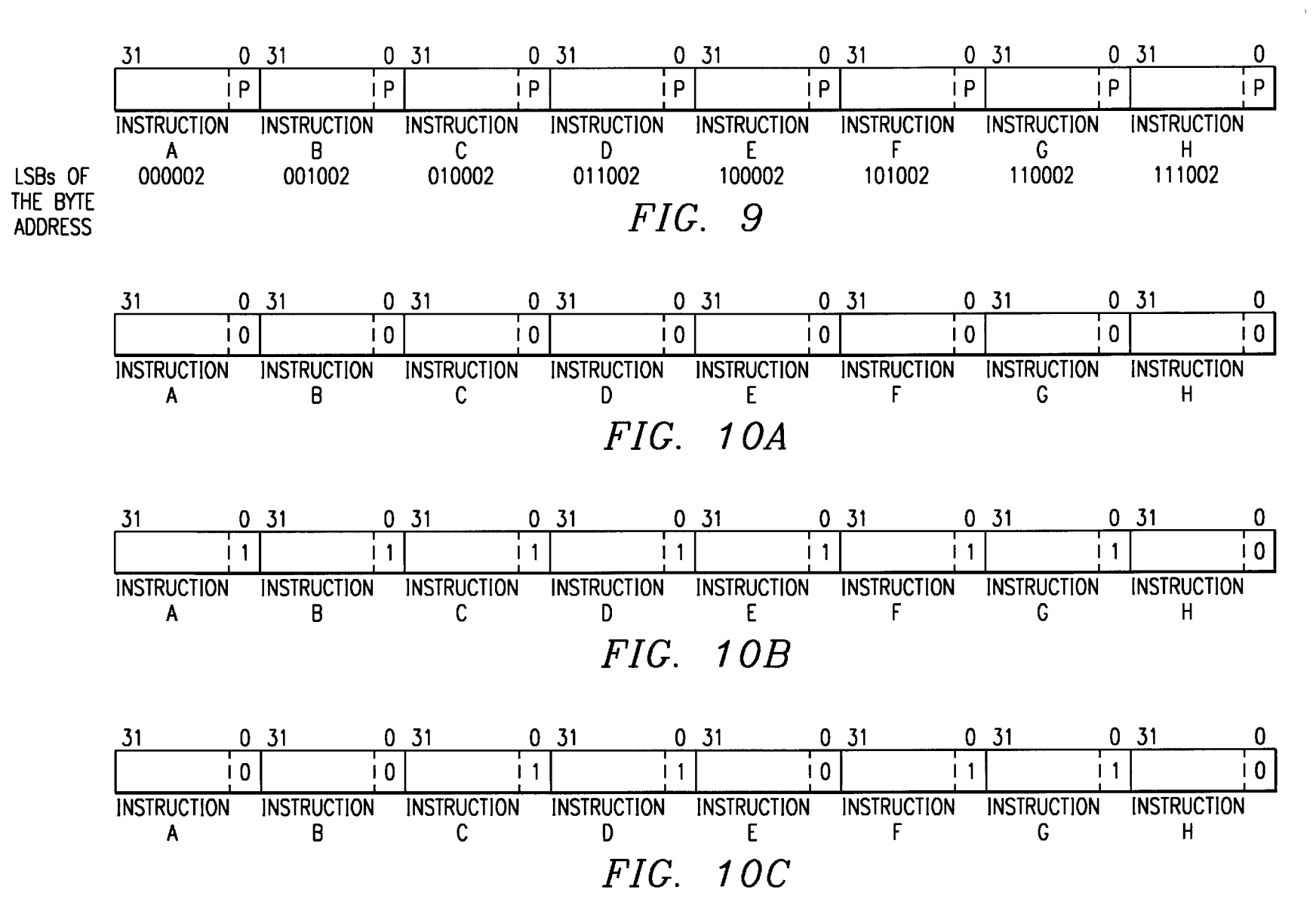

Instructions are always fetched eight at a time. This constitutes a fetch packet. The basic format of a fetch packet is shown in FIG. 9. The execution grouping of the fetch packet is specified by the p-bit, bit zero, of each instruction. Fetch packets are 8-word aligned.

The p bit controls the parallel execution of instructions. The p bits are scanned from left to right (lower to higher address). If the p bit of instruction i is 1, then instruction i +1 is to be executed in parallel with (in the same cycle as) instruction i. If the p-bit of instruction i is 0, then instruction i +1 is executed in the cycle after instruction i. All instructions executing in parallel constitute an execute packet. An execute packet can contain up to eight instructions. All instructions in an execute packet must use a unique functional unit.

An execute packet cannot cross an 8-word boundary. Therefore, the last p bit in a fetch packet is always set to 0, and each fetch packet starts a new execute packet. The following examples illustrate the conversion of a p-bit sequence into a cycle-by-cycle execution stream of instructions. There are three types of p-bit patterns for fetch packets. These three p-bit patterns result in the following execution sequences for the eight instructions: fully serial fully parallel; or partially serial. These three sequences of execution are explained more fully below.

The fully serial p-bit pattern depicted in FIG. 10A results in this execution sequence:

| Cycle | Instructions |
|---|---|
| 1 | A |
| 2 | B |
| 3 | C |
| 4 | D |
| 5 | E |
| 6 | F |
| 7 | G |
| 8 | H |

The eight instructions are executed sequentially.

The fully parallel p-bit pattern depicted in FIG. 10B results in this execution sequence:

| Cycle | Instructions |
|---|---|
| 1 | A B C D E F G H |

All eight instructions are executed in parallel.

The partially serial p-bit pattern depicted in FIG. 10C results in this execution sequence:

| Cycle | Instructions |   |   |
|---|---|---|---|
| 1 | A |   |   |
| 2 | B |   |   |
| 3 | C | D | E |
| 4 | F | G | H |

Note that the instructions C, D, and E do not use any of the same functional units, cross paths, or other data path resources. This is also true for instructions F, G, and H.

The || characters signify that an instruction is to execute in parallel with the previous instruction. In the previous partially serial example, the code would be represented as this:

```
          instruction   A
          instruction   B
          instruction   C
||        instruction   D
||        instruction   E
          instruction   F
||        instruction   G
||        instruction   H
```

If a branch into the middle of an execution packet occurs, all instructions at lower addresses are ignored. In the partially serial example, if a branch to the address containing instruction D occurs, then only D and E will execute. Even though instruction C is in the same execute packet, it is ignored. Instructions A and B are also ignored because they are in earlier execute packets.

No two instructions within the same execute packet can use the same resources. Also, no two instructions can write to the same register during the same cycle. The following describes each of the resources an instruction can use.

Two instructions using the same functional unit cannot be issued in the same execute packet.

The following execute packet is valid:

```
    ADD .S1   A0,A1,A2   ;\.S1 is used for both instructions
||  SHR .S1   A3,15,A4   ;/
```

The following execute packet is valid:

```
    ADD .L1   A0,A1,A2   ;\Two different functional units
||  SHR .S1   A3,15,A4   ;/are used
```

Cross Paths (1X and 2X): one unit (either a .S, .L, or .M) per data path, per execute packet, can read a source operand from its opposite register file via the cross paths (1X and 2X). For example, .S1 can read both operands from the A register file, or one operand from the B register file using the 1X cross path. This is denoted by an X following the unit name.

Two instructions using the same X cross path between register files cannot be issued in the same execute packet since there is only one path from A to B and one path from B to A.

The following execute packet is invalid:

```
    ADD .L1X   A0,B1,A1   ;\1X cross path is used
||  MPY .M1X   A4,B4,A5   ;/for both instructions
```

The following execute packet is valid:

```
    ADD .L1X   A0,B1,A1   ;\Instructions use the 1X and
||  MPY .M2X   A4,B4,B2   ;/2X cross paths
```

The operand will come from a register file opposite of the destination if the x bit in the instruction field is set (as shown in the opcode map).

Loads and stores can use an address pointer from one register file while loading to or storing from the other register file. Two loads and/or stores using an address pointer from the same register file cannot be issued in the same execute packet.

The following execute packet is invalid:

```
    LDW .D1   *A0,A1   ;\Address registers from the same
||  LDW .D1   *A2,B2   ;/register file
```

The following execute packet is valid:

```
    LDW .D1   *A0,A1   ;\Address registers from different
||  LDW .D2   *B0,B2   ;/register files
```

Two loads and/or stores loading to and/or storing from the same register file cannot be issued in the same execute packet.

The following execute packet is invalid:

```
    LDW .D1   *A4,A5   ;\Loading to and storing from the
||  STW .D2   A6,*B4   ;/same register file
```

The following execute packet is valid:

```
    LDW .D1   *A4,A5   ;\Loading to and storing from
||  STW .D2   A6,*B4   ;/different register files
```

Only one long result may be written per cycle on each side of the register file. Because the .S and .L units share a read register port for long source operands and a write register port for long results, only one may be issued per side in an execute packet.

The following execute packet is invalid:

```
    ADD .L1   A5:A4,A1,A3:A2   ;\Two long writes
||  SHL .S1   A8,A9,A7:A6      ;/on A register file
```

The following execute packet is valid:

| ADD .L1 | A5:A4,A1,A3:A2 | ;\One long write for |
|---|---|---|
| ‖ SHL .S2 | B8,B9,B7:B6 | ;/each register file |

Because the .L and .S units share their long read port with the store port, operations that read a long value cannot be issued on the .L and/or .S units in the same execute packet as a store.

The following execute packet is invalid:

| ADD .L1 | A5:A4,A1,A3:A2 | ;\Long read operation and a |
|---|---|---|
| ‖ STW .D1 | A8,*A9 | ;/store |

The following execute packet is valid:

| ADD .L1 | A4,A1,A3:A2 | ;\No long read with |
|---|---|---|
| ‖ STW .D1 | A8,*A9 | ;/with the store |

More than four reads of the same register cannot occur on the same cycle. Conditional registers are not included in this count.

The following code sequence is invalid:

| MPY | .M1 A1,A1,A4 | ;five reads of register A1 |
|---|---|---|
| ‖ ADD | .L1 A1,A1,A5 | |
| ‖ SUB | .D1 A1,A2,A3 | | whereas this code sequence is valid:

| MPY | .M1 A1,A1,A4 | ;only four reads of A1 |
|---|---|---|
| ‖ [A1] ADD | .L1 A0,A1,A5 | |
| ‖ SUB | .D1 A1,A2,A3 | |

Multiple writes to the same register on the same cycle can occur if instructions with different latencies writing to the same register are issued on different cycles. For example, an MPY issued on cycle i followed by an ADD on cycle i+1 cannot write to the same register since both instructions will write a result on cycle i+1. Therefore, the following code sequence is invalid:

| MPY | .M1 A0,A1,A2 |
|---|---|
| ADD | .L1 A4,A5,A2 |

Table 12 shows different multiple write conflicts. For example, the ADD and SUB in execute packet L1 write to the same register. This conflict is easily detectable.

The MPY in packet L2 and the ADD in packet L3 might both write to B2 simultaneously; however, if a branch instruction causes the execute packet after L2 to be something other than L3, this would not be a conflict. Thus, the potential conflict in L2 and L3 might not be detected by the assembler. The instructions in L4 do not constitute a write conflict because they are mutually exclusive. In contrast, because it is not obvious that the instructions in L5 are mutually exclusive, the assembler cannot determine a conflict. If the pipeline does receive commands to perform multiple writes to the same register, the result is undefined.

TABLE 12

Examples of the Detectability of Write Conflicts by the Assembler

| L1: | | ADD | .L2 | B5, | B6, | B7 | ;detectable conflict |
|---|---|---|---|---|---|---|---|
| | ‖ | SUB | .S2 | B8, | B9, | B7 | |
| L2: | | MPY | .M2 | B0, | B1, | B2 | ; \not detectable |
| L3: | | ADD | .L2 | B3, | B4, | B2 | ; / |
| L4: | [!B0] | ADD | .L2 | B5, | B6 | B7 | ;detectable, no conflict |
| | ‖ [B0] | SUB | .S2 | B8, | B9, | B7 | |
| L5: | [!B1] | ADD | .L2 | B5, | B6, | B7 | ;\not detectable |
| | ‖ [B0] | SUB | .S2 | B8, | B9, | B7 | ;/ |

The addressing modes are linear, circular using BK0, and circular using BK1. The mode is specified by the addressing mode register (AMR).

Eight registers can perform circular addressing. A4–A7 are used by the .D1 unit and B4–B7 are used by the .D2 unit. No other units can perform circular addressing modes. For each of these registers, the AMR specifies the addressing mode.

The following instructions all use the AMR to determine what type of address calculations are performed for these registers: LD(B)(H)(W), ST(B)(H)(W), ADDA(B)(H)(W), and SUBA(B)(H)(W). All registers can perform linear mode addressing.

Linear mode addressing operates as follows with LD/ST Instructions: linear mode simply shifts the offsetR/cst operand to the left by 2, 1, or 0 for word, half-word, or byte access respectively and then performs an add or subtract to baseR, (depending on the operation specified).

Linear mode addressing operates as follows with ADDA/ SUBA Instructions: linear mode simply shifts src1/cst operand to the left by 2, 1, or 0 for word, halfword, or byte access respectively and then performs an add or subtract, (depending on the operation specified).

Circular mode addressing uses the BK0 and BK1 fields in the AMR to specify block sizes for circular addressing. Circular mode addressing operates as follows with LD/ST Instructions: after shifting offsetR/cst to the left by 2, 1, or 0 for LDW, LDH, or LDB respectively, an add or subtract is performed with the carry/borrow inhibited between bits N and N+1. Bits N+1 to 31 of baseR remain unchanged. All other carries/borrows propagate as usual. Thus, if an offsetR/ cst is greater than the circular buffer size, $2^{(N+1)}$, is specified, the address will be outside of the circular buffer. The circular buffer size in the AMR is not scaled; for example: a size of 4 is 4 bytes, not 4× size of (type). So, to perform circular addressing on an array of 8 words, a size of 32 should be specified, or N=4. Table 12 shows an LDW performed with register A4 in circular mode, with BK0=4, so the buffer size is 32 bytes, 16 halfwords, or 8 words. The value put in the AMR for this example is 0004 0001h.

TABLE 13

LDW in Circular Mode

| LDW<br>Before LDW | | .D1<br>1 cycle after LDW | | *++A4[9],A1<br>5 cycles after LDW | |
|---|---|---|---|---|---|
| A4 | 00000100h | A4 | 00000104h | A4 | XXXXXXXXh |
| A1 | XXXX XXXXh | A1 | XXXXXXXXh | A1 | 00000100h |
| mem 104h | 1234 5678h | mem 104h | XXXX XXXXh | mem 104h | XXXX XXXXh |

Note:
9h words is 24h bytes. 24h bytes is 4 bytes beyond the 32 (20h) byte boundary 100h-11Fh, thus it is wrapped around to 104h.

Circular mode addressing operates as follows with ADDA/SUBA Instructions: after shifting src1/cst to the left by 2, 1, or 0 for ADDAW, ADDAH, or ADDAB respectively, an add or subtract is performed with the carry/borrow inhibited between bits N and N+1. Bits N+1 to 31, inclusive, of src2 remain unchanged. All other carries/borrows propagate as usual. Thus, if src1 is greater than the circular buffer size, $2^{(N+1)}$, is specified, the address will be outside of the circular buffer. The circular buffer size in the AMR is not scaled, for example: a size of 4 is 4 bytes, not 4× size of (type). So, to perform circular addressing on an array of 8 words, a size of 32 should be specified, or N=4. Table 14 shows an ADDAH performed with register A4 in circular mode, with BK0=4, so the buffer size is 32 bytes, 16 halfwords, or 8 words. The value put in the AMR for this example is 0004 0001h.

TABLE 14

ADDAH in Circular Mode

| ADDAH<br>Before ADDAH | | .D1 | A4,A1,A1<br>1 cycle after ADDAH | |
|---|---|---|---|---|
| A4 | 00000100h | | A4 | 00000106h |
| A1 | 0000 0013h | | A1 | XXXXXXXXh |

Note:
13h halfwords is 26h bytes. 26h bytes is 6 bytes beyond the 32 (20h) byte boundary 100h-11Fh, thus it is wrapped around to 106h.

An instruction syntax is used to describe each instruction. The opcode map breaks down the various bit fields that make up each instruction. There are certain instructions that can be executed on more than one functional unit, as was shown in Table 8. The syntax specifies the functional unit and various resources used by an instruction, typically as follows:

EXAMPLE (.unit) src, dst

This is what the syntax looks like for the ADD instruction:

```
ADD (.unit) src1, src2, dst
OR
```
-continued
```
ADDU (.unit) src1, src2, dst
OR
ADD (.unit) src2, src1, dst
unit = .L1, .L2, .S1, .S2, .D1, .D2
``` src and dst indicate source and destination respectively. The (.unit) dictates which functional unit the instruction is mapped to (.L1, .L2, .S1, .S2, .M1, .M2, .D1, or .D2). This instruction has three opcode map fields: src1, src2, and dst.

Pipeline Operation

The DSP pipeline has several key features which improve performance, decrease cost, and simplify programming. They are: increased pipelining eliminates traditional architectural bottlenecks in program fetch, data access, and multiply operations; control of the pipeline is simplified by eliminating pipeline interlocks; the pipeline can dispatch eight parallel instructions every cycle; parallel instructions proceed simultaneously through the same pipeline phases; sequential instructions proceed with the same relative pipeline phase difference; and load and store addresses appear on the CPU boundary during the same pipeline phase, eliminating read-after-write memory conflicts.

A multi-stage memory pipeline is present for both data accesses and program fetches. This allows use of high-speed synchronous memories both on-chip and off-chip, and allows infinitely nestable zero-overhead looping with branches in parallel with other instructions.

There are no internal interlocks in the execution cycles of the pipeline, so a new execute packet enters execution every CPU cycle. Therefore, the number of CPU cycles for a particular algorithm with particular input data is fixed. If during program execution, there are no memory stalls, the number of CPU cycles equals the number of clock cycles for a program to execute.

Performance can be inhibited only by stalls from the memory subsystems or interrupts. The reasons for memory stalls are determined by the memory architecture. To fully understand how to optimize a program for speed, the sequence of program fetch, data store, and data load requests the program makes, and how they might stall the CPU should be understood.

The pipeline operation, from a functional point of view, is based on CPU cycles. A CPU cycle is the period during which a particular execute packet is in a particular pipeline stage. CPU cycle boundaries always occur at clock cycle boundaries; however, memory stalls can cause CPU cycles to extend over multiple clock cycles. To understand the machine state at CPU cycle boundaries, one must be concerned only with the execution phases (E1–E5) of the pipeline. The phases of the pipeline are shown in FIG. 11 and described in Table 15.

TABLE 15

Pipeline Phase Description

| Pipeline | Pipeline Phase | Symbol | During This Phase | Instruction Types Completed |
|---|---|---|---|---|
| Program Fetch | Program Address Generate | PG | Address of the fetch packet is determined. | |
| | Program Address Send | PS | Address of fetch packet is sent to memory. | |
| | Program Wait | PW | Program memory access is performed. | |
| | Program Data Receive | PR | Fetch packet is expected at CPU boundary. | |
| Program Decode | Dispatch | DP | Next execute packet in fetch packet determined and sent to the appropriate functional units to be decoded. | |
| | Decode | DC | Instructions are decoded at functional units. | |
| Execute | Execute 1 | E1 | For all instruction types, conditions for instructions are evaluated and operands read.<br>Load and store instructions: address generation is computed and address modifications written to register file†<br>Branch instructions: affects branch fetch packet in PG phase†<br>Single-cycle instructions: results are written to a register file† | Single-cycle |
| | Execute 2 | E2 | Load instructions: address is sent to memory†<br>Store instructions and STP: address and data are sent to memory†<br>Single-cycle instructions that saturate results set the SAT bit in the Control Status Register (CSR) if saturation occurs.†<br>Multiply instructions: results are written to a register file† | Stores<br>STP<br>Multiples |
| | Execute 3 | E3 | Data memory accesses are performed. Any multiply instruction that saturates results sets the SAT bit in the Control Status Register (CSR) if saturation occurs.† | |
| | Execute 4 | E4 | Load instructions: data is brought to CPU boundary† | |
| | Execute 5 | E5 | Load instructions: data is loaded into register† | Loads |

†This assumes that the conditions for the instructions are evaluated as true. If the condition is evaluated as false, the instruction will not write any results or have any pipeline operation after E1.

The pipeline operation of the instructions can be categorized into seven types shown in Table 16. The delay slots for each instruction type are listed in the second column.

TABLE 16

Delay Slot Summary

| Instruction Type | Delay Slots | Execute Stages Used |
|---|---|---|
| Branch (The cycle when the target enters E1) | 5 | E1–branch target E1 |
| Load (LD)(Incoming Data) | 4 | E1–E5 |
| Load (LD)(Address Modification) | 0 | E1 |
| Multiply | 1 | E1–E2 |
| Single-cycle | 0 | E1 |
| Store | 0 | E1 |

TABLE 16-continued

Delay Slot Summary

| Instruction Type | Delay Slots | Execute Stages Used |
|---|---|---|
| NOP (no execution pipeline operation) | — | — |
| STP (no CPU internal results written) | — | — |

The execution of instructions can be defined in terms of delay slots (Table 16). A delay slot is a CPU cycle that occurs after the first execution phase (E1) of an instruction in which results from the instruction are not available. For example, a multiply instruction has 1 delay slot, this means that there is 1 CPU cycle before another instruction can use the results from the multiply instruction.

Single cycle instructions execute during the E1 phase of the pipeline. The operand is read, operation is performed and the results are written to a register all during E1. These instructions have no delay slots.

Multiply instructions complete their operations during the E2 phase of the pipeline. In the E1 phase, the operand is read and the multiply begins. In the E2 phase, the multiply finishes, and the result is written to the destination (dst) register. Multiply instructions have 1 delay slot.

Load instructions have two results: data loaded from memory and address pointer modification.

Data loads complete their operations during the E5 phase of the pipeline. In the E1 phase, the address of the data is computed. In the E2 phase, the data address is sent to data memory. In the E3 phase, a memory read is performed. In the E4 stage, the data is received at the CPU core boundary. Finally, in the E5 phase, the data is loaded into a register. Because data is not written to the register until E5, these instructions have 4 delay slots. Because pointer results are written to the register in E1, there are no delay slots associated with the address modification.

Store instructions complete their operations during the E3 phase of the pipeline. In the E1 phase, the address of the data is computed. In the E2 phase, the data address is sent to data memory. In the E3 phase, a memory write is performed. The address modification is performed in the E1 stage of the pipeline. Even though stores finish their execution in the E3 phase of the pipeline, they have no delay slots and follow the following rules (i=cycle):

1) When a load is executed before a store, the old value is loaded and the new value is stored.

| i     | LDW |
| ----- | --- |
| i + 1 | STW |

2) When a store is executed before a load, the new value is stored and the new value is loaded.

| i     | STW |
| ----- | --- |
| i + 1 | LDW |

3) When the instructions are in are in parallel, the old value is loaded and the new value is stored.

| i     |    | STW |
| ----- | -- | --- |
| i + 1 | \|\| | LDW |

Branch instructions execute during the E1 phase of the pipeline five delay slots/CPU cycles after the branch instruction enters an initial E1 phase of the pipeline. FIG. 12 shows the branch instruction phases. FIG. 13 shows the operation of the pipeline based on clock cycles and fetch packets. In FIG. 13, if a branch is in fetch packet n, then the E1 phase of the branch is the PG phase of n+6. In cycle 7 n is in the E1 phase and n+6 is in the PG phase. Because the branch target is in PG on cycle 7, it will not reach E1 until cycle 13. Thus, it appears as if the branch takes six cycles to execute, or has five delay slots.

In FIG. 14, fetch packet n, which contains three execute packets, is shown followed by six fetch packets (n+1 through n+6, each with one execution packet (containing 8 parallel instructions). The first fetch packet (n) goes through the program fetch phases during cycles 1–4. During these cycles a program fetch phase is started for each of the following fetch packets.

In cycle 5, the program dispatch (DP) phase, the CPU scans the p bits and detects that there are three execute packets (k thru k+2) in fetch packet n. This forces the pipeline to stall, which allows the DP phase to start execute packets k+1 and k+2 in cycles 6 and 7. Once execute packet k+2 is ready to move on to the DC phase (cycle 8) the pipeline stall is released.

The fetch packets n+1 through n+4 were all stalled so the CPU would have time to perform the DP phase for each of the three execute packets (k thru k+2) in fetch packet n. Fetch packet n+5 was also stalled in cycles 6 and 7; it was not allowed to enter the PG phase until after the pipeline stall was released in cycle 8. The pipeline will continue as shown with fetch packets n+5 and n+6 until another fetch packet containing multiple execution packets enters the DP phase, or an interrupt occurs.

Pipeline discontinuities are caused by memory stalls, multi-cycle NOPs, and the STP instruction. During a memory stall, the CPU cycle (which normally occurs during one clock cycle) occurs in two or more cycles. All of the pipeline phases stall during these extra clock cycles. The results of the program execution are identical with or without the stall. With a memory stall execution will take more clock cycles to finish.

The NOP count instruction provides count cycles of NOPs. If count>2, the NOP is a multi-cycle NOP. A NOP 2 for example, fills in extra delay slots for the instructors in the execute packet it is contained in and for all previous execute packets. Thus, if a NOP 2 is in parallel with an MPY instruction, the MPY's results will be available for use by instructions in the next execute packet. If the delay slots of a branch complete while a multi-cycle NOP is still dispatching NOPs into the pipeline, the branch overrides the multi-cycle NOP and the branch target begins execution after 5 delay slots.

STP is an advanced instruction that can be used only when both these conditions are met: 1) it cannot contain a parallel branch instructor that would force a program fetch, and 2) no program fetch is happening because either its second delay slot contains a multi-cycle NOP, or its third and fourth delay slot execute packets are in the same fetch packet.

Memory System

DSP program memory system 23 includes 64K bytes of memory and a memory/cache controller. The program memory can operate as either a 64K byte internal program memory or as a direct mapped program cache. There are four modes under which the program memory system operates: program memory mode; cache enable mode; cache freeze mode; and cache bypass mode. The mode under which the program memory operates is determined by the program cache control (PCC) field (bits 5–7) in the CSR (FIG. 4). Table 17 shows various PCC values for configuring program memory system 23.

TABLE 17

Program and Data Cache Fields

| Bit Field Counter | Program Cache (PCC) | Data Cache Control (DCC) | Mode Name | Description |
|---|---|---|---|---|
| 000 | PCM | DCM | Cache mapped | Cache mapped into memory. Cache not updated. Cache not accessed (except as mapped into memory). Tags can either be invalidated automatically or invalidated by preceding or following flush (depending on cache implementation). |
| 001 | PCFL | DCFL | Cache flush | Entire cache invalidated. Cache bypassed for accesses. Cache not updated on accesses. |
| 010 | PCE | DCE | Cache enable | Cache accessed. Cache updated. |
| 011 | PCFR | DCFR | Cache freeze | Cache accessed on reads. Cache not updated on reads. hether the cache is updated or invalidated on writes depends on the specific devices. |
| 100 | PCB | DCB | Cache bypass | Cache not accessed. Cache not updated on reads. Write action is the same as for cache freeze. |
| 101 | Reserved | Reserved | | |
| 110 | Reserved | Reserved | | |
| 111 | Reserved | Reserved | | |

When the PCC field of the CSR contains the value 000b, the program memory is mapped as valid program memory space. The addresses that make up the program memory map depend on the value on the MAP_BOOT pin on the device.

Emulation Features

An aspect of the present invention involves novel and improved techniques for emulating the operation of DSP 1 in order to develop software programs or to test DSP 1 for correct operation. Portions of DSP 1 which related to emulation will now be described in more detail.

Referring again to FIG. 1, CPU 10 has emulation circuitry 50 and interrupt circuitry 90 to support the following emulation functions which will be described in more detail: execution and scan control through the test ports; analysis support; and real-time emulation support.

Execution and scan control through the test ports involves halting CPU 10. CPU Halt Support is provided in the following ways: A RDY-based CPU halt based on a software breakpoint (SWBP) or an analysis event.

Analysis support includes the following: a single, exact-match hardware program address breakpoint (PABP); analysis events which can be triggered by the EMU0IN or EMU1IN inputs from the Megamodule Test Access Port (MTAP), or by a program address breakpoint; and a Special Emulation Event input (SEE) which can trigger an analysis event.

Real-time emulation support includes message passing and a CPU Analysis Interrupt (AINT) based on a software interrupt, an analysis event, or the next cycle boundary.

Figure 15:
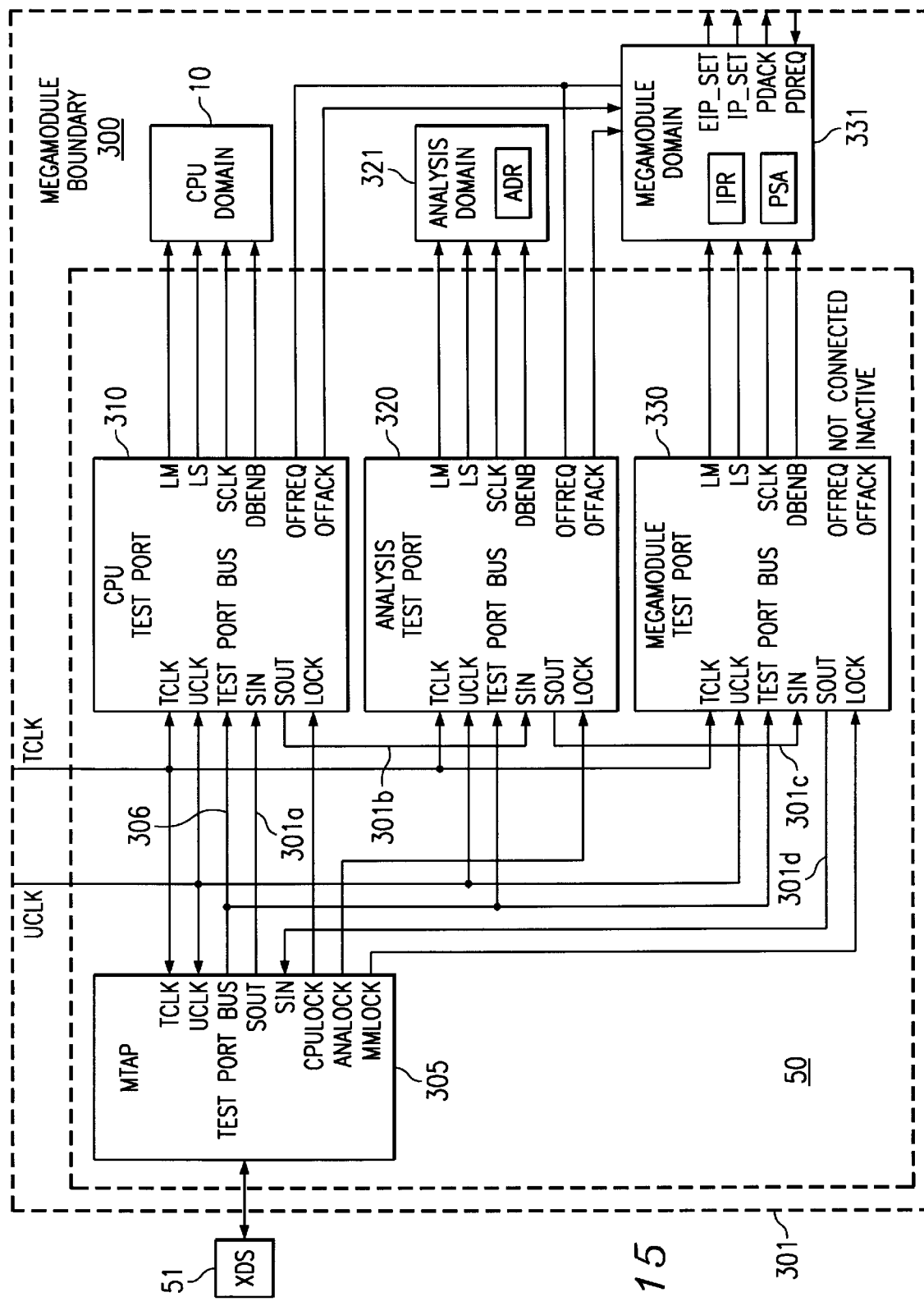
FIG. 15 is a block diagram of an MTAP to Test Port Interface for the processor of FIG. 1.

Referring now to FIG. 15, emulation circuitry 50 is illustrated in more detail. Megamodule Test Access Port (MTAP) 305 is connected to CPU test port (CPUTP) 310, analysis test port (ATP) 320, and Megamodule test port (ATP) 330. Three domains, CPU domain 10, analysis domain 321, and Megamodule domain 331 are interconnected with the test ports. MTAP 305 provides scan and execution control to the various domains within the megamodule. The test ports provide an interface for each domain to the MTAP. Test ports also generate, distribute, and perform clock switching functions for the functional and scan clocks on the megamodule. MTAP 305 provides an interface between XDS 51 and the CPU real-time analysis and message passing features. According to an aspect of the present invention, MTAP 305 provides data streaming for fast memory download/upload. MTAP 305 also supports performance analysis through an event counter and test port control of execution and clocking for both emulation and test. The operation and design of emulation circuitry 50, including MTAP 305 and test ports 310, 320 and 330 will be described in detail in the following pages.

A Special Emulation (SE) device interfaces to MTAP 305 and Megamodule 300 as a whole to provide increased debug, trace, and breakpoint capability. A special emulation device (SE) will have a fourth domain for the SE Analysis (SEA) domain circuitry, which resides outside the megamodule. The SEA domain's interface to the Megamodule through the MTAP is also described in detailed in the following pages. The SEA domain includes: hardware data breakpoints on data and address; hardware program breakpoints on addresses of execute packets dispatched for execution; tracing of executed program addresses, program and data memory accesses; taken interrupts, functional unit usage, and branches; and event counters and sequencers.

Figure 16:
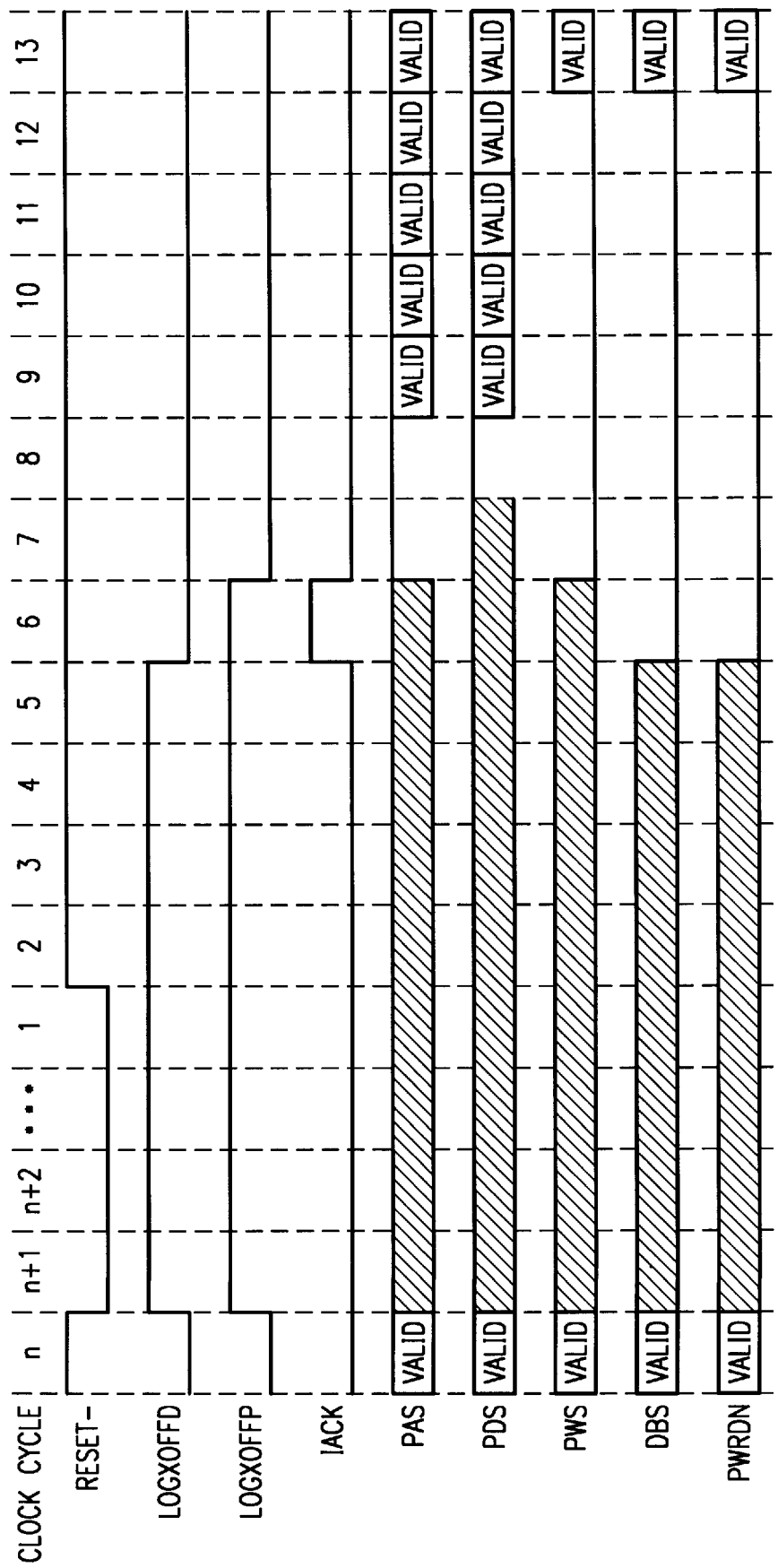
FIG. 16 is a timing diagram of a MegaModule Reset Sequence for the processor of FIG. 1.

FIG. 16 is a timing diagram that shows a Megamodule reset operation and related signals. Note that throughout this process an inactive RDY can still stall the CPU, in other words extend CPU cycles over multiple clock cycles. The sequence of events that occurs is as follows:

1. Clock n+2: This is the first clock cycle after NRESET goes low. The following actions occur if the CPU test port is in the FUNC state:
   A) All internal tri-state busses tri-state. They remain tri-stated until cycle 6.
   B) LOGXOFFD is asserted indicating all non-program memory system devices to ignore megamodule strobes (DBS, PWRDN, JACK).
   C) LOGXOFFP is asserted indicating the program memory should ignore program memory strobes: PAS, PDS, PWS.
2. Cycle n+2: If the CPU test port is in the FUNC state, all instructions in the DP and E1 pipeline phases are annulled.
3. Cycle 1: An indefinite number of clock cycles later, reset interrupt processing occurs with the rising edge of NRESET.
4. Cycle 6: When JACK goes active all registers and boundary signals are set to their reset values except for PWS, PAS, PDS. LOGXOFFD is de-asserted.
5. Cycle 7: As the first PAS is active LOGXOFFP is de-asserted.

Interrupt Operation

The CPU has 14 interrupts available for normal DSP operation. These are reset, the non-maskable interrupt (NMI), and interrupts 4–15. These interrupts correspond to the RESET, NMI, and INT4–INT15 signals on the CPU boundary. For some embodiments, these signals may be tied directly to pins on the device, may be connected to on-chip peripherals, or may be disabled by being permanently tied inactive on chip. Generally, RESET and NMI are directly connected to pins on the device.

The priorities of these interrupts are listed in Table 18. A low-to-high transition on an interrupt pin sets the pending status of the interrupt within the interrupt flag register (IFR). If the interrupt is properly enabled, the CPU begins processing the interrupt and redirecting program flow to the interrupt service routine.

TABLE 18

Interrupt Priorities

| | Interrupt Name |
|---|---|
| Highest Priority | RESET |
| | NMI |
| | INT4 |
| | INT5 |
| | INT6 |
| | INT7 |
| | INT8 |
| | INT9 |
| | INT10 |
| | INT11 |
| | INT12 |
| | INT13 |
| | INT14 |
| Lowest Priority | INT15 |

The CPU cannot be prevented from processing a reset. A reset begins to be processed when RESET experiences a low-to-high transition. Unlike the other interrupts, the RESET signal is labeled active-low. A low value on RESET has the effect of stopping all CPU processing and returning all registers to their reset values.

The non-maskable interrupt (NMI) is the interrupt of second-highest priority. Two conditions prevent NMI from causing interrupt processing: the CPU is in the delay slots of a branch, whether the branch is taken or not; and the NMI-enable bit (NMIE) in the interrupt enable register (IER) is 0. NMIE is cleared upon reset to prevent interruption of processor initialization and upon NMI processing to prevent re-interruption of an NMI by another NMI. NMI is re-enabled by setting NMIE or by completing the execution of a B NRP instruction.

If NMIE is 0, INT4–INT15 are disabled. During NMI processing the return pointer, which continues previous program execution, is stored in the NMI return pointer register (NRP). Thus, the B NRP instruction returns to the previous program flow after servicing the NMI. Table 19 shows how to return from an NMI.

TABLE 19

Return from NMI

| B (.S2) NRP | ; return, sets NMIE |
|---|---|
| NOP 5 | ; delay slots |

The following conditions can prevent INT4–INT15 from causing interrupt processing: the CPU is processing code which resides in the delay slots of a branch and this includes conditional branches that do not complete execution due to a false condition; the NMIE bit in the interrupt enable register (IER) is 0; the corresponding interrupt enable (IE) bit in the IER is 0; or the global interrupt enable bit (GIE) bit in the control status register (CSR) is 0.

During interrupt processing the return pointer, which continues previous program execution, is stored in the interrupt return pointer register (IRP). Thus, the B IRP instruction returns to the program flow after servicing the interrupt. Table 20 shows how to return from a maskable interrupt.

TABLE 20

Return from a Maskable Interrupt

| B (.S2) IRP ; | return, moves PGIE to GIE |
|---|---|
| NOP 5; | delay slots |

The IACK and INUM signals alert hardware, external to the device 11, when interrupts have taken place. The IACK signal indicates that the CPU has begun processing an interrupt. The INUMx signals (INUM0–INUM3) indicate the number of the interrupt (bit position in the IFR) that is being processed.

Table 21 lists the seven interrupt control registers on the device.

TABLE 21

Interrupt Control Registers

| Abbreviations | Name | Description | Register Address |
|---|---|---|---|
| IFR | Interrupt flag register | Status of interrupts | 00010 |
| ISR | Interrupt set register | Allows you to set flags in the IFR manually. | 00010 |
| ICR | Interrupt clear register | Allows you to clear flags in the IFR manually. | 00011 |
| IER | Interrupt enable register | Allows you to enable interrupts. | 00100 |
| ISTP | Interrupt services table pointer | Pointer to the beginning of the interrupt service table. | 00101 |
| IRP | Interrupt return pointer | Contains the return address used on return from a maskable interrupt. This return is accomplished via the B IRP instruction. | 00110 |
| NRP | Nonmaskable interrupt return pointer | Contains the return address used on return from a nonmaskable interrupt. This return is accomplished via the B NRP instruction. | 00111 |

The IFR and the ISR share a register address. The IFR can be read from, and the ISR can be written to. The other registers have unique addresses.

An interrupt can trigger interrupt processing only if the corresponding bit in the Interrupt Enable Register (IER) is set. Bit 0, corresponding to reset, is not writable and is always read as 1. The RESET interrupt is always enabled. RESET cannot be disabled. Bits IE4–IE15 may be written as 1 or 0, enabling or disabling the associated interrupt, respectively. The IER is shown in FIG. 17B.

The NMIE, if clear, disables all nonreset interrupts, preventing interruption of NMI. The NMI enable (NMIE) is unaffected by a write of 0 but is set by a write of 1. NMIE is initialized to 0 upon reset to prevent any interruption of processor initialization until enabled by you. After reset, you must set NMIE to enable NMI and to allow INT15–INT4 to be enabled by GIE and the appropriate IE bit. You cannot manually clear the NMIE. The NMIE is cleared by the occurrence of an NMI. If cleared, NMIE is set only by completing a B NRP instruction or by a write of 1 to NMIE.

The interrupt flag register (IFR) (see FIG. 17A) contains the status of INT4–INT15 and NMI. Table 22 lists the interrupt flags and the interrupts they correspond to. If you want to check the status of interrupts, use the MVC instruction to read the IFR.

TABLE 22

| Interrupt | Description |
|---|---|
| | Interrupt Flags Bits |
| NMIF | Set by NMI |
| IF15–IF4 | Set by the respective interrupt (INT15–INT4) |

The interrupt set register (ISR) and the interrupt clear register (ICR) (see FIG. 17C and FIG. 17D) allow interrupts to be set or cleared manually in the IFR. Writing a 1 to IS4–IS15 of the ISR causes the corresponding interrupt flag to be set. Similarly, writing a 1 to a bit of the ICR causes the corresponding interrupt flag to be cleared. Writing a 0 to any bit of either the ISR or the ICR has no effect. Incoming interrupts have priority and override any write to the ICR. Reset or NMI cannot be set or cleared. Any write to the ISR or ICR (by the MVC instruction) effectively has one delay slot because the results cannot be read (by the MVC instruction) in the IFR until 2 cycles after the write to the ISR or ICR.

Although they do not form a CPU control register, the interrupt pending bits hold the pending status of all CPU interrupts. RSTP, NMIP, AIP, MSGIP, and IP4–IP15 correspond to RESET, NMI, AINT, MSGINT, and INT4–INT15, respectively. The IP bits are set upon recognition of an interrupt. These bits, which are not directly visible to the user, reside in megamodule domain 331 and are updated every clock (i.e. not stalled by an in-active RDY). The user may observe the status of the IP bits, through the IFR which is updated to the value of the IP bits every cycle. The user may affect the status of the IP bits through writes of the Interrupt Set Register (ISR) and Interrupt Clear Register (ICR). These changes occur on the next update of the IP bits to the IFR. The IP-bits are all cleared at RESET. The CPU registers described in this section all reside within the CPU domain and are updated every cycle (i.e. are stalled by an inactive RDY).

The following bits are "reserved" in the sense that they are not available for use by a software program during normal operation of CPU 10, but they are available for use during emulation and testing.

IFR: Bits 2 and 3 of the IFR are reserved for the analysis interrupt (AINT) and message interrupt (MSGINT), respectively.

IER: Bits 2 and 3 of the IER are reserved for the analysis interrupt enable (AIE) and message interrupt enable (MSGIE), respectively.

ISR: Bits 2 and 3 of the ISR are reserved for the analysis interrupt set (AIS) and message interrupt set (MSGIS), respectively. These bits can only be used to set their associated IP bits if the EMU_MVCEN is set via scan.

ICR: Bits 2 and 3 of the ICR are reserved for the analysis interrupt clear (AIC) and message interrupt clear (MSGIC), respectively. These bits can only be used to clear their associated IP bits if the EMU_MVCEN is set via scan.

An analysis interrupt can be triggered by certain types of events. Certain events trigger a halt. For a halt to occur the CPU test port must be in the CNTL state. An exception is that an external halt request from the CPU test port will happen regardless of the execute state.

Certain events can trigger either a halt or an analysis interrupt, as follows:
 1) Special Emulation Event (SEE) input in an active state.
 2) On-chip program address breakpoint (PABP).
 3) EMU0IN and EMU1IN inputs transitioning from inactive to active.
 4) A floating-point resource conflict (FPX event).

Certain other events can trigger only an analysis interrupt, as follows:
 5) A software interrupt SWI instruction.
 6) The next cycle boundary (CYC event).
 7) The XAINT signal from the MTAP.

Certain other events can trigger only a halt, as follows:
 8) SWBP decoded. This indicates the creg field of the first instruction in the execute packet contains the SWBP code (0001).
 9) External halt request from the CPU test port.

Events must be active long enough to be recognized if enabled, regardless of the stalled state of the processor. However, they cannot be active so long as to cause multiple events. Edge sensitive circuitry is used to eliminate time constraints on event length.

Many of the events described above are classified as analysis events and will be ignored when the SUSPEND signal (Table 29) within the CPU is active. However, the following events are not classified as analysis events and will not be affected by SUSPEND: SWBP, SWI, and an external halt requested from the test port.

The SUSPEND signal is driven by the OR of four terms:
 1. CPU_DONE active
 2. The ECTL bit active (Table 28)
 3. The CPU test port being in the PAUS, SDAT, or SCTL states (Table 33)
 4. The AINTSUSP signal in the Analysis Control Register (Table 34).

Referring now to FIG. 18, which is a timing diagram illustrating detection of analysis interrupts. An analysis interrupt (AINT) may be caused by one of 7 sources:
 1. EMU0IN MTAP to CPU signal.
 2. EMU1IN MTAP to CPU signal.
 3. XAINT signal from the MTAP. An interrupt is only generated if the CPU test port is in CTRL.
 4. Special Emulation Event (SEE) megamodule input.
 5. On-megamodule Program Address Breakpoint (PABP).
 6. Software Interrupt Instruction (SWI). Unlike SWBP, SWI does not require the CPU test port to be in the CNTL state. The STP instruction is available to write to program memory to set SWI.

7. Crossing the next cycle boundary in execution (CYC). If enabled the first cycle boundary after a B ARP's target execute packet completes E1 will trigger a CYC event, setting AIP. This will be used for interrupt-based single-stepping with a monitor.

Some of these events require enabling through the Analysis Control Register (FIG. 30A). AIP (and thus the AIF bit in the IFR (FIG. 17A) is only cleared by processing the interrupt or by a write of 1 to bit 2 of the ICR (FIG. 17D). These interrupts like all others cannot occur while in the delay slots of a branch. Recognition is postponed until branch processing is completed. FIG. 18 shows the detection of these events. AIP is only set if the indicated interrupt is enabled by AIE and PRI (and GIE, IE, NMIE) as necessary.

A bit in the Analysis Control Register (FIG. 30A) can change the maskability and priority of interrupts. By setting PRI, AINT can be treated either a second non-maskable interrupt (PRI=1) which is of highest priority or the second lowest priority maskable interrupt (PRI=0). In some systems, analysis must react to events as quickly as possible. In these, the non-maskable mode should be used. In other systems, must disrupt the program flow as little as possible. In this case the maskable, low priority mode should be used.

If PRI=1, AIE disables all non-RESET interrupts. Also, AINT is not affected by GIE or NMIE. NMIE disables all non-RESET/non-AINT interrupts, preventing interruption of an NMI except by RESET or AINT. Note, for an interrupt to be reflected in HPIENT it does not have to be enabled by AIE when PRI=1 (unless it is AINT), When PRI=1 the following different constraints on detection of an interrupt needing processing are imposed:

1. Neither GIE nor NMIE have to be set for an AINT to be taken.

2. For all interrupts except RESET, AIE must be set (AIE=1).

When PRI=1, the following differing actions occur during interrupt processing:

1. During an AINT, PGIE is not set to GIE and GIE is not cleared

2. AIE is cleared.

Figure 30C:
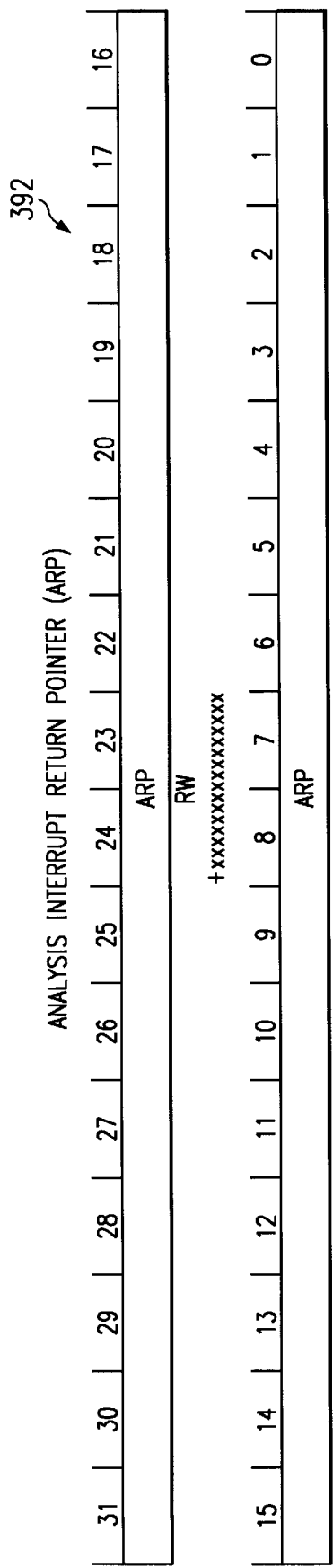
FIG. 30C illustrates an analysis data interrupt return pointer register for the processor of FIG. 1.

Regardless of the value of PRI, the return address for an AINT is always saved in the Analysis Interrupt Return Pointer Register (ARP), illustrated in FIG. 30C. A distinct ARP from NRP and IRP (see Table 20) is necessary as if PRI=1 in the ACR, an AINT may interrupt an NMI or other interrupt, and overwrite the value in the IRP.

FIG. 19A and FIG. 19B illustrate two analysis interrupt related instructions, SWI and BARP, respectively. Tables 23 and 24 describe these two instructions. Table 25 shows a return from AINT code sequence.

TABLE 23

Software Interrupt Instruction

| | | | |
|---|---|---|---|
| Syntax | SWI | | |
| Operands | opcode map fields | none | |
| | unit | none | |
| | operands | none | |
| Description | This instruction sets interrupt pending bit (AIP) for the analysis interrupt (AINT). The creg and z fields only allow for setting a software breakpoint, not for conditional operation. | | |

TABLE 24

Branch to Analysis Return Pointer

| | | | |
|---|---|---|---|
| Syntax | B ARP | | |
| Operands | opcode map field | none | |
| | unit | .S2 | |
| | operands | none | |
| Description | This instruction branches to the value in the Analysis Interrupt Return Pointer (ARP). | | |
| Execution | if(cond) ARP -> PFC | | |
| | else NOP | | |

TABLE 25

Code Sequence for Return From AINT

| | | | |
|---|---|---|---|
| B | .S2 | ARP | ; return, sets AIE |
| NOP | | 5 | ; delay slots |

When an analysis interrupt begins processing, the AINTSUSP bit in the ACR signal will be set to disable recognition of any future analysis events interrupts or halts (i.e. AIP will not be set). AINTSUSP can only be cleared by a user write.

Referring again to FIG. 18, the operation of analysis interrupts in the presence of other interrupts will now be discussed. If the previous execute packet, n+4, had an interrupt (enabled in all necessary ways) occur in its DP phase, that interrupt will be postponed and the AINT taken. Thus, n+4 and n+5 will be annulled. Upon returning to n+5 any conditions which caused a program address based AIP will reoccur.

If the next execute packet, n+6, had an interrupt (enabled in all necessary ways) occur in its DP phase the AINT will take precedence because it occurred prior to the next interrupt. Thus, there does not need to be any special handling for program address based analysis interrupts: SWI, PABP, SEE, and CYC based AINTs.

Test Ports

Referring again to FIG. 15, each domain 10, 321 and 331 interfaces to MTAP 305 through test ports 310, 320 and 330, respectively. The MTAP supports up to four test ports, one for each domain. However, the test port for the SEA domain is not included in the megamodule. Test ports are generic test/emulation interfaces that provide domain clock generation as well as execution and scan control. Execution control allows the emulation or test software direct clock-by-clock control of the domain. The MTAP to test port interface is shown in described in more detail in Table 26 and Table 27. The interface between the SEA domain and the MTAP is similar and is described in detail with reference to FIG. 32 and FIG. 41.

TABLE 26

Test Port Signal Descriptions[4]

| Signal | Description |
|---|---|
| SIN | Test port scan data input. |
| SOUT | Test port scan data output |
| CPULOCK | Test port lock control signal. |
| ANALOCK | |
| MMLOCK | |
| LM | Functional master clock. |
| LS | Slave clock. |
| SCLK | Scan clock. |

TABLE 26-continued

Test Port Signal Descriptions[4]

| Signal | Description |
|---|---|
| DBENB | Domain bus enable. |
| Test Port Bus | See FIG. 9-14. |

[4]There is some redundancy in signals here. For example a SHIFT_DR of the SCTL (or SDAT) path can be determined by either the C0 bit being asserted (or unasserted) or by the SCTL_SEL (or SDAT_SEL) signals. However, for an SCTL UPDATE_DR or CAPTURE_DR which occurs in PAUS, the SCTL_SEL signal must be used as a qualifier. That is because the UPDATE_DR and CAPTURE_DR signals are still asserted from a SDAT scan while the test port is in PAUS even though there is no associated operation. Also, C0 can perform as a qualifier rather than SDAT_SEL in a SDAT SHIFT_DR operation. Thus, the SDAT_SEL is not necessary as a qualifier in when these signal are asserted.

TABLE 27

Test Port Bus Signal Descriptions

| Signal | Description |
|---|---|
| ATPG_DEVM | Indicates MTAP is in ATPG Mode |
| C0/C1 | Test port control input 0 and 1. |
| Ce | Test port expanded control input. |
| SHIFT_DR | MTAP SHIFT_DR state. Enables shifting of bits in a scan chain. |
| UPDATE_DR | MTAP UPDATE_DR state. Enables writing of scan bits to any shadow registers that actually drive control signals. Used by the test port when it is in the PAUS state for an SCTL scan. Unused for SDAT scans. |
| CAPTURE_DR | MTAP CAPTURE_DR state. Enables reading of scan bits from any shadow registers to the scan bits. This signal is not necessary to the test ports for functional operation. However, it is necessary to test (reading back the results of) the operation of the UPDATE_DR function. Used by the test port when it is in the PAUS state for an SCTL scan. Unused for SDAT scans. |
| SCTL_SEL | Indicates selection of a control scan. |
| SDAT_SEL | Indicates selection of a data scan. Most likely will not be used in any test port logic. |
| FCLK_REQ | Functional clock request. Prevents and overrides any OFFREQ power down signal to a domain. |

TABLE 27-continued

Test Port Bus Signal Descriptions

| Signal | Description |
|---|---|
| TCLK_SEL | Indicates that TCLK should drive the test port's non-overlap clock generator. TCLK drives LM or SCLK depending on the test port state and the state of SHIFT_DR. |
| UCLK_SEL | Indicates that UCLK should drive the test ports non-overlap clock generator. UCLK can only drive LM. |

Figure 20:
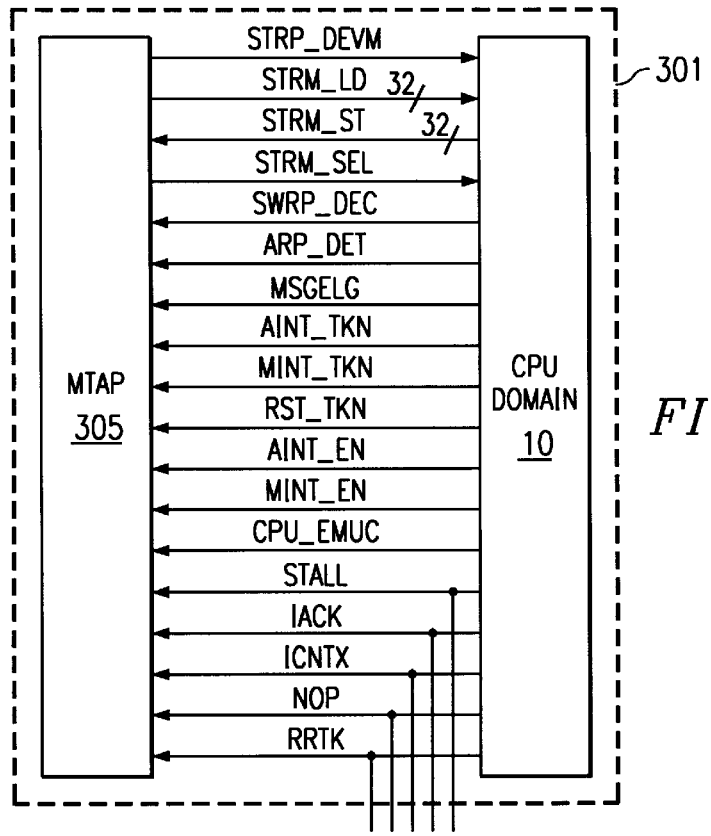
FIG. 20 is a block diagram describing MTAP to CPU Interface Signals for the MTAP of FIG. 15.
Figure 21:
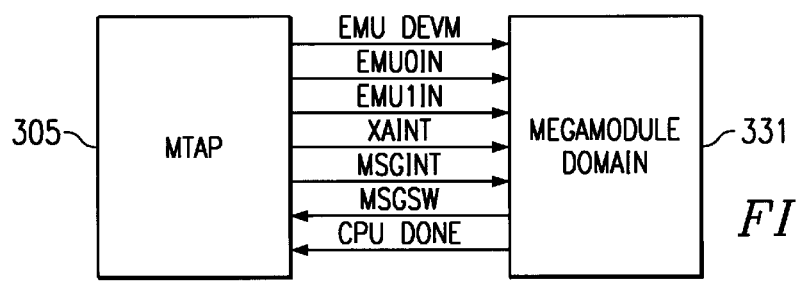
FIG. 21 is a block diagram of an MTAP to MegaModule Domain Interface for the processor of FIG. 1.

Tables 28, 29, 30, 31 and 32 along with FIGS. 20 and 21 describe and define various signals and control bits relating to emulation and testing of Megamodule 300 which will be described in more detail later. Table 28 defines CPU domain bits that are used for emulation control and to provide status information that are transferred using scan chain 301a–d. Table 29 defines signals which are sent across Megamodule boundary 301. FIG. 20 illustrates interconnections between MTAP 305 and CPU domain 10. Table 30 defines signals illustrated by FIG. 20 which also drive Megamodule boundary 301. Table 31 defines the remaining signals illustrated by FIG. 20. FIG. 21 illustrates interconnections between MTAP 305 and Megamodule domain 331. Table 32 defines the signals illustrated in FIG. 21.

Various terms used in Tables 28–32 are defined as follows:

Annul: If an execute packet is annulled during a particular pipeline stage, it does not set active any megamodule boundary strobes or status, write any values to user-visible or emulation-visible state. Address and data may change state as they are qualified by strobes as may an status signals which must be qualified by a strobe. Unqualified status must be set inactive. Annulling also forces an instruction to be annulled in future pipeline stages.

Analysis Control Register (ACR): Illustrated in FIG. 30A
Analysis Data Register (ADR): Illustrated in FIG. 30B
PRI Interrupt Priority control bit in the ACR: described in Table 34.

TABLE 28

CPU Domain Bits for Emulation Control and Status Bits Through Scan

| Name | Bits | Description |
|---|---|---|
| EPDN | 1 | Performs annulling for an emulation pipeline stop done by XDS. Cleared when the CPU test port is in FUNC. After transitioning out of FUNC, remains clear until set through scan. |
| EPUP | 1 | Performs annulling for an emulation pipeline restart done by the XDS. Disables taking of all interrupts including RESET. Cleared when the CPU test port is in FUNC. After transitioning out of FUNC, remains clear until set throught scan. |
| ECTL | 1 | Disables program fetches. Disables taking of interrupts including RESET. Drives SUSPEND analysis event disabling signal. Used for XDS control of CPU. Cleared when the CPU test port is in FUNC. After transitioning out of FUNC, remains clear until set through scan. |
| EUPL |  | Locks fetch mechanism to only fetch the next fetch packet every cycle. Disables taking of all interrupts including RESET. Used for program upload with scan. Cleared when the CPU test port is in FUNC. After transitioning out of FUNC, remains clear set through scan. |
| EMU_MVCEN | 1 | If set allows MVC instructions to the ISR and ICR to affect the AIP and MSGIP bits. Cleared when the CPU test port is in FUNC. |
| ANNUL | 1 | Must be scanned to zero when setting EPDN and EPUL to annul E1. Must be scanned to one when clearing EPDN and EPUL. |
| ANNUL_ASU | 1 | Must be scanned to zero when setting EPDN and EPUL to annul E1. Must be scanned to one when clearing EPDN and EPUL. |
| PDATA_I | 256 | The instruction register on the CPU boundary that holds fetch packets. |
| DATA_I1 | 2 × 3 | Data input ports Saved data is scanned in for an emulation pipeline restart to |
| DATA_I2 | 2 | duplicate saved execution of fetches. |

TABLE 28-continued

CPU Domain Bits for Emulation Control and Status Bits Through Scan

| Name | Bits | Description |
|---|---|---|
| CREG_E1_L1<br>CREG_E1_M1<br>CREG_E1_S1<br>CREG_E1_D1<br>CREG_E1_L2<br>CREG_E1_M2<br>CREG_E1_S2<br>CREG_E1_D2<br>CREG_E1_LDST1<br>CREG_E1_LDST2 | 8 × 4 | The creg fields as held during the E1 pipe stage (upon completion of DC.) Used for SWBP replacement. |
| PCE1 | 30 | This is the PC of the execute packet currently in E1. Unlike the PCE1 CPU control register. this is an execute packet (not fetch packet address). |
| ABP_DET | 1 | Indicates that an analysis event generating a halt occurred. Unlike the other bits this bit is not for control but only for status to the emulator. Cleared when the CPU test port is in FUNC. This is also a CPU domain to MTAP signal. |
| SWBP_DEC | 1 | Indicates the decoding of a SWBP. Unlike the other bits this bit is not for control, but only for status to the emulator. Cleared when the CPU test port is in FUNC. This is also a CPU domain to MTAP signal. |

TABLE 29

Megamodule Boundary Signals

| Name | I/O | Bits | Description |
|---|---|---|---|
| UCLK | I | 1 | cDSP design Provided Clock. May be fed from pins or from on-chip (off-megamodule) PLL, clock-divide logic, or power-down logic. |
| TCLK | I | 1 | Test/Emulation Provided Clock. Pinned out to chip boundary. |
| SEE | I | 1 | Special Emulation Event. Not latched. Requires a boundary SRL for test. |
| EPSIZE | O | 3 | Execute Packet Size. Size of execute packet in DC. |
| FU_L1<br>FU_M1<br>FU_S1<br>FU_D1<br>FU_L2<br>FU_M2<br>FU_S2<br>FU_D2 | O | 8 × 1 | Functional Unit Usage Signals. Indicate functional unit utilization. |
| PCDP | O | 30 | Program Counter Dispatch Phase. The address of the first instruction in the execute packet in DP. |
| LOGXOFFD | O | 1 | Indicates the chip should ignore all non-program memory related strobes such as DBS, PWRDN, and IACK. This signal is active when the CPU test port is in HALT, PAUS, SCTL, SDAT, and during functional or ATPG test, and during reset. |
| LOGXOFFP | O | 1 | Indicates the chip should ignore all program memory strobes such as PAS, PDS, and PWS. This signal is active when the CPU test port is in HALT, PAUS, SCTL, SDAT, and during ATPG test, and during reset. |
| ERDY_DC<br>ERDY_E1 | O | 2 × 1 | Used together to track internal RDY for halt. |
| SUSPEND | O | 1 | Outputs SUSPEND signal. |

TABLE 30

MTAP to CPU and to Megamodule Boundary Signal Descriptions

| Signal | Megamodule Boundary Pulse Width | MTAP Pulse Width | Description |
|---|---|---|---|
| STALL | 1 clock inactive/cycle | | CPU stalled. Fed by STALL signal. |
| IACK | 1 cycle | 1 clock | Interrupt acknowledge. |
| ICNTX | multiple cycles | | Indicates no instruction is in E1 due to interrupt processing. |
| NOP | 1 clock active/cycle | | Indicates no instruction is being currently executed (E1 is filled with NOPs.) This is basically the NOR of the FU_** signals described in Table 29 gated made active for only one clock/cycle. |
| BRTK | 1 clock active/cycle | | Branch Taken. The packet in E1 is the result of a taken branch. |

TABLE 31

MTAP to CPU Interface Signal Descriptions

| Signal | Bits | Description |
|---|---|---|
| STRP_DEVM | 1 | Indicates the MTAP is in STRAP mode (not emulation or ATPG). |
| STRM_LD | 32 | Date for data streaming loads (upload function). |
| STRM_ST | 32 | Data for data streaming stores (download function). When not in data streaming mode the 16 MSBs determine the CPU ID/Revision ID fields in the Control Status Register (CSR). The MTAP has a seperate 16-bit input that determines the values of these fields. |
| STRM_SEL | 1 | Indicates that load and store paths should adjusted as needed for data streaming. |
| ABP_DET | 1 | Indicates that an analysis event generating a halt occurred. |
| SWBP_DEC | 1 | indicates the decoding of a SWBP. Cleared when the CPU test port is in FUNC. This is also a CPU domain to MTAP signal. |
| MSGFLG | 1 | The status of the MSGFLG bit in the ACR. |
| AINT_TKN | 1 | Indicates an AINT has been taken. Occurs at same time as IACK. |
| MINT_TKN | 1 | Indicates a MSGINT has been taken. Occurs at same time as IACK. |
| RST_TKN | 1 | indicates that a RESET has been taken. Occurs at same time as IACK |
| AINT_EN | 1 | Indicates that an AINT may be taken if recieved. If PRI = O, then NMIE, GIE, and AIE must all be 1. If PRI = 1, AIE must be 1. |
| MINT_EN | 1 | Indicates that a MSGINT may be taken if received. GIE and MSGIE must be 1. |
| CPU_EMUC | 1 | 4-Bit signal from the ACR for user configuation of the EMU(0/1) Boundary Pins |

TABLE 32

MTAP to Megamodule Domain Interface Signal Descriptions

| Signal | Description |
|---|---|
| EMU_DEVM | Indicates MTAP is in emulation mode. Used in generation of CPU_DONE. |
| CPU_DONE | Indicates CPU is done halting. This signal is inactive when the test port is in the FUNC state. It only becomes active after a halt. This signal is generated in the megamodule domain because it must react to changes in RDY. |
| EMU(0/1)IN | Can generate a one clock pulse which triggers an halt or analysis interupt. The MTAP generates this signal based on the EMU(0/1) megamodule input. |
| MSGSW | Can deliver a one-clock pulse as directed by the MSGSW bit in the ACR. Because this is a one-clock (not one-cycle) pulse this signal is generated in the megamodule domain. |
| XAINT | Triggers an analysis interrupt (AINT). |
| MSGINT | Triggers a message interrupt (MSGINT). |

Figure 22:
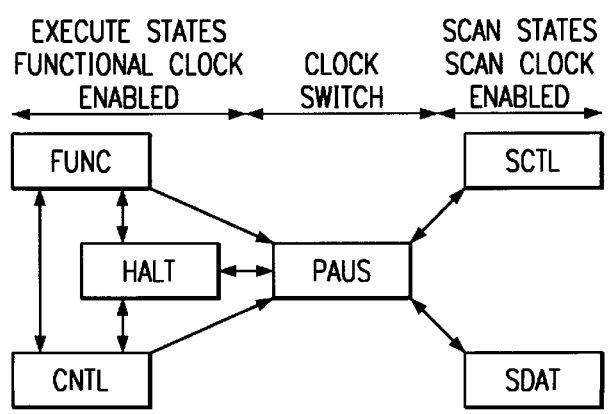
FIG. 22 is a state diagram of the test port states for the processor of FIG. 1.

FIG. 22 is a state diagram of various states in which a test port can reside. A set of MTAP signals C0, C1, and Ce (Table 27) and the LOCK signal (Table 26) determine the state of the test port, as described in Table 33 and illustrated in FIG. 22. Each test port 310, 320 and 330 has an independent lock signal from the MTAP (FIG. 15). An active lock signal causes the current state to be latched within the test port until the lock signal is inactive. When a test port is not locked, the test port bus determines the state of the test port. When the test port is locked, signal changes on the test port bus and clock switching are ignored. If a domain is locked its scan modules are not added to the chain and are bypassed through the test port's Shared Shift Register (SSR) bits. The LOCK signal also locks the current clock generation mode of the device.

Software operating on XDS 51 guarantees that a test port transitions properly when the test port is unlocked with a MTAP code applied to the test port that is different from the code it was locked in. When switching from FUNC, CNTL, or HALT to a scan state (SCTL or SDAT), PAUS is transitioned through, as shown in FIG. 22. The MTAP does not allow the PAUS state to be exited until a clock switch completes, as will be described later.

If the test port is locked in PAUS, the emulation software must unlock the test port in PAUS. If it was unlocked in any other states, the resulting clock switch would contain glitches.

Referring again to FIG. 15, each test port supplies a Domain Bus Enable (DBENB) signal to its domain scan paths. If inactive, DBENB forces all domain boundary signals inactive and sets all domain tri-states to the HI-Z state. In emulation mode, DBENB is driven active if the test port is in FUNC, CNTL, or HALT. In test mode (ATPG_DEVM=1), the test port's first SSR bit acts as the DBENB. This bit is scanned as part of a data scan (SDAT) operation. In all modes, the DBENB signal is inactive when the test port is in SCTL, SDAT, or PAUS. When switching from PAUS to FUNC or CNTL, the MTAP forces the test port to enter HALT for at least one clock to assure DBENB is active prior to restarting execution.

TABLE 33

Test Port States

| Test Port STATE | State Name | SDAT_SEL | SCTL_SEL | C0 | Ce | SIN | SOUT | Functional Clocks | Scan Clocks | DBENB | Emulation and Test Logic | Description |
|---|---|---|---|---|---|---|---|---|---|---|---|---|
| FUNC | Functional Run | 0 | 0 | 1 | 1 | X | X | Enabled | Disabled | Enabled | Disabled Held in Reset* | Normal run state of the device. |
| CNTL | Control Run | 0 | 0 | 1 | 0 | X | X | Enabled | Disabled | Enabled | Enabled | Allows test and emulation control. |

TABLE 33-continued

Test Port States

| Test Port STATE | State Name | SDAT_SEL | SCTL_SEL | C0 | Ce | SIN | SOUT | Functional Clocks | Scan Clocks | DBENB | Emulation and Test Logic | Description |
|---|---|---|---|---|---|---|---|---|---|---|---|---|
| HALT | Halt | 0 | 0 | 0 | 1 | X | X | ** | Disabled | Enabled | Disabled via SUSPEND | The method of halting execution is controlled by the domain and is determined by the device mode bits. |
| PAUS | Pause | 0 | 0 | 0 | 0 | X | X | Disabled | Disabled | Disabled | Disabled via SUSPEND | Data scan paused without advancing the serial shift clock. Data scan can restart without corrupting the SRLs in the scan path. Functional clocks can be turned off during PAUS in preparation for a clock switch. |
| SCTL | Scan Control | 0 | 1 | 1 | X | Di | Do | Disabled | Enabled | Disabled | Disabled via SUSPEND | Connects SIN and SOUT to the SSR path. The SSR updates the MSENB latches after a scan based on the UPDATE_DR signal. Similarly, the MSENB are written into the SSR based on the CAPTURE_DR signal. |
| SDAT | Scan Data | 1 | 0 | 0 | X | Di | Do | Disabled | Enabled | Disabled | Disabled via SUSPEND | Connects SIN and SOUT to the SSR path. The SSR bits are bypass bits for domain scan paths not enabled through MSENB. Each domain contains at least one scan path. |

*Triggering of analysis halts is disabled. Triggering of analysis interrupts is not affected.
**Disabled in ATPG mode. Enabled otherwise.

Figure 23A:
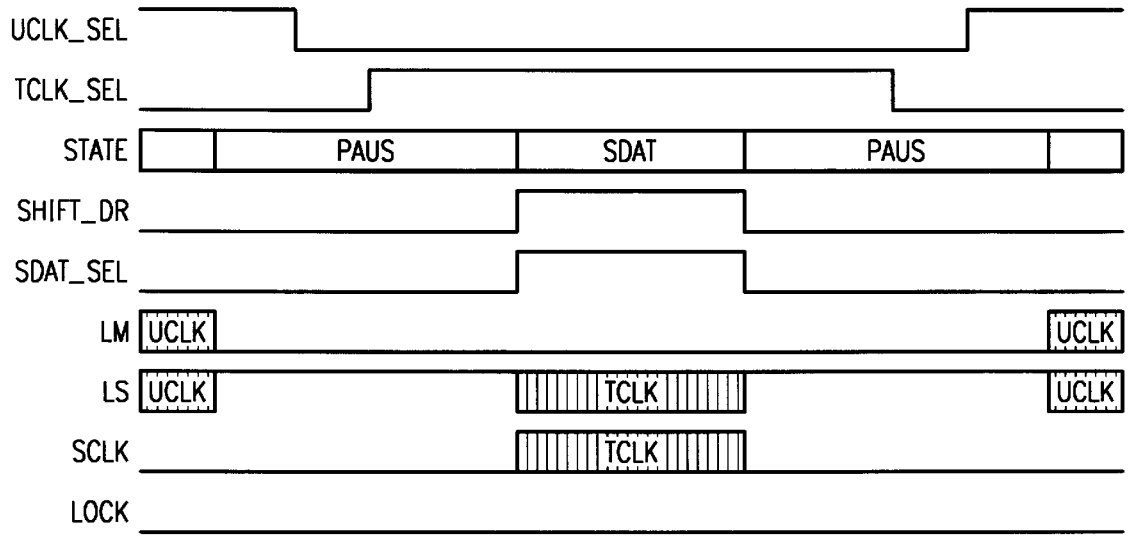
FIG. 23A is a timing diagram of a clock switch from Functional Run to Scan on UCLK for the processor of FIG. 1.
Figure 23B:
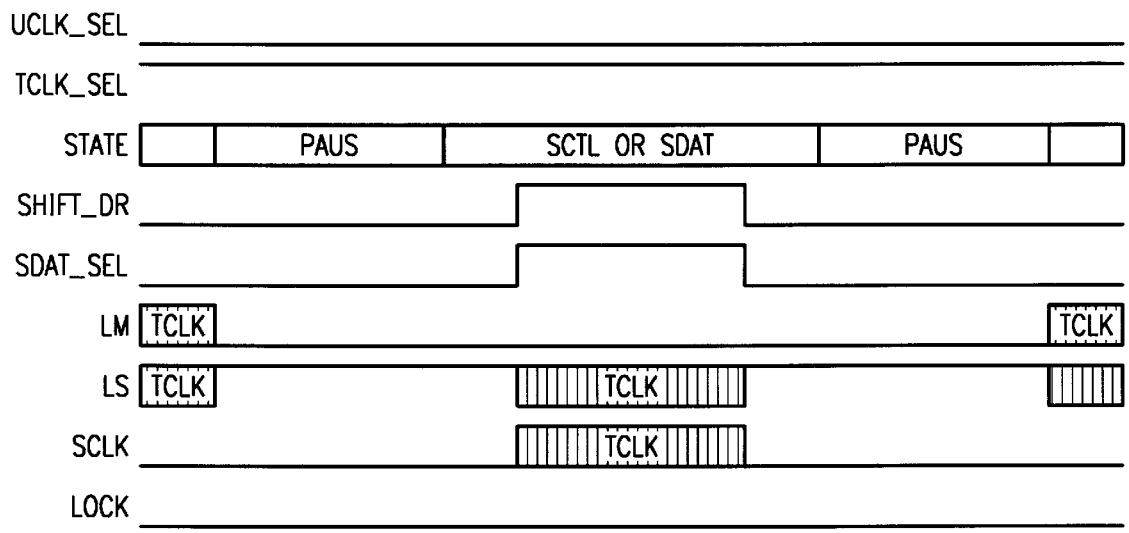
FIG. 23B is a timing diagram of a clock switch from Functional Run on TCLK for the processor of FIG. 1.
Figure 23C:
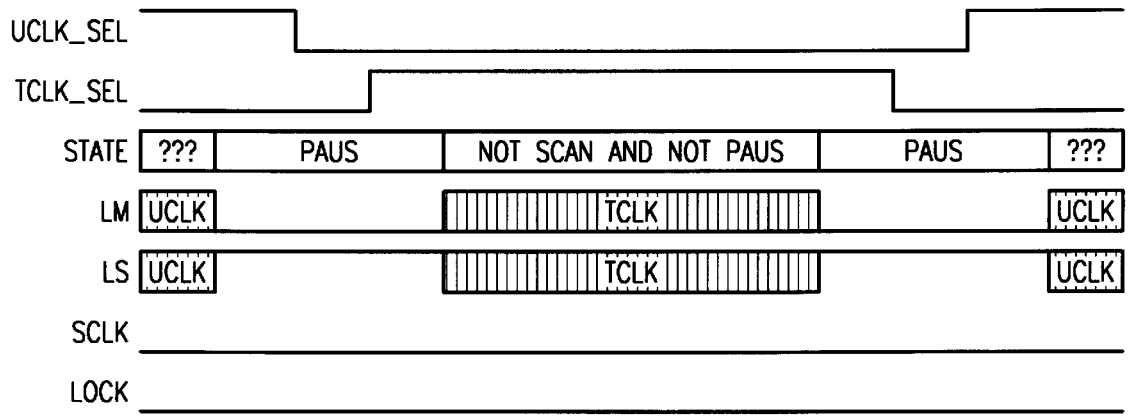
FIG. 23C is a timing diagram of a clock switch from Functional Run on UCLK to Functional Run on TCLK for the processor of FIG. 1.

Referring now to FIGS. 23A, 23B and 23C, which are timing diagrams, the operation of a clock switch will be described. The PAUS state is used for clock switching as controlled by UCLK_SEL, TCLK_SEL, MTAP codes, LOCK, and SHIFT_DR. LM is turned off when the test port is in PAUS, SDAT, or SCTL. If ATPG_DEVM=1, LM is also shut off when in HALT. Three types of clock switching are possible:

1. Switching from functional run on UCLK to scan (on TCLK) (FIG. 23A) for emulation control of the device.
2. Switching from functional run on TCLK to scan (on TCLK) (FIG. 23B) for test. Running on TCLK is used during test because TCLK can be guaranteed to come directly from device pins whereas UCLK may be controlled by cDSP design logic.
3. Switching from functional run on UCLK to functional run on TCLK (FIG. 23C) for test for the same reasons as above.

The sequences of changes shown in the inputs to the test port are consistent with the transitioning of the MTAP outputs. One exception is that SHIFT_DR could transition simultaneously with the transition in and out of the SDAT or SCTL states.

The following rules are followed:
1. Clocking changes are based on the latched codes inside the test port.
2. Clocking and test port state does not change if the LOCK bit is active.
3. LS is always 180 degrees out of phase and non-overlapping with which ever clock is being driven (SCLK or LM).
4. (T/U)CLK drives LM/LS, only if (T/U)CLK_SEL is enabled and the test port is either in HALT if ATPG_DEVM=0, or in FUNC, or in CNTL.
5. TCLK drives SCLK/LS, only if TCLK_SEL, SHIFT_DR, and SDAT_SEL are enabled and LOCK is disabled. Note that SCTL_SEL does not enable SCLK, because only SSR SRLs (i.e. no domain SRLs) are scanned.
6. Finally, if the device is in ATPG mode (ATPG_DEVM=1), TCLK always drives LM/LS when the test port is in FUNC or CNTL. This assumes UCLK is driven low.

Scan operation is provided by the test port's internal Shared Shift Register (SSR) path. This path consists of one SRL for each distinct scan chain within that domain. The SSR bits are used to update the Scan Control (SCTL) path or as bypass bits for domain data (SDAT) scan paths. The SSR path is clocked with the scan clock since the test port must remain scannable even while the domain is running on functional clock. The clocks within the domain must switch from the functional clock to the scan clock for SDAT and SCTL (FIG. 22). Details of the scan paths will be described later with respect to FIG. 33.

Figure 24:
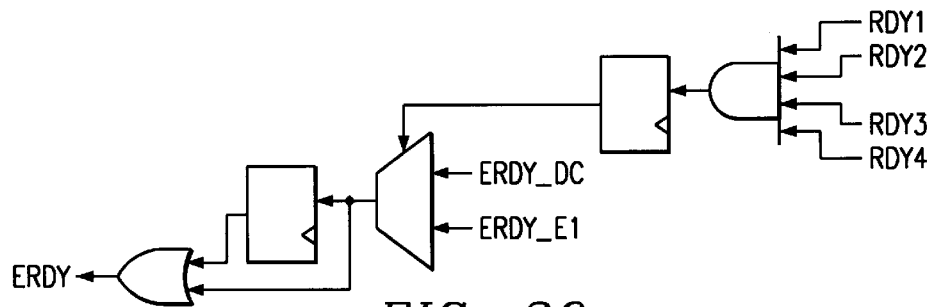
FIG. 24 is a table of a scan chain for a Data Scan based on the MSEND bits for the processor of FIG. 1.

A control scan operation (SCTL) accesses the Module Scan Enable (MSENB) bits through the SSR scan path. MSENBs select the domain scan paths that are enabled to form the data scan (SDAT) path, as illustrated in FIG. 24. Each test port contains at least one MSENB bit. An MSENB bit is needed for each scan path within the domain. All the test ports with in the megamodule are single slice: they have a single scan path and a single MSENB bit. Alternate single slice embodiments could replace the SCTL scan and the MSENB bits by the LOCK signal, or equivalent, for simplicity. The MSENB data is scanned into the SSR path while the MTAP asserts SHIFT_DR qualified by an active SCTL_SEL signal. When the MTAP asserts UPDATE_DR qualified by an active SCTL_SEL signal, the SSR is loaded into the MSENBs. When the MTAP asserts CAPTURE_DR qualified by an active SCTL_SEL, the MSENBs are loaded into the SSR. A bypassed control scan during functional run can be accomplished by locking the test port in FUNC or CNTL and then performing the scan. In that case, the SSR bits are the only ones added to the scan chain. Also, the test port does not respond to the UPDATE_DR and CAPTURE_DR signals.

A data scan operation (SDAT) provides access to the domain scan paths through the SSR scan path. During a data scan, the domain data is scanned through the SSR paths. The SSR bits act as bypass bits for domain scan paths that are bypassed as controlled by the MSENB bits. The SSR path is selected by the SDAT state. Data is scanned into the SSR path while the MTAP asserts SHIFT_DR and the test port is in the SDAT state. If the MSENB associated with the SSR is enabled, data is scanned from the SSR bit through that domain scan path. If the MSENB bit is disabled, data is scanned to the next SSR bit. Each domain contains at least one SDAT path. The SDAT path provides access to SRLs required for test and emulation. The UPDATE_DR and CAPTURE_DR signals are not used by the scan data operation.

Power-down

Three methods of power down are available on integrated circuit 1, as follows:

1. The IDLE instruction. IDLE continuously propagates NOPs into the pipeline until annulled by an interrupt. Clocking and RDY operation continues as normal. Thus, the CPU can still respond to a test port halt.

2. Completing the PDREQ/PDACK handshake to turn off LM/LS in the analysis and CPU domains. Microprocessor 1 design may use the EIP_SET and IP_SET signals from the megamodule to re-enable clocks based on changed interrupt conditions.

3. Modifying or shutting off UCLK to the CPU. However, if UCLK is shut off, the XDS may provide only limited visibility by running the Megamodule on TCLK.

FIG. 15 and Table 34 detail the power down interface between the test ports, power-down logic, and megamodule boundary. If a test port receives an inactive FCLK_REQ and an active clocks off request (OFFREQ), it will shut off clocks (LM low and LS high) and acknowledge the request by asserting OFFACK. If OFFREQ is inactivated or FCLK_REQ is activated, clocks are re-enabled and OFFACK is de-asserted. The power-down logic gives microprocessor 1 the ability to shut off the analysis and CPU domains. In the second case, the EiP_SET or IP_SET inputs can be used to signal interrupt conditions that microprocessor 1 may want to use to reassert clocks. Microprocessor 1 design is responsible to stall all other components as necessary while the CPU is powered down.

TABLE 34

Power-down Related Signals

| Signal | I/O | Description |
| --- | --- | --- |
| PDREQ | Megamodule Input | Drives OFFREQ to CPU and Analysis Test Ports. |
| PDACK | Megamodule Output | And of OFFACK from CPU and Analysis Test Ports. |
| OFFREQ | Test Port Input | If the test port is receiving an inactive FCLK_REQ shuts off all clocks to the domain and asserts OFFACK active. |
| OFFACK | Test Port Output | Indicates test port has had LM shut off cue to a OFFREQ. |

TABLE 34-continued

Power-down Related Signals

| Signal | I/O | Description |
| --- | --- | --- |
| EIP_SET | Megamodule Output | Indicates an enabled interrupt (by all necessary IE, GIE, NMIE, PRI, and AIE conditions) is set. |
| IP_SET | Megamodule Output | Indicates an IP bit is set. |

All SRLs in the megamodule are scannable and belong to one of the three test port domains or to the MTAP. A fourth off-megamodule domain, the SE analysis domain is supported by the MTAP but is not included as part of the megamodule. Each domain has a test port associated with it. Test ports are used in situations where clocks in a particular domain may have to be switched. The four domains are as follows:

Analysis Domain: The Analysis Data Register (ADR)

Megamodule Domain: This domain contains a single scan path including:

1. IP bits that feed the IFR and the associated detection latches
2. The SRLs that latch RDY at the boundary and control stalls
3. The Parallel Signature Analyzers (PSAs) for test
4. The circuitry that detects the EMU (0/1)IN signals from the MTAP
5. The latches for the power-down control bits
6. The circuitry that generates CPU done
7. The circuitry that generates the one-clock MSGSW pulse.

CPU Domain: The CPU domain consists of a single scan path containing all CPU SRLs that are stalled by RDY.

SE Analysis (SEA) Domain: A special emulation device (SE) will have a fourth domain for the SE logic, which resides outside the megamodule.

CPU Test Port Halt Control

This section describes a CPU domain halt for emulation. In emulation mode (EMU_DEVM=1), the CPU stops execution on a cycle boundary. In test mode (ATPG_DEVM=1), the CPU stops execution on a clock boundary. The Figures in this section depict a two-cycle off-megamodule RDY-based halt for illustrative purposes. Table 35 defines signals between the CPU Domain and the CPU Test Port which support halting.

TABLE 35

CPU Domain to CPU Test Port Interface

| Name | Description |
| --- | --- |
| EMURDY | The internal RDY component from the emulation logic and from test port control. |
| CPU_RDY | Represents the anding of the internal RDY (from the megamodule input) with EMURDY. CPU_RDY should cause all CPU domain SRLs to maintain state during the next clock. |
| CPU_STATE | The CPU test port state. |

Figure 25:
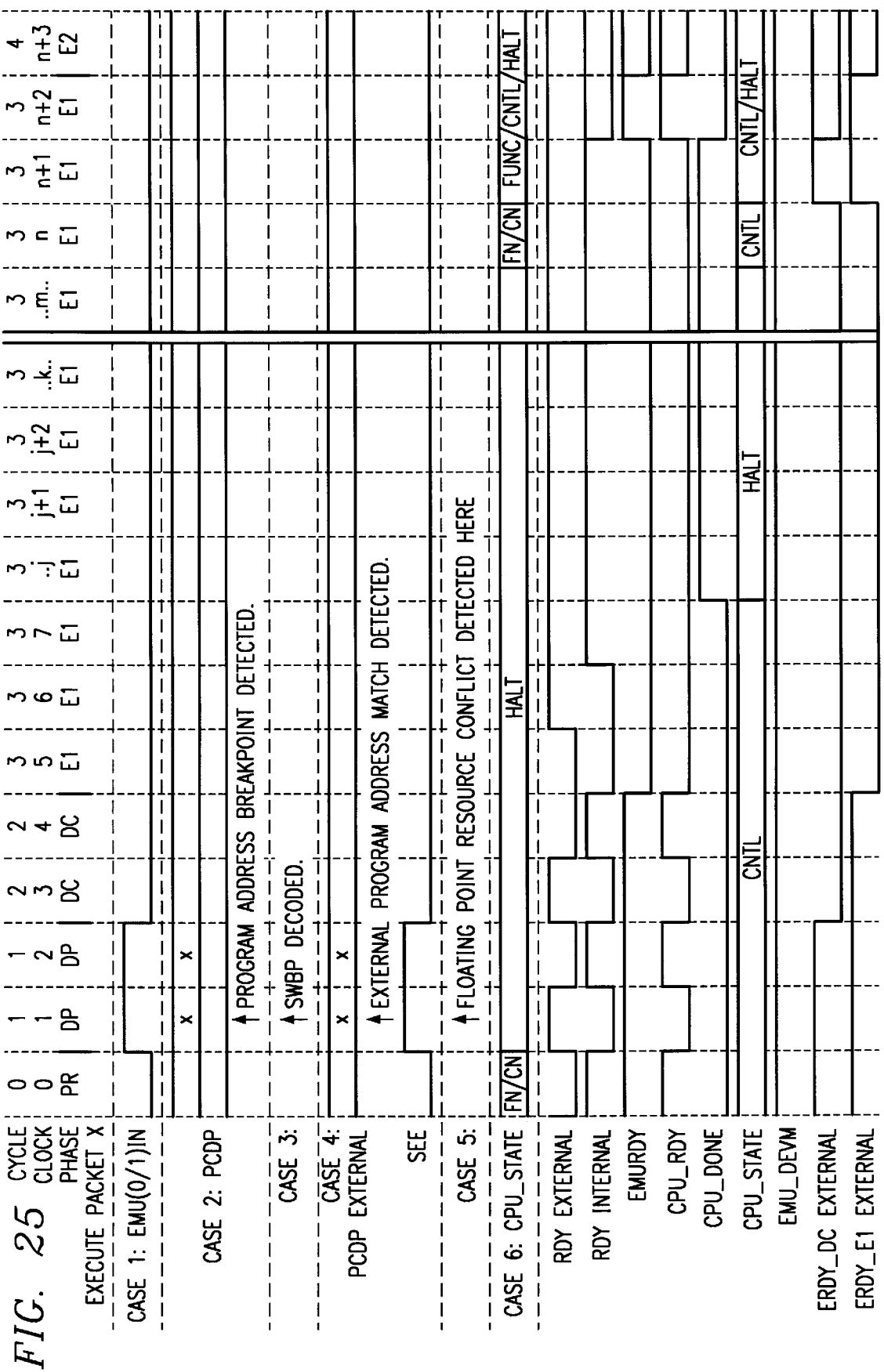
FIG. 25 is a timing diagram showing various cases of halting for the processor of FIG. 1.

FIG. 25 is a timing diagram that illustrates the different cases of a halt for emulation, as discussed earlier. Although the descriptions here indicate the test port goes to the halt state, for another embodiment the results would be the same if the test port went instead to the PAUS state. PAUS affects the ERDY_DC, ERDY_E1, and CPU_DONE signals in the same way as HAL. Emulation halts occur in response to the following:

Case 1. The active transition of the EMU(0/1) inputs. Note that the EMU(0/1)IN signals generate one clock long pulses. Thus, these signals are detected in the megamodule domain (perhaps in the middle of a cycle) and their width is stretched to the end of the cycle as shown. Thus, because it must react during inactive RDY, logic in the megamodule domain will accomplish this.

Case 2. Program address breakpoint detected during the DP phase.

Case 3. A SWBP decoded during the DP phase. Note that once the pipeline is stopped in during the E1 phase of the instruction. The pipeline will not advance until the SWBP_DEC field is cleared through scan.

Case 4. A special emulation event (SEE) based on a program address breakpoint match of the PCDP externally. This is seen internally during the DP phase. Note that other conditions could generate and SEE—based halt depending on the special emulation logic implemented. However, a program address breakpoint is shown because it has the strictest timing requirements.

Case 5. A floating-point resource conflict.

Case 6. The test port transitioning from CNTL to HALT during the DP phase. Like EMU(0/1)IN events, this can also occur during the middle of a DP cycle. Based on one of these events the following actions occur, as illustrated in FIG. 25:

The ERDY_DC signal is set low externally during the entire DC phase.

The ERDY_E1 signal is set low externally starting at the beginning of the E1 phase.

The EMURDY is set at the beginning of the associated E1. This feeds the CPU_RDY signal, stalling the CPU.

Once all RDYs (the RDY1–RDY4 inputs) are active internally, CPU_DONE is asserted.

After recognizing the CPU_DONE, the MTAP moves the CPU test port from CNTL to HALT.

The XDS, through the MTAP, performs all necessary scans.

The MTAP moves the test port back to CNTL to allow the CPU to complete the pipeline phase. CPU_DONE and ERDY_E1 go inactive.

EMURDY goes inactive.

Notice that if the MTAP applies CNTL for only one clock, it can step the megamodule a single pipeline phase.

Figure 26:
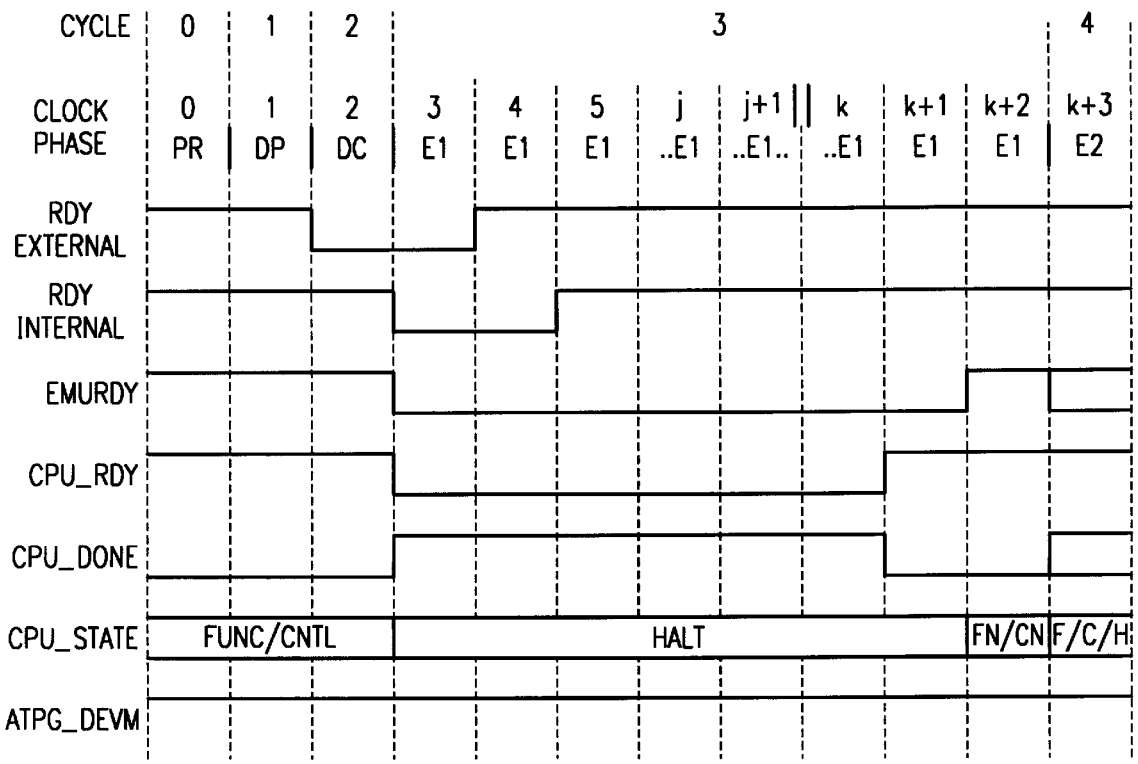
FIG. 26 is a circuit diagram of circuitry to form signal ERDY.

FIG. 26 is a schematic illustrating a circuit for forming an external memory ready signal ERDY. The external memory systems must track each other's RDYs to be aware of each other's stalls. Similarly, the ERDY_DC and the ERDY_E1 signals can be used by the external memory systems to be aware of an emulation halt. Because the CPU internally has two cycles warning (at least two clocks) before an pending emulation halt, it can generate the ERDY_DC and ERDY_E1 signals.

Figure 27A:
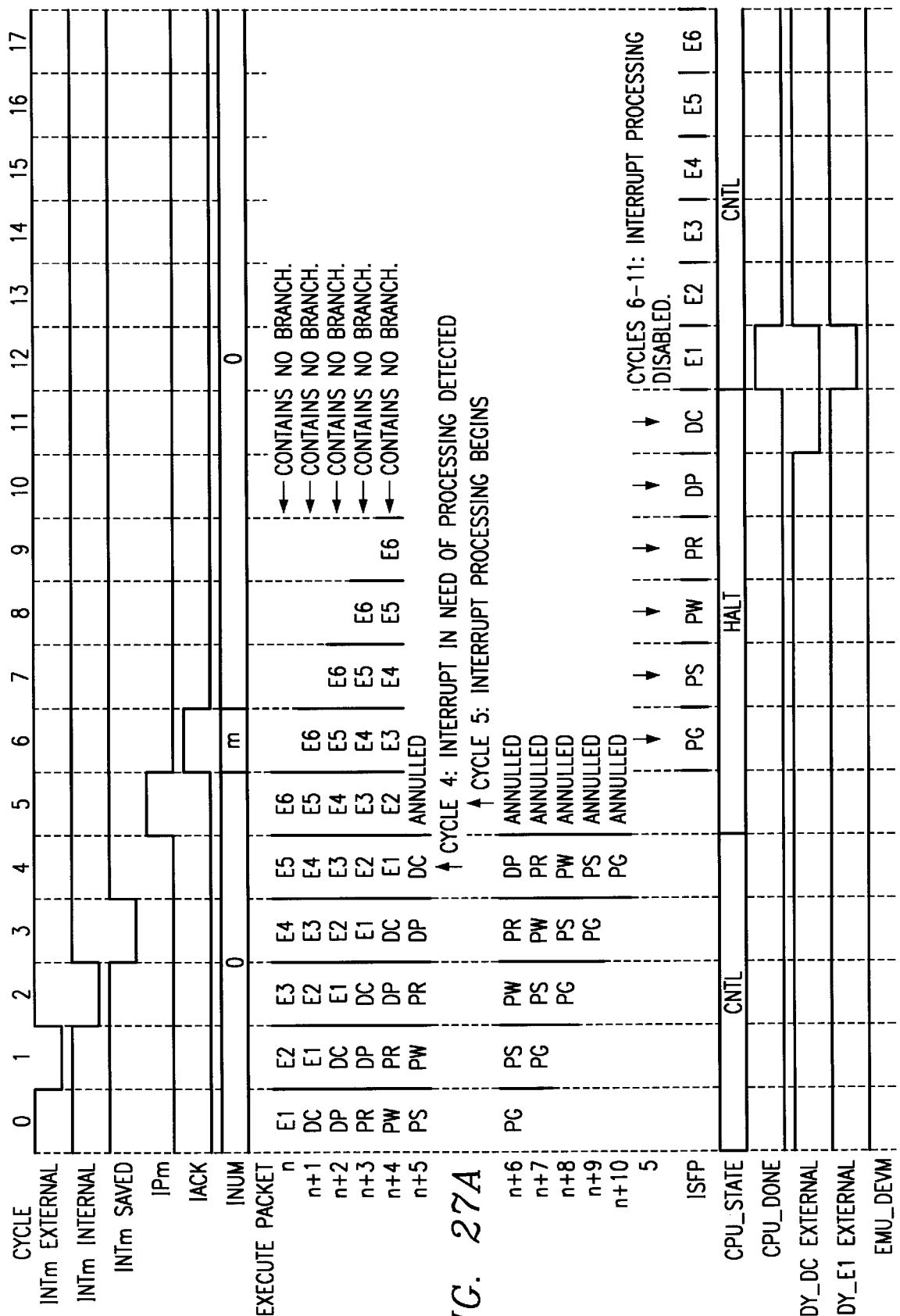
FIG. 27A is a timing diagram of a CPU test port requested halt during interrupt processing for the processor of FIG. 1.

FIG. 27A is a timing diagram that illustrates the interactions of Halts, Interrupts and Reset. In FIG. 27, assume an execute packet n+5 has an enabled pending interrupt it its DC stage. If n+5 has a halt detected in its DP, the halt will take priority and the interrupt will not occur. In this way halts can block interrupts (including reset). Interrupt flags will continue to be set however. Interrupts and resets are also postponed during scan because EMURDY postpones interrupt response by stalling the pipeline.

The side-effects of a halt depend on the progress of the associated execute packet through the pipeline. Thus, if an execute packet following a multi-cycle NOP or IDLE encounters a halt condition in its DP, ERDY_DC and EMURDY will not respond to the halt until that execute packet enters DC. Similarly, ERDY_E1 and CPU_DONE will not respond until the execute packet enters E1.

If the CPU's test port transitions from CNTL to HALT in response to a CPU test port-requested emulation halt during interrupt processing, CPU_DONE does not go active until the interrupt service fetch packet (ISFP) reaches E1 (FIG. 27A).

FIG. 27B is a timing diagram that illustrates a test halt that is requested by a test port. When in test mode (ATPG_DEVM=1), the CPU will halt immediately upon the test port transitioning from CNTL to HALT in response to a CPU Port-Requested test halt. This acts the same way regardless of the presence of interrupt processing.

Emulation Pipeline Control

Referring again to Table 28 which summarizes various emulation control and status bits, the following emulation control bits will now be described in more detail: EPDN, EPUP, ECTL, and EUPL. The Emulation Pipe-Down (EPDN) bit will perform annulling for an emulation stop which results in the following:

Further Fetching Disabled: PAS is disabled. Thus, no more program fetches are initiated. However, previously requested fetches are allowed to complete and be loaded into a program data input buffer PDATA_I which is located in program fetch circuitry 10a.

Execute Packets not yet in E1 annulled: Before an execute packet enters E1 it is annulled. Any execute packets entering E2 and afterward can be cycled to completion by the XDS. Note: The ANNUL and ANNUL_ASU bits must both be scanned to 0 for annulling to work.

Interrupts Disabled: Taking of all interrupts including RESET is disabled. Pending bits continue to get set.

The Emulation Pipe-Up (EPUP) bit will perform annulling for an emulation restart. Interrupts are disabled so that taking of all interrupts including RESET is disabled; however, pending interrupt bits continue to get set.

The Emulation Control (ECTL) bit allows the emulator control of the CPU by performing the following steps:

1) Suspends Analysis Events: ECTL suspends any future recognition of analysis events.

2) Interrupts Disabled: ECTL disables all interrupts including RESET. IP bits still get set but interrupts are not taken. Due to suspension of analysis events AIP can only be set by an SWI.

3) Disables Fetches: ECTL (like EPDN) also disables program fetches by forcing PRS inactive. Thus, when the CPU is in halt, the XDS can scan instructions into PDATA_I. If PDATA_I contains multiple execute packets (a partially serial fetch packet), the CPU should process these as usual and wrap around to the first execute packet when complete. However, execute packets cannot cross the fetch packet boundary and wrap around. The XDS can trigger another emulation event by placing a SWBP as one of the 8 instructions.

The Emulation Program Upload Support (EUPL) bit supports program upload. EUPL re-enables program fetches, and sets the PFC to increment to the next fetch packet (i.e. no branching, PFC+=8). However, all stages DP and after are annulled. Fetches are re-enabled even if ECTL is set. However, if ECTL is set interrupts will still not be taken and analysis events will be suspended. This is used for program upload. On every cycle, PDATA_I can be scanned to extract the fetch packet contents. Note: The ANNUL and ANNUL_ASU bits must both be scanned to 0 for annulling to work.

Figure 28:
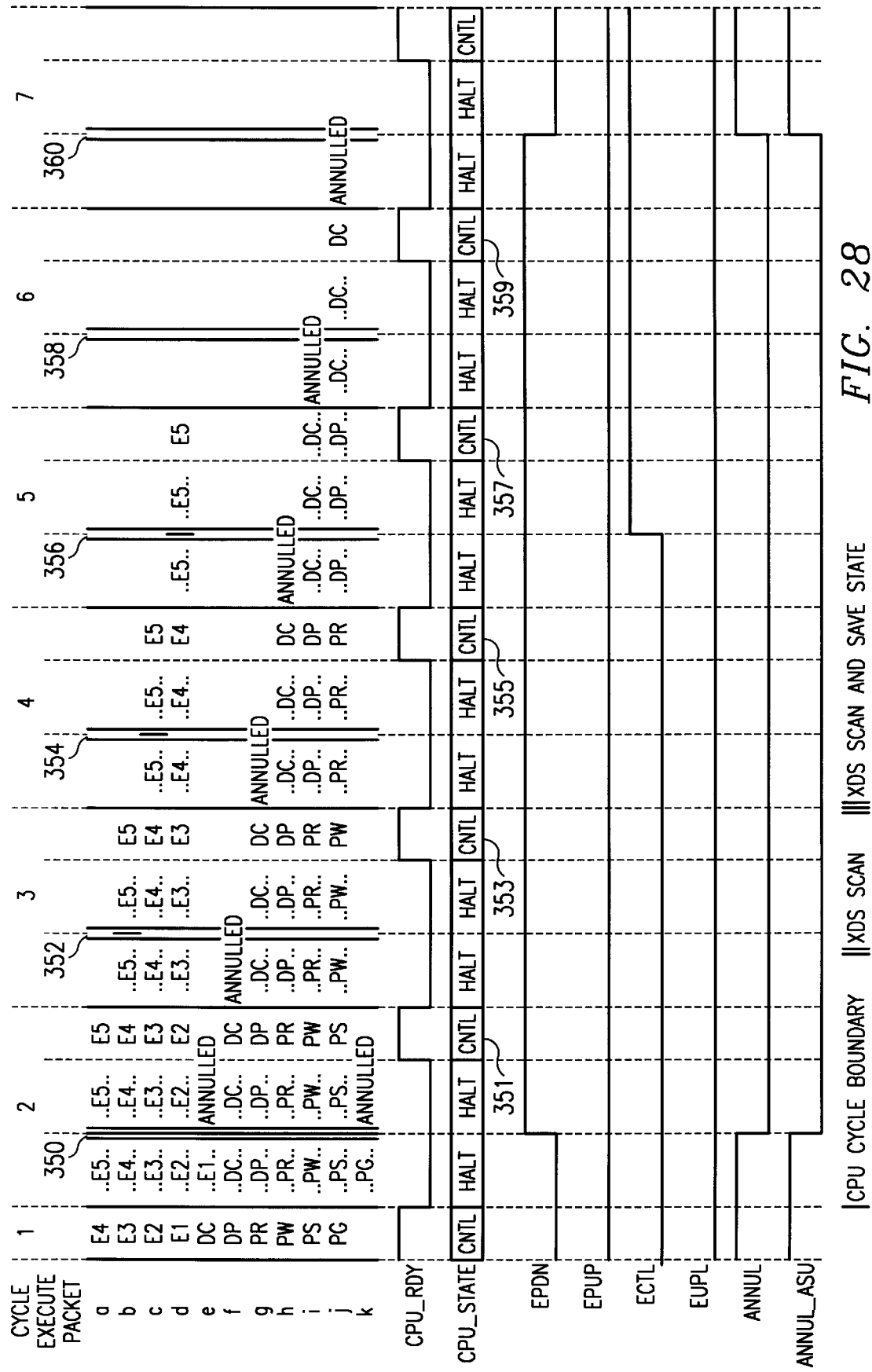
FIG. 28 is a timing diagram of a pipeline halt showing a pipeline management process for emulation for the processor of FIG. 1.

FIG. 28 is a timing diagram that illustrates a sequence of halts in a procedure for stopping the pipeline and saving as a state the contents of various registers within the pipeline, referred to as a "pipe-down" procedure. Instructions in execute packets that have completed E1 (*a–d*) are allowed to proceed to completion. The following describes the sequence of operations XDS 51 performs in controlling a pipeline stop. Note that in this method of saving state, any user modifications of data sources of loads that have completed will not be reflected upon restart. After initiating a halt, as described with reference to FIG. 25, the following steps are performed:

1. Cycle 2 at time 350: Scan out and save all CPU domain state. Scan in with EPDN=1, EPUP=0, ECTL=0, EUPL=0, ANNUL=0, and ANNUL_ASU=0. This stops new fetching, disables interrupts, and annuls execute packets that have not completed E1.

2. Apply CNTL 351 for one clock cycle.

3. Cycle 3 at time 352: Scan out and save DDATA_I. Scan in state without any modifications.

4. Apply CNTL 353 for one clock cycle.

5. Cycle 4 at time 354: Scan out and save DDATA_I. Scan in state without any modifications.

6. Apply CNTL 355 for one clock cycle.

7. Cycle 5 at time 356: Scan out and save DDATA_I. Scan in state filling DP phase with NOPs and EPDN=1, EPUP=0, ECTL=1, EUPL=0, ANNUL=0, and ANNUL_ASU=0. Setting ECTL sets SUSPEND to disable on-chip and off-chip analysis.

8. Apply CNTL 357 for one clock cycle.

9. Cycle 6 at time 358: Not scanning. Allow NOPs to propagate into pipeline.

10. Apply CNTL 359 for one clock cycle.

11. Cycle 7 at time 360: Scan out with no state to be saved. Scan in with EPDN=0, EPUP=0, ECTL=1, EUPL=0, ANNUL=1, and ANNUL_ASU=1. Clearing EPDN allows the contents of the DP phase (IR) to feed the rest of the pipeline. Fetching and interrupts remain disabled via ECTL.

Figure 29:
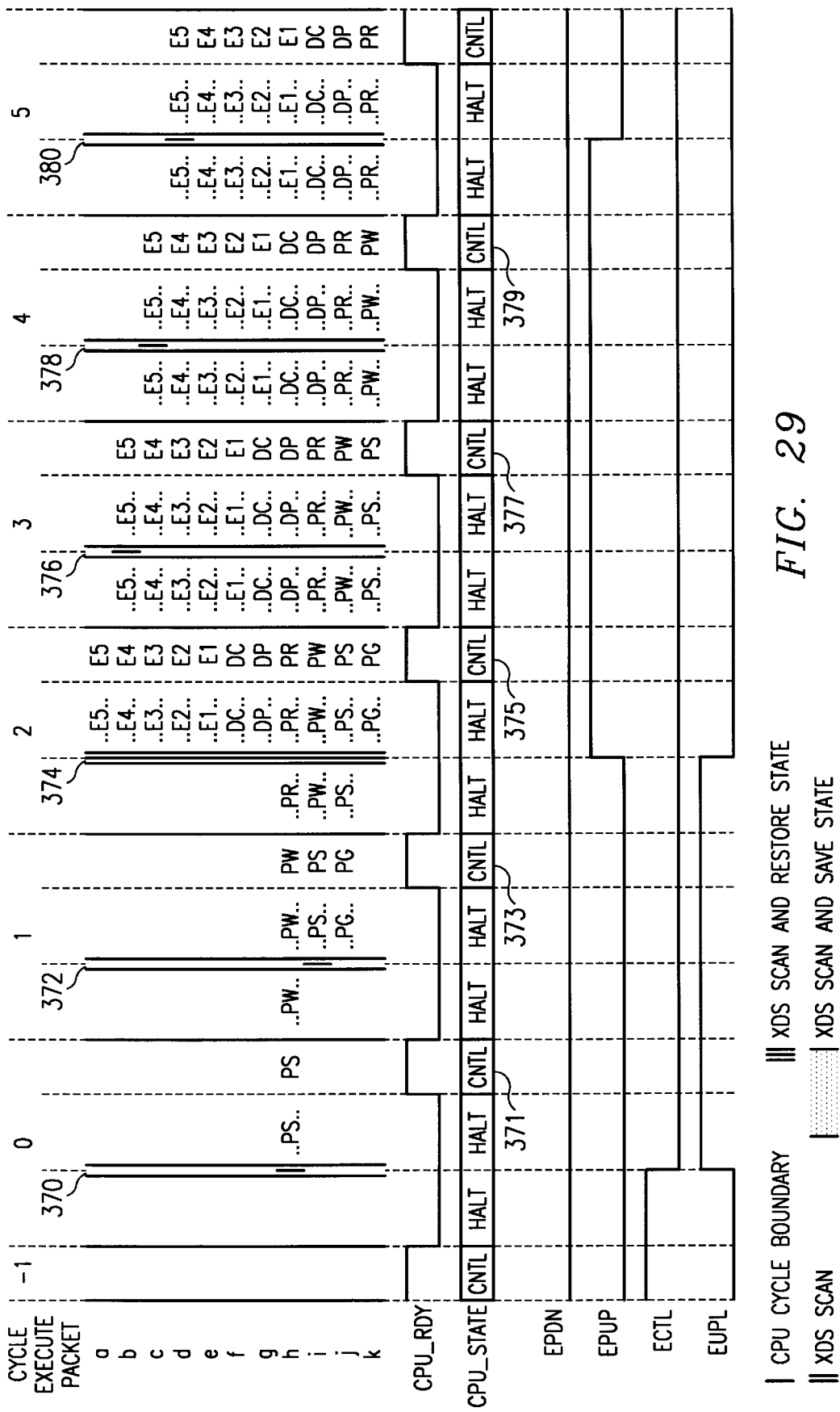
FIG. 29 is a timing diagram showing a pipeline restoration process after emulation for the processor of FIG. 1.

FIG. 29 is a timing diagram that shows how the entire pipeline state is restored in a "pipe-up" procedure by restoring each of the various states that were saved during the pipe-down procedure described above. This Figure assumes that the pipeline had been flushed of all execute packets inserted by the XDS for control and contains NOPs in all phases of the pipeline. This state is achieved manually by the XDS by filling the instruction register with NOPs and allowing other instructions in the pipeline to cycle to completion. After the re-scan, annulled phases are allowed to complete from saved state. All other state follows from the previous cycle. On cycle 2, because data memory strobes are disabled, data memory operations are advantageously not re-executed. Incoming load data latched at the beginning of E5 (end of E4) must be scanned in by the XDS. Thus, advantageously, the entire sequence of pipe-down, emulation, and pipe-up causes no extraneous memory or I/O cycles in data processing system of FIG. 1. The following describes the sequence of operations the XDS performs in controlling a pipeline restart:

1. Cycle 0 at time 370: Scan back in the address of the fetch packet fetched for fetch packet h. This information is available in the scan of cycle 2 during the emulation stop. Set EPDN=0, EPUP=0, ECTL=0, EUPL=1, ANNUL=1, and ANNUL_ASU=1. This re-enables fetching while disabling interrupts.

2. Apply CNTL 371 for one clock cycle.

3. Cycle 1 at time 372: Scan back in the address of the fetch packet fetched for fetch packet i. This information is available in the scan of cycle 2 during the emulation stop.

4. Apply CNTL 373 for one clock cycle.

5. Cycle 2 at time 374: Restore the entire CPU domain state from cycle with the DBS disabled (set to 0). Set EPDN=0, EPUP=1, ECTL=0, EUPL=1, ANNUL=1, and ANNUL_ASU=1. This re-enables fetches while disabling interrupts.

6. Apply CNTL 375 for one clock cycle.

7. Cycle 3 at time 376: Scan out and scan back in DDATA_I from cycle 3 of pipeline stop.

8. Apply CNTL 377 for one clock cycle.

9. Cycle 4 at time 387: Scan out and scan back in DDATA_I from cycle 4 of pipeline stop.

10. Apply CNTL 398 for one clock cycle.

11. Cycle 5 at time 380: Scan out and scan back in with DDATA_I from cycle 5 of pipeline stop. Set EPDN=0, EPUP=0, ECTL=0, and EUPL=0, ANNUL=1, ANNUL_ASU=1. This re-enables interrupts, analysis, and fetching.

A Software Breakpoint (SWBP) is set by replacing and saving the creg/z field in a target instruction with a code of "0001" to indicate a SWBP, as shown in Table 10. This field is decoded during the DC phase of the pipeline. Decoding a "0001" triggers a breakpoint operation and invokes XDS 51 to perform a debug or emulation function by performing pipe-down and pipe-up procedures, as described above. At the completion of the debug or emulation operation, the XDS replaces the SWBP instruction in the pipeline during E1 by returning the associated creg field of the field to its original value. In addition, a SWBP_DEC SRL will be set by an SWBP being decoded. The XDS uses SWBP_DEC (FIG. 20) as status. Upon replacing SWBP in the pipeline with the appropriate creg field, the XDS should clear SWBP_DEC so another SWBP can be decoded. According to an aspect of the present invention, a debug function is performed in response to a software breakpoint instruction and normal pipeline operation is resumed without prefetching the instruction which was converted to a SWPB. Advantageously, no extraneous memory cycles are performed in the data processing system of FIG. 1.

Referring again to FIG. 29, assume the CPU is halted via an emulation stop sequence and that the XDS has extracted all necessary state to be displayed by the debugger. The XDS can single step microprocessor 1 by performing the first 6 steps of the restart sequence and then redoing the entire emulation stop sequence. Note that while single stepping for analysis events to occur the analysis test port must be locked in CNTL or FUNC. Similarly, for interrupts to be detected the megamodule test port must be locked in CNTL or FUNC. In other words for interrupts to be detected that portion of the megamodule must continue running. Also, the CPU will not single step into interrupt service fetch packets. The CPU must be allowed to run for a minimum number of cycles before an interrupt will be serviced.

Events can be suspended for various reason in response to the state of the various test ports 310, 320, and 330. Three conditions suspend analysis events during a halt:

1. During a halt, the PAUS/SDAT/SCTL states of the CPU test port and the CPU_DONE signal force the SUSPEND signal active, disabling future analysis events. When the CPU test port returns to CNTL or FUNC the SUSPEND signal returns to inactive state.

2. In addition, analysis events are prevented from causing halts when the CPU test port is in the FUNC state.

3. The XDS can set the ECTL bit through scan to disable analysis events during emulation control.

Halt is unaffected by an IDLE or a multi-cycle NOP instruction in the pipeline. Upon a pipeline restart the previous state of the IDLE or multi-cycle NOP in the pipeline is restored.

In normal debug and emulation operations, neither the analysis domain nor megamodule domains are stalled; therefore a hand shake signal (such as through CPU_DONE) is not provided for the MTAP to halt the test port 320 or 330. The MTAP simply performs the clock switch, moving through states on the appropriate clock boundaries. If for some reason these domains must be halted, they must be halted only after the CPU domain has been halted.

FIGS. 30A, 30B, 30C and 30D illustrate various registers that are used in the course of emulation and debugging, as described above. These include: the Analysis Control Register (ACR) 390, Analysis Data Register (ADR) 391, Analysis Interrupt Return Pointer (ARP) 392, and Data Streaming Register (STREAM) 393. These various registers have been discussed in the previous sections, and will now be described in more detail. In these Figures, the term "MVC readable" and "MVC writable" refers to whether particular bits in a CPU control register can be read or written by a MVC instruction. All reserved or write only bits are read as "0."

FIG. 30A describes ACR 390, which contains control and status bits for emulation and analysis. The status-bits do not cause a halt or analysis interrupt but simply reflect that the event occurred while events were not suspended. As soon as they occur, the actual events themselves (if enabled) trigger a halt or set AIP to show a pending interrupt. Also, reset only sets the ACR to its reset values if the CPU test port is in the FUNC state. The exception is RSTOCC which always is reset regardless of the CPU test port state. Table 36 describes the function of each ACR bit field.

TABLE 36

ACR Bit Fields

| Name | Function |
|---|---|
| STRAP | STRAP = 0 indicates the presence of an XDS to a monitor program. This is fed by the STRP_DEVM signal from the MTAP.[16] No Storage is required. |
| AFUNC | 1 if the analysis test port is in FUNC state. 0 otherwise. No storage is required. |
| PRI | If PRI = 1 , AINT is the highest priority (non-RESET) interrupt and not maskable via the GIE or NMIE. AIE will disable all non-RESET interrupts. |
| | If PRI = 0, AINT is the lowest priority interrupt and is maskable via GIE or the NMIE. AIE will disable only AINT. |
| AINTSUSP | One of the OR-terms to SUSPEND. An automated write of AINTSUSP by an analysis interrupt has priority over a user write. |
| RSTOCC- | Reset occurred. Set to 0 by a taking a reset interrupt. Can be set by a user write of 1. A write of 0 has no effect. |
| ACRWE | ACR write enable. All other bits in the ACR are only affected by MVC write if ACRWE = 1. Automatically, set to 1 by taking an AINT or a MSGINT. Also can be written as 0 or 1 by the user. |
| MSGSW | A write of one sends a 1 clocks pulse to the MSGSW output on the CPU boundary. This bit has no storage and is read as 0. The pulse is generated in the megamodule domain as it is one clock (not one cycle). |
| MSGFLG | Sets the state of the MSGFLG signal to the MTAP. |
| MSGERR | 1 indicates last CPU read or write of the ADR (via MVC) occurred while an analysis scan was in progress. Set to 0 by a successful read or write. 0 otherwise. |
| CPU_EMUC | Sent to the MTAP to configure the functioning of the EMUO/I pins on the megamodule boundary. |
| EVENT | This field governs what events are generated by the analysis events (EMU0IN, EMU1IN, SEE, PABP, CYC , XAINT, and FPX). In addition, the event field must be set to 10 for an SWI to be recognized. |
| | 00 - analysis event triggering disabled. |
| | 01 - analysis event triggering disabled. User writes to the ACR disabled. |
| | 10 - analysis events enabled to trigger AINT. |
| | 11 - analysis events enabled to trigger an halt. Except for XAINT and CYC which do not trigger a halt nor an interrupt in this case. Halts are only enabled if an XDS is present (STRAP = 0). This also disables user writes to the ACR. |
| SWI_EVT | A value of 1 indicates AIP was set by an SWI. Clear by a write of 0. Unaffected by a write of 1. Not set again until the event occurs again. An automated write has priority over a user write. This bit is not set until AINT has been taken. |
| XAINT_EVT | A value to 1 indicates AIP was set by XAINT. Cleared by a writed of 0. Unaffected by a write of 1. Not set until the event occurs again. An automated write has priority over a user write. EES Fields (See Table 37). |
| EMU0IN EES | EMU0IN Event Enable and Status. Event set by inactive to active transition on EMU0IN input. |
| EMU1IN EES | EMU1IN Event Enable and Status. Event set by inactive to active transition on EMU1IN input. |
| SE EES | SE Event Enable and Status. Event set by inactive to active transition on SEE input. |
| CYC EES | Cycle Event Enable and Status. If enabled, event set on next cycle boundary after the target of a B ARP completes E1. |
| PABP EES | Program Address Breakpoint Event Enable and Status. Event set by program address breakpoint match. |
| FPX EES | Floating-point conflict Event Enable and Status. Event set by any of the floating point resource conflicts described in Chapter 5. Only implemented if the megamodule can encounter these conflicts (i.e. supports double precision floating-point). Otherwise reserved and read as 0. |
| reserved | Read as 0. |

[16]STRP_DEVM (=0) is used instead of EMU_DEVM (=1) to indicate the presence of an emulator so that this bit may be evaluated in normal operation by the user and by any test modes while in them.

TABLE 37

Event Enable and Status (EES) Field Descriptions

| Bit Fields | Bit Field | Read Value |
|---|---|---|
| 0 | Enable | If set to 1 enables analysis event. |
| 1 | Status | 1 if event has occurred. A MVC write of 0 to this bit clears the event. A MVC write of 1 has no effect. The automated write has priority. |

FIG. 30B describes Analysis Data Register (ADR) 391. The top 30 bits of the ADR are used to compare with the program address in pipeline phase DC to generate a program address breakpoint. This register is in the analysis domain and will be used for message passing. A read of this register during an analysis scan will return 0 and set the MSGERR bit in the ACR. A write during analysis scan will have no effect and set the MSGERR bit. Any other read or write will clear the MSGERR bit.

FIG. 30C describes Analysis Interrupt Return Pointer (ARP) 392, which was described in detail earlier with reference to analysis interrupts.

Memory Access Support

The architecture of microprocessor 1 assumes that all memory locations whether in program memory or data memory are writable (if RAM or FLASH is used). The design of Microprocessor 1 obeys this convention to allow XDS-based data and program uploads and downloads as well as monitor replacement of an SWI. In addition, distinct program and data memories may not occupy the same address space. Caches are be writable for SWI and SWBP replacement.

For data downloads and uploads as well as program downloads, the XDS will do the following after an emulation stop sequence:

1. Set ECTL. Scan a fetch packet into the PDATA_I 10a (FIG. 1). For data accesses these consists of 7 serial loads or stores. For program downloads, these consist of 3 MVC/STP pairs followed by a SWBP. The appropriate data and addresses will be scanned into the register files.

2. Let the CPU run free. Eventually, the SWBP will trigger an halt and a subsequent re-scan.

In this manner, the XDS can download/upload 224-bits/scan (7×32-bit stores) of data or download 96-bits/scan (3×32-bit stores) of program. According to an aspect of the present invention, these sequences of debug code instruction are loaded into the multi-word instruction register and executed to perform a debug operation on the processor 1. Advantageously, no extraneous memory operations occur with the data processing system of FIG. 1.

Figure 45:
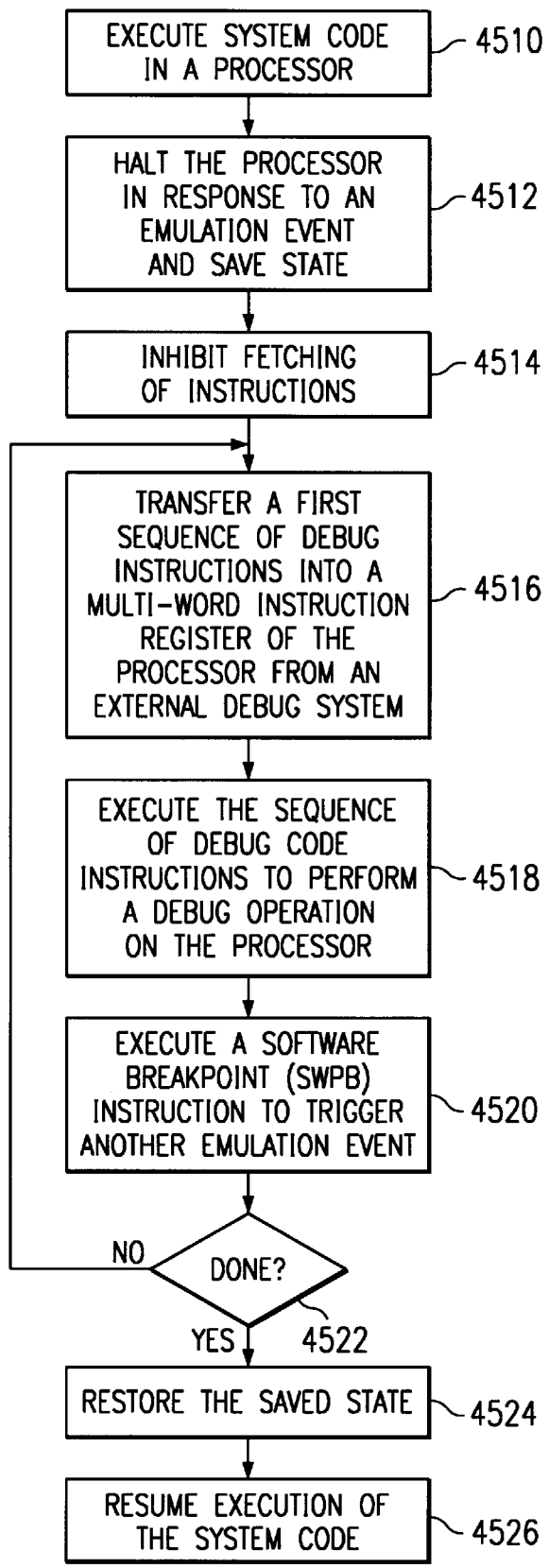

FIG. 45 is a flow chart summarizing a process for accessing internal storage nodes of the processor 1 during emulation by scanning in a sequence of instructions to be executed by processor 1, as discussed above. In step 4510, system code is fetched into the multi-word instruction register and executed in an instruction execution pipeline of processor 1 in a normal operational manner. In step 4512, the normal operation of the processor is halted in response to an emulation event, as discussed with respect to FIG. 25. The complete state of the pipeline is saved as described with respect to FIG. 28. In step 4514 instruction fetching is inhibited by setting the ECTL bit. In step 4516, a sequence of debug instructions is scanned into the multi-word instruction register from external test system 51. In step 4518, the processor is let to run free to execute the sequence of debug instructions in the processor's multi-word instruction register to perform a debug operation on the processor, such as reading or storing data from memory, or accessing an internal register. One of the instructions in the sequence is a software breakpoint (SWBP) instruction that is executed in step 4520. This triggers another emulation event. In response to this event in step 4522, test system 51 determines if another debug operation is to be done. If so, then steps 4516, 4518 and 4520 are repeated. If the debug operations are done, test system 51 restores the saved state of the instruction execution pipeline in step 4524. In step 4526, fetching is re-enabled by resetting the ECTL bit and execution of the system code is resumed.

For program uploads the emulator performs the following emulation pipeline stop sequence:

1. Set ECTL and EUPL. Scan a value into the PFC and the PADDR.

2. Apply HALT/CNTL three times to move through the PS, PW, and PR phases.

3. Scan the PDATA_I for the uploaded program.

4. Afterwards, the XDS may apply a single CNTLIHALT each cycle. Thus, the emulator may perform 256-bits/scan.

While the previous procedure is effective for uploading or downloading small amounts of data without disturbing the data processing system environment, there is a significant overhead time due to the amount of scanning that is required. A procedure referred to as "data streaming" provides the following data transfers at the full scan rate: program memory download (from the XDS), data memory download (from the XDS), and data memory upload (to the XDS).

Figure 30D:
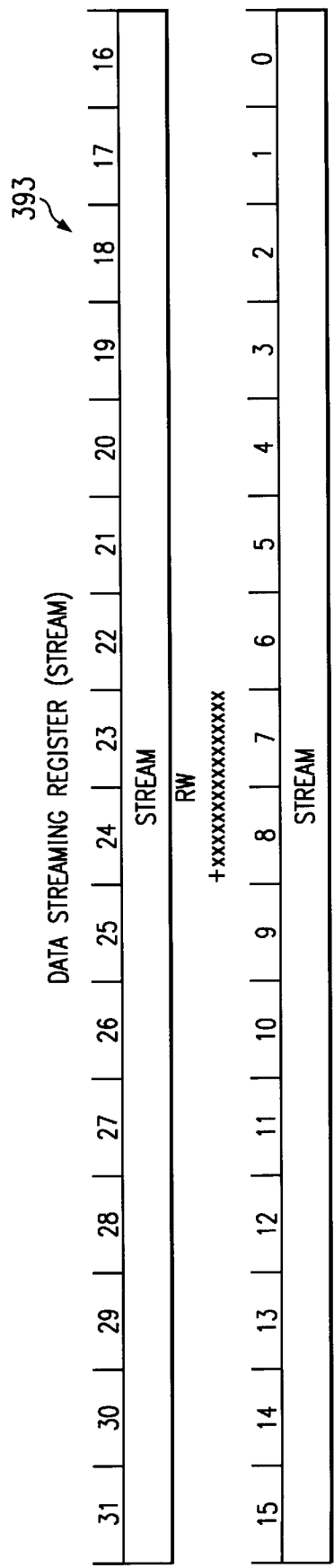
FIG. 30D illustrates a data streaming register for the processor of FIG. 1.

FIG. 30D illustrates Data Streaming Register 393 which is used to support data streaming. This CPU control register connects the CPU register file to the data streaming bus from the MTAP (STRM_I/O). This register cannot be used for storage as what is written will not be read back. The data streaming process will now be described in more detail with reference to Tables 38–42.

To prevent fetches, the XDS sets the ECTL bit to disable fetching. The XDS loads the appropriate fetch packet into the PDATA_I. This fetch packet performs the necessary data movement between the data streaming busses (STRM_ST and STRM_LD) as accessed through the STREAM CPU control register. Upon the scanning of a new data word (every 32nd bit) the CPU is stepped one cycle. If CPU_DONE is not received before the cycle next step, the MTAP latches this error condition. The XDS can then detect a streaming error occurred upon completion of the streaming process. Details of managing data movement and error detection within the MTAP will be discussed later. Advantageously, since instruction fetching is inhibited, the same fetch packet will be executed for the duration of the streaming process.

Table 38 and Table 39 show the fetch packet to control data streaming data downloads on data ports 2 and 1, respectively. Examples for both data ports are shown because, microprocessor 10 can make the two ports write to physically disconnected memory spaces. In both cases, an MVC instruction with the STREAM register as an operand is used to move the streaming data to the B and A register files. For data port 2, the XDS must scan the initial data value for the first STW into the register file (into B1). For data port 1 downloads, STREAM must first be moved to a B register and then to an A register because MVC cannot directly load an A register. In this case, the XDS must both scan in the initial two values (A1 and B1) into the register file. Note that microprocessor 10 advantageously can execute various combinations of instructions in parallel, such as MVC and STW in Table 38 and Table 39 to minimize overhead time.

TABLE 38

Fetch Packet for Data Streaming Data Download (Data Port 2)

|   | MVC | .S2 | STREAM, | B1 |
|---|-----|-----|---------|-----|
| ‖ | STW | .D2 | B1,     | *B0++ |
|   | MVC | .S2 | STREAM, | B1 |
| ‖ | STW | .D2 | B1,     | *B0++ |
|   | MVC | .S2 | STREAM, | B1 |
| ‖ | STW | .D2 | B1,     | *B0++ |
|   | MVC | .S2 | STREAM, | B1 |
| ‖ | STW | .D2 | B1,     | *B0++ |

TABLE 39

Fetch Packet for Data Streaming Data Download (Data Port 1)

|   | MVC | .S2  | STREAM, | B1 |
|---|-----|------|---------|-----|
| ‖ | MVC | .L1X | B1,     | A1 |
| ‖ | STW | .D1  | A1,     | *A0++ |
| ‖ | NOP |      |         |     |
|   | MVC | .S2  | STREAM, | B1 |
| ‖ | MVC | .L1X | B1,     | A1 |
| ‖ | STW | .D1  | A1,     | *A0++ |
| ‖ | NOP |      |         |     |

Table 40 and Table 41 show fetch packets to control data streaming uploads on data ports 2 and 1, respectively. Examples for both data ports are shown because, microprocessor 1 can make the two ports write to physically disconnected memory spaces. In both cases an MVC instruction with the STREAM register as an operand is used to move the streaming data from the B and A register files. Also, the XDS must scan the final data value from the last LDW from the register file (from B1) after it allows manually clocks the last loads to complete after filling PDATA_I with NOPs.

TABLE 40

Fetch Packet for Data Streaming Data Uploads (Data Port 2)

|   | MVC | .S2 | B1,     | STREAM |
|---|-----|-----|---------|--------|
| ‖ | LDW | .D2 | *B0++,  | B1 |
|   | MVC | .S2 | B1,     | STREAM |
| ‖ | LDW | .D2 | *B0++,  | B1 |
|   | MVC | .S2 | B1,     | STREAM |
| ‖ | LDW | .D2 | *B0++,  | B1 |
|   | MVC | .S2 | B1,     | STREAM |
| ‖ | LDW | .D2 | *B0++,  | B1 |

TABLE 41

Fetch Packet for Data Streaming Data Uploads (Data Port 1)

|   | MVC | .S2X | A1,    | STREAM |
|---|-----|------|--------|--------|
| ‖ | LDW | .D1  | *A0++, | A1 |
|   | MVC | .S2X | A1,    | STREAM |
| ‖ | LDW | .D1  | *A0++, | A1 |
|   | MVC | .S2X | A1,    | STREAM |
| ‖ | LDW | .D1  | *A0++, | A1 |
|   | MVC | .S2X | A1,    | STREAM |
| ‖ | LDW | .D1  | *A0++, | A1 |

Table 42 shows the fetch packet to control data streaming program downloads. Like data downloads, the XDS must load the first value to be stored into the register file (into B0). However, unlike data streaming for program accesses, no instruction is available to move STREAM directly to the register to be stored, which is a program-data output register (PDATA_O) located in program fetch circuitry 10a. Thus, the STRM_SEL signal must be used to update PDATA_O to the value of STREAM (via the STRM I/O bus) every cycle.

TABLE 42

Fetch Packet for Data Streaming Program Downloads

|   | ADDAW | .D2 | B0,  | 1, | B0 |
|---|-------|-----|------|----|-----|
| ‖ | STP   | .S2 | *B0  |    |     |
|   | ADDAW | .D2 | B0,  | 1, | B0 |
| ‖ | STP   | .S2 | *B0  |    |     |
|   | ADDAW | .D2 | B0,  | 1, | B0 |
| ‖ | STP   | .S2 | *B0  |    |     |
|   | ADDAW | .D2 | B0,  | 1, | B0 |
| ‖ | STP   | .S2 | *B0  |    |     |

Caching Support

There are independent controls for data and program caches in the control status register (CSR) that allow:

1. Caches Freeze: Cached values are read. Reads do not update the cache.

2. Caches Flush: All cached data is invalidated. Updates do not occur.

3. Cache Bypass: Values are read from memory. Reads do not update the cache.

The following rules apply to XDS control of memory accesses with respect to caches.

1. On data or program COFF downloads, caches are flushed and then resumed to their previous control states.

2. For data or program COFF uploads, caches is frozen and returned to their previous control states.

3. For data or program memory reads in a CPU memory view, caches are frozen and the resumed to their previous control states.

4. For data or program memory reads in a physical memory view, caches are bypassed and returned to their previous control states.

5. For data writes, no change is made to the cache control bits.

6. For program writes, the cache is flushed and then returned to its previous control states.

Development Tools Notes

In the XDS and simulator, the programmer's model for debugging is as follows:

1. All information will be displayed on a cycle-by-cycle basis (as opposed to a clock by clock basis). Thus, memory stalls are not visible to the user.

2. The debugger will highlight the next execute packet to be executed in the disassembly.

3. All registers results written by the end of the last cycle will be displayed:
  A) The results of the execute packet in E1 (single-cycle integer instructions, address modification) in the previous cycle.
  B) Similarly, the results of the instruction in E2 from two cycles ago (integer multiplies).
  C) The results of the instruction in E4 (floating-point instructions) from four cycles ago.
  D) The results of the instruction in E5 (loads) from five cycles ago.

In monitor-based debuggers, the programmer must employ single assignment. Also, all instructions will appear to execute in order.

For example, in FIG. 31, if execute packet (f) is highlighted, all CPU state written at or before the double line 400 will be displayed. Thus, for example, if execute packet (e) executed a multiply, its results will not be displayed. Rather, the multiply's destination register will contain its prior contents from cycle 11.

Unlike CPU state, memory state will be allowed to advance to completion of stores. In FIG. 31, the stores in execute packets c-e will complete. Thus, the memory display (updated after all scans are complete) appears to be 3 cycles ahead of the CPU. Although this may appear inconsistent with loads having 4 delay slots, the programmer must view that the value of a load value is the one presented in the display immediately before stepping through a load instruction. As all accesses occur in order at the CPU boundary, the memory display will be self-consistent.

Real-Time Debug: Monitor Mode: Real-time debug provides user visibility while microprocessor 1 is running user code. Variables can be displayed and modified both from the assembly and the high-level language (HLL) viewpoints. This real-time debug by itself is independent of emulation logic. Normally, the debug monitor is either the background task or a very low-level interrupt service routine running in the presence of real-time tasks driven by higher-priority interrupts. The monitor communicates to a host on which the debugger is resident. The debugger at the lowest level can request memory and register reads and modifies. Communication can occur through peripherals such as serial ports, through shared memory, or through dedicated message-passing hardware (such as the ADR). Considerations for developing monitor code are:

Codesize: The monitor codesize must be minimized.

Performance: The monitor code must run fast enough to provide adequate user accessibility.

Single Stepiping: The debugger performs two types of stepping:

1. Stepping statements in high-level language.
2. Stepping execute packets on a cycle-by-cycle basis.

Because pipeline visibility is critical to programming the CPU, the debugger does not need to support instruction stepping (stepping an instruction all the way from E1 until E5). Instead, the step mechanism will only allow all state to proceed a single pipeline phase.

After an emulation stop, execute packet stepping will be performed by a stop pipeline scan sequence (FIG. 28) followed by a partial restart (FIG. 29). Specifically, the restart will be allowed to proceed one cycle. The emulation stop sequence will then reoccur in its entirety.

In general, execute packets or groups of execute packets will not correspond on a one-to-one basis with high-level language (HLL) statements. The following approaches are available to provide HLL statement-by-statement visibility:

1) The HLL compiler can generate code that generates side-effects that complete in order. However, this drastically inhibits achieving high-performance code. Also, this restriction masks problems which only occur when out-of-order execution is allowed.

2) The XDS may perform multiple stops and scans so that the results of a particular HLL statement may be isolated. New methods of embedding debug information in the object must be developed to facilitate this methodology. Additionally, in a mixed-mode display (both assembly and HLL) a method must be developed to show what assembly instructions have completed what phase of the pipeline as seen in the display. A disadvantage of this method is that the user may not be able to request new memory locations or symbolic values for display. Such information may have already been lost because the part may have run beyond when their values are valid. Both solutions are practicable given the current emulation description in this chapter.

Software replacement of a SWI instruction in program memory with the appropriate instruction is done by the user's monitor program. If interrupts are enabled and SWI is the highest priority pending interrupt it will be taken when the SWI is in DC. If there are higher priority interrupts, SWI be re-fetched upon return from interrupt and thus re-encountered. SWI recognition will be postponed by being in the delay slots of a taken branch or if AINT is not enabled.

Megamodule Test Access Port (MTAP)

The MTPA will now be described in detail. Aspects of the present invention relate to improvements on the structure of the IEEE 1149.1-1990 *Standard Test Access Port and Boundary Scan Architecture*, which is incorporated herein by reference. Terms and concepts relating to IEEE 1149.1 which are used herein are explained fully in this IEEE standard. Likewise, aspects of the present invention also relate to improvements on the tructure of Texas Instruments' Modular Port Scan Design (MPSD) as isclosed in U.S. Pat. No. 4,860,290 and incorporated herein by reference. In articular, the operation of Shift register latches (SRLs), which are distributed throughout microprocessor 1 like a string of beads on a serial scan path respective to each module provide access to all "important" registers, is described in incorporated reference U.S. Pat. No. 4,860,290.

Referring again to FIG. 15, Megamodule Test Access Port (MTAP) 305 supports a subset of the IEEE 1149.1 Standard Test Access Port features. Since Megamodule 300's MTAP does not drive the pins of microprocessor 1 directly there is no requirement to support boundary scan. MTAP 305 does provide an 1149.1 compliant JTAG State Machine and serial scan communications between a remote host 51's scan controller and the Megamodule's Domain Test Ports (DTPs) 310, 320 and 330. In addition to the JTAG interface, MTAP 305 provides test support, automated execution control of the DTPs, a data stream control mechanism that provides a significant performance advantage, multiprocessor emulation support, and performance analysis; as discussed in the preceding paragraphs. MTAP 305's test feature set supports the application of production Automatic Test Pattern Generation (ATPG) patterns. Functional test patterns can be loaded, executed and debugged using emulation capabilities.

Figure 32:
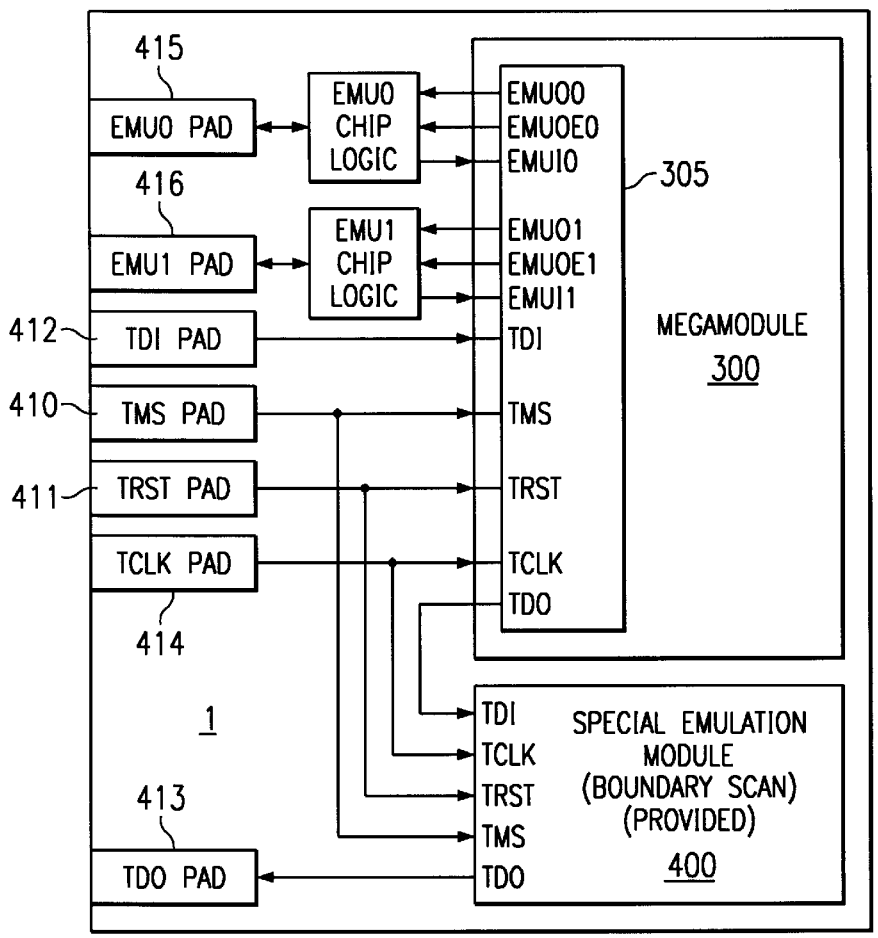
FIG. 32 is a block diagram illustrating pin connections to a megamodule in the processor of FIG. 1.

FIG. 32 is a block diagram illustrating signal connections from megamodule 300 to pins 410–416 on microprocessor 1. Also referring to FIG. 15, as discussed earlier and summarized here, Megamodule 300's architecture is split between MTAP 305 and four domains; CPU Core 10, CPU Analysis 321, Megamodule 331 (contains all megamodule features outside the CPU core) and Special Emulation (SE) 400. SE module 400 is external to Megamodule 300. Each domain provides execution control and access to the domain scan paths through a Domain Test Port (DTP). The CPU's DTP 310 provides stop mode and real time emulation features that control program execution (start, stop, software breakpoint) and visibility to the programmer's model (registers and memory). CPU Analysis Domain 321 provides core analysis features that in the case of the microprocessor 1 includes a hardware breakpoint and real time emulation scan communication support. SE Analysis Domain 400 provides advance emulation analysis features. These features include magnitude comparators for hardware breakpoints, program bus address breakpoints, data bus address and data breakpoints, event counters, program discontinuity trace, and analysis state sequencer. Megamodule Domain 331 only provides execution control and scan access of the features within the Megamodule that are outside of the CPU, such as the test PSA registers in test circuitry 52.

Real time emulation support provides execution control and visibility of the programmers model while the processor continues to service interrupts and multiplex tasks. The Real Time support is also accessible through an applications-based debugger and includes the use of the embedded analysis capability without connecting to a remote test/emulation controller.

Referring still to FIG. 32, Megamodule Test Access Port (MTAP) 305 is IEEE 1149.1 compliant in that it supports the standard JTAG interface and JTAG State Machine feature set. MTAP 305 is not 1149.1 compliant in that it does not support boundary scan or any public STAG commands other than BYPASS. JTAG based emulation and test requirements for microprocessor 1 are provided by utilizing provisions within IEEE 1149.1 that allow for application specific JTAG commands and data path extensions. References herein to the required JTAG capability are referred to as "public capability," while extensions are referred to as "private capability."

The support of emulation and test features in the Megamodule (MTAP) 300 requires connection to microprocessor 1's standard JTAG five pin interface (TMS 410, TRST 411, TDI 412, TDO 413, TCLK 414) complemented by two additional bidirectional emulation interrupt pins (EMU1 415, EMUO 416). There are multiple JTAG/MTAP configurations that will be discussed in the following paragraphs. The EMUO and EMU1 pins can be configured to facilitate multiprocessor stop events and performance analysis features.

The EMU0/1 pins are functional pins and as such conform to all Megamodule boundary cell rules.

The following constructs have been added within the JTAG framework to support communication and control between the JTAG pins of the device, MTAP 305, and multiple Domain Test Ports.

Data Path Extensions—extended private JTAG IR commands provide MTAP data scan selection of Domain Status, EMU1 and EMUO configuration. Emulation Control. Domain scan path select, and Domain lock information.

Command Generation—extended private JTAG IR commands provide test and emulation commands that are initiated through the JTAG IDLE state.

Instruction Register Capture—JTAG instruction register capture of miscellaneous emulation state, domain status, and test information has been added to facilitate emulation software operation and MTAP testability.

MTAP 305 JTAG signals are as follows:

TMS: Test Mode Select. This signal controls the transition of the JTAG state diagram . The various states traversed cause the instruction and data paths to be scanned. and JTAG instructions to be executed.

TCK: Test Clock. This signal provides a clock for JTAG logic and state machines. The JTAG interface is clocked at a frequency supplied external to the megamodule and allows the megamodule to be compatible with other JTAG devices, controllers and test equipment designed for different clock rates. In this specification this clock input is referred to as TCLK. The normal system clock input is referred to as UCLK (functional clock).

TDI: Test Data Input. This signal provides input data for all JTAG instruction and data scans of the megamodule.

TDO: Test Data Output. This signal provides output data from all JTAG instruction and data scans of the megamodule.

TRST: Test Reset. This signal resets the JTAG module and is provided to assure the test access port (TAP) is rapidly initialized upon power up.

Relationships between these signals are defined in the IEEE 1149.1 specification, which has been incorporated herein.

MTAP 305 EMU signals are as follows:

EMUI [1:0]: EMU Input. The analysis domain allows the detection of a logic zero on EMUIn to be used as an event. Since EMUI can be asynchronous and any pulse width. EMUI must be presented to a pulse catcher and a synchronizer to assure a single clock synchronous event is sent to the CPU domain (EMUI signals) for event processing. The pulse catcher is self clearing by the synchronized event pulse.

EMUO[1:0]: EMU Output. This signal is utilized to output events selected through the EMUC bits of the ECR (in emulation and test modes) or the CPU_EMUC bits of the ACR (in strap mode). The EMUO[1:0] signals from MTAP 305 must be active for at least 5 Nsec (Test Bus Controller requirement).

EMUOEN[1:0]: EMU Output Enable. This signal provides an enable for the EMU0 signal's external tri-state buffer utilized to drive the EMU pin pad. The operation mode of this signal. shared or dedicated. is selected through the EMUC bits of the ECR (in emulation and test modes) or the CPU_EMUC bits of the ACR (in strap mode). In shared mode this signal is only enabled when the event is active, leaving the output buffer in the tri-state mode when an event is not enabled. When disabled in shared mode the EMU pin pad state can be driven into the EMUI driver from an external event. In dedicated mode this signal is always active, which forces the EMU pin pad to the EMUO signal level. Examples of using this signal external to the Megamodule will be discussed later.

JTAG Opcode Utilization: JTAG opcode space 0x00–0x 1F is reserved for JTAG specific use. The scan paths and commands associated with these opcodes are defined in the IEEE 1149.1 specification. This opcode space is currently only partially defined with all undefined opcodes in this group being reserved for future use. References herein refers to any opcode in this group as a public opcode.

According to an aspect of the present invention, a portion of the undefined JTAG opcode space from 0x20–0x2F is reserved for emulation specific use. These opcodes are referred to as private opcodes. All undefined opcodes within this group are reserved for future emulation use.

Opcodes within the 0x20–0x2F range are defined to select data scan paths and as emulation and test commands. An opcode is utilized as a data scan path select when the JTAG state machine is in the JTAG SHIFT_DR state (shift the selected data register). The same opcode is utilized as a command when the JTAG state machine is in the JTAG IDLE state. The JTAG opcodes are also utilized to directly apply control codes to a DTP in a test mode that maps the JTAG states to DTP control states. Each of these three uses of the opcodes are decoupled from the others. This document discusses them independently.

Figure 33:
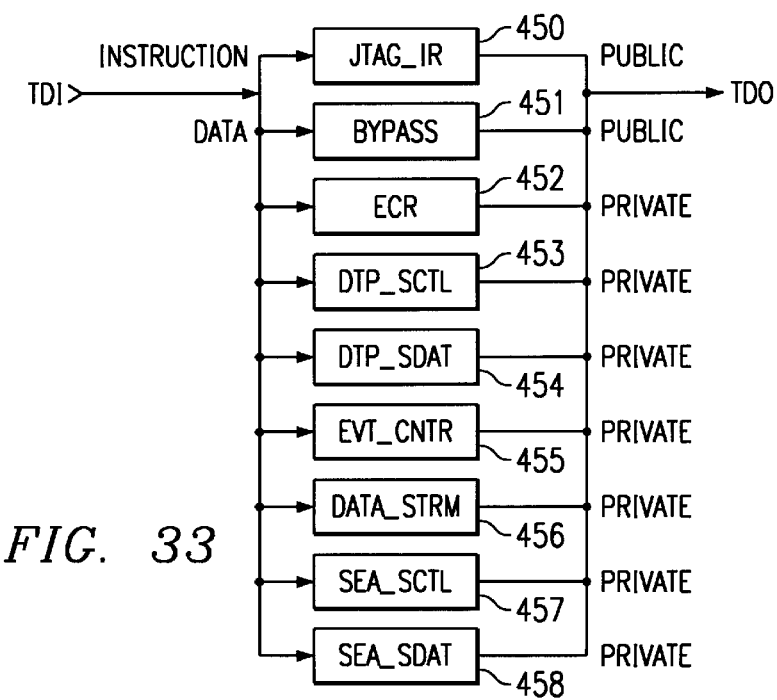
FIG. 33 is a block diagram illustrating JTAG instruction and data register paths for the processor of FIG. 1.

FIG. 33 is a block diagram of the MTAP scan path organization. Emulation/test scan paths are provided in addition to the IR and Bypass paths mandated by the JTAG specification. Note that MTAP 305 does not support a boundary scan path (which makes MTAP 305 non-JTAG compliant). The emulation/test paths are scanned by traversing the JTAG state machine to the SHIFT-DA state, preceded by an SHIFT-IR scan to select the scan path. More than one opcode may address the same public or private scan paths.

The public and private scan paths are briefly described in Table 43.

TABLE 43

Public and Private Scan Paths

| | |
|---|---|
| JTAG_IR | JTAG Instructions Register. The instructor register opcodes select data scan paths or specify commands. |
| BYPASS | Data Bypass Register. This one bit register is used to provided a default scan path when an explicit data path is NOT selected by a JTAG IR opcode. |
| ECR | Emulation Control Register. This register is utilized to provide megamodule clock configuration selection. megamodule mode (emulation or test) selection, and programmable control of the DTPs. |
| DTP_SCTL | DTP Scan Control Register. This register is used to hold the DTPs Module Scan Enable bits (MSENB). A MSENB bit exists for every DTP data module. A MSENB bit set to a one enables the associated DTP data module to be added to the DTP_DATA scan path when the module's DTP is unlocked and the DTP_DATA path is scanned (SHIFT-DR). |
| DTP_SDAT | DTP Scan Data. This scan path provides access to the scan modules of all DTPs. This path contains a module bypass bit for every scan module within each DTP. DTP scan modules are enabled on to the DTP_SDAT scan path after their bypass bit if the module's DTP is unlocked and the modules MSENB bit is set. In other words the length of this path changes dependent on the number of MSENB bits set in the currently unlocked domains. One to all DTP scan modules may be added simultaneously provided their Domain is unlocked and their MSENB bits are set in the DTP Scan Control Register. Before attempting a scan of the DTP_SDAT path. MTAP 305 must be used to switch the clocks from UCLK to TCLK for all Domains in which DTP modules are to be scanned. Refer to section 10.2.6 for special scan considerations related to this path. |
| EVT_CNTR | Event Counter. This scan path contains all MTAP 305's Counter SRLs |
| DATA_STRM | Data Stream. This scan path supports data stream scan operations. |
| SEA_SCTL | SE Analysis Scan Control Register. This register is used to hold the SE Analysis DTP's Module Scan Enable bits (MSENB). The SE's MSENB register is identical to the megamodule DTP's MSENB register. |
| SEA_SDAT | SE Analysis Scan Data Register. This scan path provides access to the scan modules of the SE Analysis DTP. The SE's DTP support is identical to the megamodule DTPs. |

JTAG Data Path Control

Still referring to FIG. 33, scan data is shifted through a selected data shift register during JTAG SHIFT_DR state. The data shift register shifts from MSB to LSB with the LSB of the shift register being output on TDO during the first SHIFT_DR state. Data shifted into the data shift register from TDI may be transferred into a parallel holding register at the end of the shift sequence if a static value of the transferred data bit is required. The parallel holding register is called a shadow register or a shadow bit for a holding register length of one. MTAP 305 implementation uses a mix of shadowed bits and shift register bits to interface to processor emulation functions. When shift register bits are used directly, the shifting of the data shift register has been made a don't care in the bit's end use.

The data register group of JTAG states is entered when the SELECT_DR state moves to CAPTURE_DR, and ends when the execution of the UPDATE_DR state is complete. This group of states is assigned to a specific data path that is selected by the opcode held in the JTAG instruction register while scan data register state group is traversed. This state group contains three states with path specific importance. These states, CAPTURE_DR SHIFT_DR and UPDATE_DR, may be combined with the opcode contained in the JTAG instruction register to give path specific directives to manage scan data.

The CAPTURE_DR state may selectively load information into the data shift register at the beginning of the shift sequence. This information is then visible at the chip's TDO pin as a path specific data shift register is advanced by the SHIFT_DR state. The UPDATE_DR state is used to transfer data shifted into the data shift register to the appropriate parallel data register denoted by the JTAG IR opcode.

Most MTAP private data paths do not require the CAPTURE_DR function to be implemented for every data path bit position. In some cases an entire data path does not require the CAPTURE_DR function to be implemented. This is especially true of DTP data scan paths. Some MTAP private data paths share a data shift register. This implementation results in a single data shift register whose data is selectively transferred to different shadow registers or bits by a qualified UPDATE_DR signal. This approach is utilized within the DTPs to utilize a single physical shift register that supports both the DTP_SCTL and DTP_SDAT scan paths. This shared approach also allows the CAPTURE_DR state function for the paths to be merged. All physical implementation options discussed above DO NOT alter the data path configuration or operation as it is viewed by software controlling the paths.

When the JTAG TAP transitions through the SELECT_DR state the data scan path selected and registers captured and updated are dependent on the command in the JTAG IR. IR commands that direct data to the DTPs, other than the DTP data scan commands, will require an update and in some cases a capture signal (based on JTAG TAP CAPTURE_DR and UPDATE_DR states). The DTP_SDAT and DTP SCTL scan paths share a common data shift register through the DTPs. In the case of the DTP SCTL path the path select signal combined with the CAPTURE_DR state causes the common shift register to be loaded from the MSENB shadow bits. After a scan is completed (SHIFT-DR), the UPDATE_DR state causes the new value in the common shift register to be transferred to the unique MSENB shadow registers. In the case of the DTP_SDAT path the DTP's common shift register is utilized as a bypass bit. All other scan paths are directly scanned (not scanned through the DTPs). Table 44 details the requirements for each scan path.

TABLE 44

JTAG DATA PATH Details

| IR | JTAG SCAN CHAIN | DR CAPTURE, UPDATE, SHIFT Path Select | Path Description |
|---|---|---|---|
| SCTL_HALT | DTP_SCTL | SCTL_SEL | DTP MODULE SCAN ENABLE |
| SCTL_CNTL | DTP_SCTL | SCTL_SEL | DTP MODULE SCAN ENABLE |
| SDAT_HALT | DTP_SDAT | SDAT_SEL | DTP MODULE DATA SCAN |
| SDAT_CNTL | DTP_SDAT | SDAT_SEL | DTP MODULE DATA SCAN |
| SECR | ECR | SECR_SEL | DIRECT ECT register |
| SEVT_CNTR | EVT_CNTR | SCTR_SEL | DIRECT EVENT COUNTER |
| SDAT_STRM | DATA_STRM | STRM_SEL | DIRECT MEGAMODULE EDDATA2 |
| SEA_CNTL | SEA_SCTL | SECT_SEL | SE DTP MODULE SCAN ENABLE |
| SEA_DATA | SEA_SDAT | SEDT_SEL | SE DTP DATA SCAN |

The select signals, SCTL_SEL, SECR_SEL, SCTR_SEL, STRM_SEL, and SECT_SEL are mutually exclusive and are driven inactive by the UPDATE_IR TAP state.

Still referring to FIG. 33, MTAP 305's JTAG instruction register (IR) 450 is eight bits in length with all bits used in instruction decode. The decoded instructions are utilized to select scan paths or execute commands. Access to the IR is provided by a group of JTAG states. These states are entered when the SELECT_IR state transitions to CAPTURE_IR, and exited when the UPDATE_IR state is exited. When the JTAG TAP state machine transitions through the SELECT_IR state, the IR register is connected to the JTAG data scan path. The CAPTURE_IR state loads information into the instruction shift register at the beginning of the shift sequence. The data captured is dependent on the state of the Status Select (STSL) bits in the emulation control register (ECR) (see FIG. 36). This information is then visible at the chip's TDO pin as the instruction shift register is advanced through the SHIFT_IR state. When the SHIFT_IR state is entered, the DPC (Data Path Controller) enables the scan path to shift on every TCLK. The instruction shift register is shifted from MSB to LSB with the LSB capture information register being output on TDO on the first SHIFT_IR state. This mechanism is used to load and export emulation and test status. The UPDATE_IR state is used to transfer data shifted into the chip (contents of the instruction shift register) to the shadow bits of the IR.

FIG. 34A illustrates the JTAG IR with Strap Status selected. Strap status is the default status state which is selected by TRST- or the TLR JTAG state. The two LSBs are loaded with a fixed pattern (0,1) per section 6.1.1 of the IEEE 1149.1 Specification. This fixed pattern is derived from MTAP state flags that are forced to the correct pattern during Strap mode.

FIG. 34B illustrates the JTAG IR with Stop Status selected. The status bits illustrated here are generally utilized during stop mode emulation. All status bits are sourced from the MTAP except ABP_DET and SWBP_DEC (CPU domain). MTAP 305 status bits are defined in Table 45. The stop mode emulation status bits are defined in Table 68.

FIG. 34C illustrates the JTAG IR with Real Time Status selected. The status bits illustrated here are generally utilized during real time mode emulation. All status bits are sourced from MTAP 305 except for MSGFLG and MSGSW (CPU domain). MTAP 305 status bits are defined in Table 44. The real time mode CPU domain emulation status bits are defined in Table 69.

FIG. 34D illustrates the JTAG IR with Emulation Error Status selected. The status bits illustrated here are generally utilized during emulation error processing for both stop and real time modes. All status bits are sourced from MTAP 305 except MINT_EN and AINT_EN (CPU domain). MTAP 305 status bits are defined in Table 44. The MINT_EN and MINT_EN CPU domain emulation error status bits are defined in Table 69.

Table 45 defines status bits that are generated within MTAP 305 module. See Tables 68–71 for the definition of status bits sourced outside of MTAP 305.

TABLE 45

MTAP Status

| | |
|---|---|
| STRAP | Strap Device Mode. This bit is set from the ECR's device mode bits. When set it indicates the megamodule is in strap mode. This bit will be used to determine if the mode is switched unexpectedly (from emulation or test to strap). |
| TCLK_SEL | Test Clock Selected. This bit, when one, indicates the test clock (TCLK) has been switched to by all unlocked domains. When TCLK is enabled the unlocked Domains are ready to perform data scans at the TLCK rate (scan clock switching is described later) and/or are running their functional clock at the TCLK rate. The state of the TCLK_SEL status bit is latched and not modified until the clock switch is complete (SWINPROG inactive). |
| IRBUSY | Instruction Register Busy. This bit indicates the JTAG interface is busy with another operation (see section 10.2.4 for more information). Since the JTAG IR is shadowed the IR can be scanned (SHIFT_IR) but cannot be updated (UPDATE_IR) until the IRBUSY bit is clear. This bit is in the logic zero state after the JTAG TLR state and will remain a zero until a MTAP command is issued. |
| SYNC_ERR | Sync Scan Error. This bit indicates that a data scan was attempted when MTAP 305 module was in a state that the scan could not be started. The scan is aborted and clocks not switched. This bit blocks both scan and CSM stimulus. This status bit is cleared by locking the ECR |
| DONE_TGLE | Done Toggle. This status bit indicates CPU_DONE has gone from inactive to active since the last IR Stop Status scan. The rising edge of the CPU_DONE signal is captured by the DONE_TGLE SRL. If Stop Status is selected the DONE_TGLE signal is loaded into the IR shift register during the CAPTURE_IR JTAG state and cleared. |

TABLE 45-continued

MTAP Status

| | |
|---|---|
| RST_TGLE | Reset Toggle. This status bit indicates RST_TKN has gone from inactive to active since the last IR Error Status scan. The rising edge of the RST_TKN signal is captured by the RST_TGLE SRL. If Error Status is selected the RST_TGLE signal is loaded into the IR shift register during the CAPTURE_IR JTAG state and the RST_TGLE SRL is cleared. |
| MINT_TGLE | Message Interrupt Toggle. This status bit indicates MINT_TKN has gone from inactive to active since the last IR Real Time Status scan. The rising edge of the MINT_TKN signal is captured by the MINT_TGLE SRL. If Real Time Status is selected the MINT_TGLE signal is loaded into the IR shift register during the CAPTURE_IR JTAG state and the MINT_TGLE SRL is cleared. |
| AINT_TGLE | Analysis Interrupt Toggle. This status bit indicates AINT_TKN has gone from inactive to active since the last IR Real Time Status scan. The rising edge of the AINT_TKN signal is captured by the AINT_TGLE SRL. If Real Time Status is selected the AINT_TGLE signal is loaded into the IR shift register during the CAPTURE_IR JTAG state and the AINT_TGLE SRL is cleared. |
| MSGSW_TGLE | Message Switch Toggle. This status bit indicates MSGSW has gone from inactive to active since the last IR Real Time Status scan. The rising edge of the MSGSE signal is captured by the MSGSW_TGLE SRL. If Real Time Status is selected the MSGSW_TGLE signal is loaded into the IR shift register during the CAPTURE_IR JTAG state and the MSGSW_TGLE SRL is cleared. |
| STRY_TGLE | Stream Ready Error Toggle. The STRY_TGLE SRL may only be set if the previous JTAG command was the SDAT_STRM command. The STRY_TGLE SRL is set if CPU_DONE is not active on the rising edge of MTAP Counter's XFER_DATA signal. This condition indicates the previous ld/st did not advance prior to the next data transfer to or from the CPU's EDDATA1 register. If Emulation Error Status is selected the STRY_TGLE signal is loaded into the IR shift register during the CAPTURE_IR JTAG state and the STRY_TGLE SRL is cleared. |
| STSW_TGLE | Stream Switch Error Toggle. The STSW_TGLE SRL may only be set if the previous JTAG command was the SDAT_STRM command. The STSW_TGLE SRL is set if the MPSD code in the ECR's TERM field is not driving the MPSD bus on the rising edge of MTAP Counter's XFER_DATA signal. This condition indicates that UCLK is running two slow in relationship to TCLK to support the data streaming function. If Emulation Error Status is selected the STSW_TGLE signal is loaded into the IR shift register during the CAPTURE_IR JTAG state and the STSW_TGLE SRL is cleared. |
| CSM_EXE | CSM EXE State. Code state machine EXE state bit (1 if EXE state applied to output of CSM). See Figure 37 for more information. |
| CSM_LOCK | CSM Lock State. Code state machine LOCK state bit. See Figure 37 for more information. |
| C1, C0, Ce | CSM Output. This field is the CSM MPSD code applied to the DTPs. See Figure 37 for more information. |

Table 45 defines a set of JTAG Instructions that are supported by MTAP 305. JTAG instructions within MTAP 305 may be broken into the standard JTAG instructions required by the IEEE 1149.1 specification (public instructions) and private instructions which have been added for emulation and test. Private JTAG opcodes have three basic functions:

1) Selection of the scan path for the SHIFT_DR JTAG state and the control logic used in conjunction with the CAPTURE_DR and UPDATE_DR JTAG states.

2) Determine the disposition of private commands generated when private opcodes are in the JTAG IR and the JTAG state machine transitions into the JTAG IDLE state.

3) Support ATPG testing with opcodes by a direct mapping of JTAG states to MPSD codes when the device mode is Test.

Private commands are actions which are initiated in the JTAG environment by entering the JTAG IDLE state from either UPDATE_IR or UPDATE_DR. The command initiation is synchronized to the functional clock (UCLK) and results in one functional clock wide commands to functional logic in MTAP 305 and DTPs. The initiation of a private command inhibits further updates of the JTAG IR until the command has been issued. Completion of a private command can be determined by capturing the IRBUSY (instruction register busy flag) in the JTAG CAPTURE_IR state.

The JTAG instructions described in Table 46 are supported by MTAP 305. They are broken into Public and Private groups. Required opcodes (public) are noted as such in the discussion. Any opcode not denoted as required is a private opcode. The description of the private group includes the data register selected by the opcode in addition to a short description of the command that may be initiated with this opcode. Test mode use of the opcodes is discussed later; particularly with respect to Table 63 and Table 65.

TABLE 46

CODE DESCRIPTION

| CODE | DESCRIPTION |
|---|---|
| 0xFF | BYPASS. This instruction enables the Bypass scan path. This path is a single shift-register stage. This is a required JTAG public opcode and is covered in section 7.4 of the JTAG IEEE 1149.1 Specification. |

TABLE 46-continued

CODE DESCRIPTION

| CODE | DESCRIPTION |
|---|---|
| 0x20 | SDAT_HALT. This instruction selects the DTP_SDAT scan path. Refer to the later section regarding "MTAP MPSD Code Generator" for special scan considerations DTP_SDAT scan path. The command associated with this opcode issues a start MPSD code generation sequence to MTAP 305's Code State Machine (CSM) using preloaded MPSD code values from the Emulation Control Register's (ECR) EXE bit field. Additional functionality is provided in test mode. |
| 0x21 | SDAT_CNTL. This instruction selects the DTP_SDAT scan path. Refer to the later section regarding MTAP MPSD Code Generator for special scan considerations relating to the DTP_SDAT scan path. The command associated with this opcode issues a start MPSD code generation sequence to MTAP 305's Code State Machine (CSM) using preloaded MPSD code values from the Emulation Control Register's (ECR) TERM bit field. Additional functionality is provided in test mode. |
| 0x22 | SCTL_HALT. This instruction selects the DTP_SCTL scan path. The command associated with this opcode directs each processor's EMUOEN0 event logic to be inhibited in the inactive state until the event selected by the EMUC bits of the ECR returns to the inactive state. Additional functionality is provided in test mode. |
| 0x23 | SCTL_CNTL. This instruction selects the DTP_SCTL scan path. The command associated with this opcode directs each processor's EMUOEN1 event logic to be inhibited in the inactive state until the event selected by the EMUC bits of the ECR returns to the inactive state. Additional functionality is provided in test mode. |
| 0x24 | SECR. This instruction selects the Emulation Control Register (ECR) scan path. Refer to the later section regarding "MTAP Code State Machine" for special scan considerations concerning the ECR path. The command associated with this opcode directs MTAP 305 to lock ("freeze") the current MPSD code applied to the DTPs (CSM_LOCK). The codes remain locked until a command generated by opcodes SDAT_HALT or SDAT_CNTL is issued. This locking process is required prior to scanning the ECR. The JTAG IDLE state must be entered for the CSM_LOCK command to take effect. The SYNC_ERR MTAP status bit is also cleared when the CSM_LOCK command takes effect. |
| 0x25 | SMM_ID. This instruction selects the EVT_CNTR scan path which for this instruction is loaded by CAPTURE_DR with the ID bus value. The ID bus consist of the revision and device type information in the 16 MS bits of the CPU's Control Status Register (CSR). This data must be scannable while the CSR is accessible by the processor. No command is associated with this instruction. |
| 0x26 | SEVT_CNTR. This instruction selects MTAP 305's event counter scan path. The command associated with this instruction (LEVT_CNTR) loads the shadow bits of the counter. |
| 0x27 | SGABORT. The command associated with this instruction clears the MTAP's Start Generator. This instruction selects the Bypass scan path. |
| 0x28 | XAINT. The command associated with this instruction generates an Analysis Interrupt (AINT). This instruction selects the Bypass scan path. |
| 0x29 | XMSGINT. The command associated with this instruction generates a Message Interrupt (MSGINT). This instruction selects the Bypass scan path. |
| 0x2A | SDAT_STRM. This instruction selects the data stream scan path. The command associated with this instruction is the Start Data Stream process. The data stream process is controlled by the CSM and MTAP counter both of which must be properly configured. |
| 0x30 | SEA_DATA. This instruction selects the SE Analysis Data scan path. No command is associated with this instruction. |
| 0x32 | SEA_CNTL. This instruction selects the SE Analysis Control scan path. No command is associated with this instruction. |

NOTE:
MTAP 305 places additional restrictions on scanning paths selected by opcodes 0x20–0x23, 0x30, 0x32 and 0x24 (see the later sections regarding "MTAP Code State Machine" and "MTAP MPSD Code Generator"). Scan paths not explicitly identified select the Bypass path and are reserved for future use.

Referring again to FIG. 33, bypass path 451 is a one bit data path that is selected when no other data path is specifically selected through the JTAG instruction register. The bypass bit always captures a logic one in the CAPTURE_DR state.

MTAP Support of JTAG to MPSD DTPs

Figure 35:
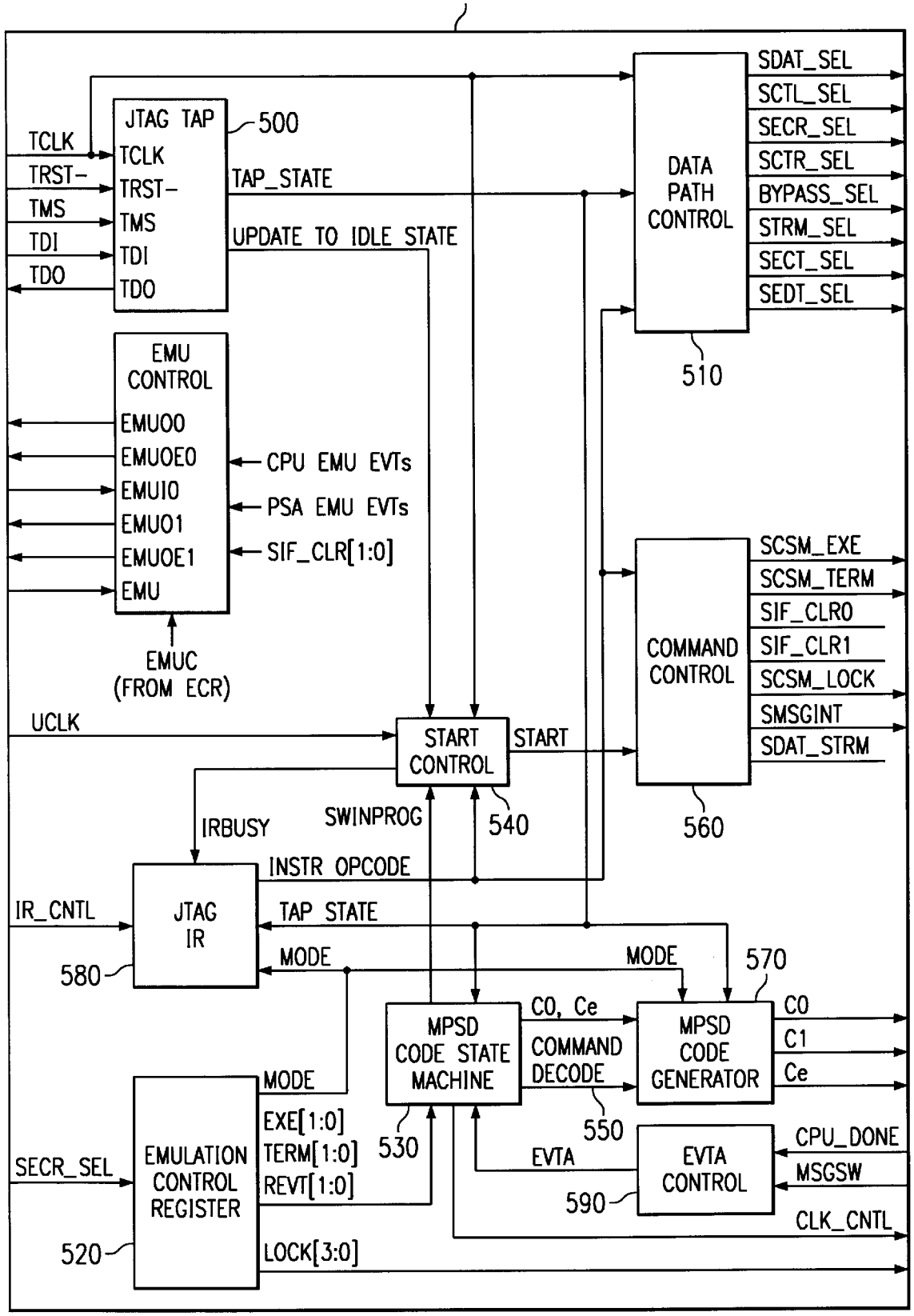
FIG. 35 is a block diagram of a JTAG to MPSD Interface for the processor of FIG. 1.

FIG. 35 is a block diagram of MTAP 305 which has a JTAG to MPSD interface. MTAP 305 provides external access to and control of domain test ports (DTPs). MTAP 305 is utilized as an interface between the JTAG and MPSD scan technologies. It capitalizes on the use of the JTAG protocol as a communication medium in addition to its use in boundary scan control. MTAP 305 allows access to test and emulation system resources. MTAP 305 block performs the following functions: test support, scan support and execution support.

Test support allows on board application of ATPG test patterns through direct conversion of JTAG TAP state to DTP MPSD codes and substitution of TCLK for UCLK. Also supported is chip tester application of ATPG test patterns through a direct MPSD mode. Scan support includes management of the switching and application of clocks sourced to each domain to assure test clocks are supplied in scan modes and generation of DTP MPSD Scan Codes from JTAG shift data state (SHIFT_DR) and the path select in the JTAG instruction register. Execution Support includes management of the switching and application of clocks sourced to each domain to ensure that functional clocks are supplied in execution modes and generation of MPSD code sequences which control the execution modes of the domains through the DTPs.

Sequences of scanned information coupled with JTAG state diagram transitions direct the functionality provided by MTAP 305. A MTAP subsystem, called the Code State Machine (CSM), creates the MPSD execution code sequences used to control the individual domains. Since the JTAG logic is driven by Test Clock (TCLK) and functional logic is driven by Universal Clock (UCLK), MTAP 305 is designed to control the clocking of each domain.

Referring still to FIG. 35, Megamodule Test Access Port (MTAP) 305 consists of a JTAG TAP 500 (specified in the 1149.1 JTAG Specification), JTAG Data Path Control logic 510, Emulation Control Register (ECR) 520, the Code State Machine (CSM) 530, the Start Control 540, Command Decode 550, Command Control 560, and the MPSD Code Generator 570.

Still referring to FIG. 35, MTAP 305 can be divided between JTAG and DTP control blocks. The JTAG block includes the JTAG TAP 500, JTAG IR 580, and Data Path Control 510. This block decodes the JTAG activity at the device pins, receiving instructions and dispositioning them as scan path control qualifiers or providing them to the DTP block as command qualifiers. Command requests pass from the JTAG block to the DTP block, where they are processed and dispositioned to the appropriate functional logic block. The DTP Control block includes Start Control 540, Command Control 560, Emulation Control Register 520, MPSD Code State Machine 530, and MPSD Code Generator sections 570.

JTAG TAP 500 contains a state machine which tracks the JTAG state activity directed by the TCLK, TRST-, and TMS pins. This state machine generates all control signals used to capture, shift, and update both the instruction register and data register scan paths. Data Path Control 510 then uses the TAP and Instruction Register 580 information to generate scan control for the JTAG scan paths.

Still referring to FIG. 35, MPSD Code State Machine (CSM) 530 and Emulation Control Register (ECR) 520 are used together to generate MPSD execution code sequences from MPSD Code Generator 570 and control DTP clocks. Commands from Command Control block 560 initiate CSM 530's operations. CSM 530 selects and applies one of two programmable C0 and Ce values from ECR 520 when directed by a command. The application sequence of the two preloaded code values is also specified by bits in ECR 520. This application sequence is programmable and can be made dependent on processor actions. CSM 530 operation is covered in greater detail in a following section. ECR 520 also supports device mode selection and miscellaneous test functions that are covered in the next section.

Code generator 570 takes inputs from the ECR mode bits, the TAP states, decode of the DTP JTAG IR control opcode, and the MPSD Code State Machine to form the MPSD codes supplied to the DTPs.

Figure 36:
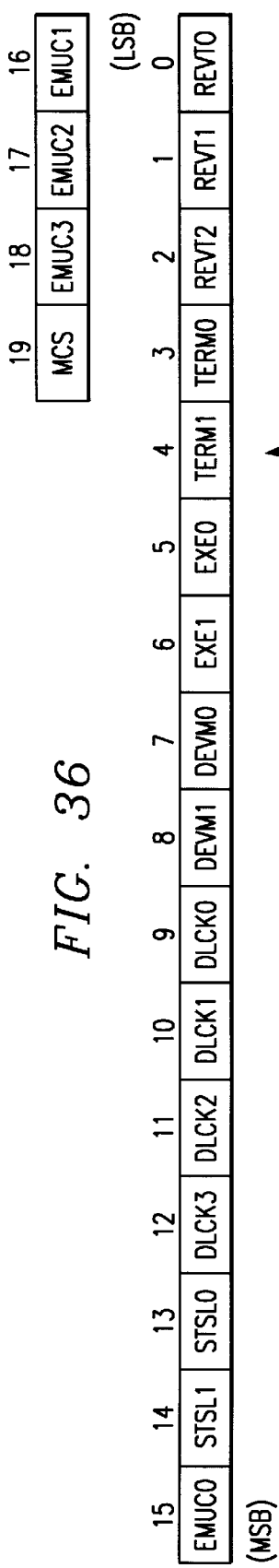
FIG. 36 illustrates the emulation control register of FIG. 33.

FIG. 36 illustrates MTAP Emulation Control Register 520. Emulation Control Register (ECR) 520 is a private scan path 452 (FIG. 33) within MTAP 305. It is specified by a SECR opcode placed in the JTAG instruction register. The ECR is implemented as a shift register and a shadow register, although not all bits are shadowed. The Emulation control register fields are described in Table 47.

TABLE 47

Device Mode Field

| | |
|---|---|
| MCS | MegamoduleClockSelect: If the Device Mode bits are set to Strap or Emulation this bit will cause the functional clock to be switched from UCLK to TCLK. Conversely, when cleared this bit will cause the functional clock to be switched from TCLK back to UCLK. The switch select is controlled by the shadow latch of this bit, which causes the clock to switch when the shadow latch is updated. TRST- or the TLR JTAG state will clear this bit causing UCLK to be selected. All MTAP logic running off of UCLK is also switched to TCLK. When switching the functional clock, it is the responsibility of the emulation software to unlock all domain test ports and apply PAUS prior to changing the MCS bit, thus facilitating a glitch free clock switch for the entire device. With ATPG mode selected and the MCS bit set, the MTAP's MPSD code mapping for Test mode is disabled. All domain scan chains are configured for ATPG mode (all SRLs muxed into scan path). This mode will be utilized to allow standard JTAG control of the processors while in ATPG mode. |
| DEVM[1:0] | DeviceMode: - Two bits define the operating mode of the megamodule. These mode bits are always enabled. These two ECR bits are forced to ones when an TRST-occurs. Table 48 defines the device mode field. |
| EMUC[3.0] | EmuPinConfigurationField - This field is utilized to select the events that drive the EMUO[1:0] pins and the EMUOEN[1:0] operation mode (shared or dedicated). The minimum pulse width of the EMU0 and EMU1 signals in 5 nsecs. Table 54 defines this field. |
| EXE[1:0] | MPSDEXECode - This field consists of 2 bits of MPSD code (C0, Ce) which may be selected by the MPSD Code State Machine and supplied to the MPSD Code generator for application to the Domain Test Ports. A list of the MPSD codes is as shown in Table 50. This field is initialized to FUNC by TRST- or the TLR JTAG state. |
| TERM[1:0] | MPSDTERMCode - This field is identical to the MPSD EXE Code field. |
| REVT[2:0] | RemoteEventField - The Remote Event Field consist of 3 bits used to specify conditions which make the MPSD Code State Machine transition from the EXECUTE state (select the EXE code from the ECR) to the TERMINATE state (select TERM code from the ECR) and visa versa when the CSM is not in the LOCKED state. The following codes assume that the CSM is not in the LOCKED state. The CSM can be directed by the Command Control block to leave the LOCKED state and enter the EXECUTE or TERMINATE state. When a command is present it overrides directives specified by the REVT Mode field. Table 51 defines the remote event field. This field is initialized to 000 by TRST- or the TLR JTAG state. |
| DLCK[3:0] | DTPLockField - The DLCK field consists of one lock bit per DTP (CPU, Analysis, Megamodule, SE). Each lock bit drives a Lock signal that is routed to its DTP. Each DTP lock bit indicates whether the current state (MPSD code and clock source) is to be locked or "frozen⇌ at their current values while new MPSD codes or clock source information are applied to unlocked domains. The Lock register is shadowed. During IDLE the lock scan register bits are loaded into the shadowed lock latches. The lock signals are driven from the shadow latches. This will |

TABLE 47-continued

Device Mode Field

| | |
|---|---|
| | allow all DTPs see the new lock state on the same UCLK edge. Also, lock is applied to the DTPs after the CSM applies the new MPSD code and the clock switch is complete (if required) thus allowing the DTP to be locked with the new MPSD code and correct clock selected. This field is initialized to 0000 by TRST- or the TLR JTAG state forcing all DTPs to the unlocked state. STRP_DEVM will also clear the lock shadow latches. Table 52 defines the DTP lock field. |
| STSL[1:0] | StatusSelectField - The STSL field is utilized to select one of 4 status signal groups. The STSL field value is reset to 00 by TRST- and the TLR JTAG state. The STSL register is not shadowed. Table 53 defines this field. |

TABLE 48

Device Mode Field

| | |
|---|---|
| 00 | ATPGMode - TCLK is sourced to the entire megamodule. The JTAG TAP states are mapped directly to MPSD codes by the MPSD Code Generator (if MCS is 0). The ATPG_DEVM signal is driven active. The Master clock of the Domain is gated off by the HALT, PAUS, SCTL, or SDAT states. It remains gated off until CNTL or FUNC are applied to the test port. This means that when HALT is applied to the Test Port the processor halts immediately without regard to bus contention or the state of the cache. |
| 01 | EmulationMode - MPSD Code State Machine 530 generates MPSD execution codes through MPSD Code Generator 570 while the DTP shift codes are created by the MPSD Code Generator from the SHIFT_DR TAP state and JTAG opcodes which select the DTP_SDAT and DTP_SCTL scan paths. Clock control is provided by MPSD Code State Machine 530 and is dependent on the MPSD code supplied by the MPSD Code State Machine. The EMU_DEVM signal is driven active. The Master clock of the Domain is gated off by the PAUS, SCTL, or SDAT states. It remains gated off until HALT, CNTL or FUNC are applied to the test port. |
| 10 | RESERVED |
| 11 | MPSDStrapMode - The device mode bits are initialized to this value when TRST- is a logic zero or the JTAG TAP transitions through the TLR state. The field may also be set to this state through an ECR scan. This mode causes the MPSD Code Generator to output an MPSD Functional RUN (FUNC) code to each Domain, Functional clocks to be selected, and all domains forced to be unlocked. The STRP_DEVM signal is driven active. The device mode bits drive the decoded mode signals into each domain. |

Table 49 defines the clock select table based on the MCS bit and device mode field bits.

TABLE 49

Clock Select Table

| DEVICE MODE | MCS | FUNCTIONAL CLOCK SELECT | DTP CLOCK SELECT |
|---|---|---|---|
| ATPG | 0 | TCLK | TCLK_SEL |
| ATPG | 1 | TCLK | TCLK_SEL |
| EMU or STRAP | 0 | UCLK | UCLK_SEL |
| EMU or STRAP | 1 | TCLK | TCLK_SEL |

TABLE 50

MPSD EXE Code

| C0 | Ce | MPSD CODE |
|---|---|---|
| 1 | 1 | FUNC |
| 1 | 0 | CNTL |
| 0 | 1 | HALT |
| 0 | 0 | PAUS |

TABLE 51

Remote Event Field

| | |
|---|---|
| 000 | The CSM remains in the current state. |
| 001 | The CSM moves to the TERMINATE state if EVTA (see section 10.2.8) transitions from an inactive to an active state. |
| 010 | After 1 clock of the EXECUTE state, the CSM moves immediately to the TERMINATE state. |

TABLE 51-continued

Remote Event Field

| | |
|---|---|
| 011 | The CSM toggles state, i.e. EXE to TERM or TERM to EXE if EVTA transitions from an inactive to an active state. Transitions from TERM to EXE are inhibited if SWBP_DEC or ABP_DET are active. |
| 100 | The CSM waits for an active MTAP counter MTAP_BORROW signal to apply the TERMINATE state. |
| 101 | The MTAP counter's XFER_DATA signal will cause the CSM to transition from TERM to EXE for one clock then back to TERM. |
| 110 | Reserved. |
| 111 | Reserved. |
| | This field is initialized to 000 by TRST- or the TLR JTAG state. |

TABLE 52

DTP Lock Field

| XXX1 | CPULOCK—CPU lock |
|---|---|
| XX1X | ANALOCK—Analysis Lock. |
| X1XX | MMLOCK—Megamodule Lock. |
| 1XXX | SEALOCK—SE Analysis lock. |

TABLE 53

Status Select field

| 0 | Strap Status Selected |
|---|---|
| 1 | Stop Emulation Status Selected |
| 2 | Real Time Emulation Status Selected |

TABLE 54

Emulation Configuration Codes

| EMUC | EMUØO | EMUØ1 | EMUOE [1:0] MODE |
|---|---|---|---|
| 0000 | HI-Z | HI-Z | Both Shared |
| 0001 | HI-Z | OC | Both Shared |
| 0010 | OC | HI-Z | Both Shared |
| 0011 | OC | OC | Both Shared |
| 0100 | TP | HI-Z | EMU0O Dedicated/EMU01 Shared |
| 0101 | TP | TP | Both Dedicated |
| 0110 | HI-Z | OC | Both Dedicated |
| 0111 | TP | OC | EMU0O Dedicated/EMU01 Shared |
| 1000 | TP | HI-Z | EMU0O Dedicated/EMU01 Shared |
| 1XXX | TP | TP | Both Dedicated |

High Impedance HI-Z
Open Collector OC
Totem-Pole TP

| EMUC | EMUØO | EMUØ1 | EMUØE0 | EMUOE1 | |
|---|---|---|---|---|---|
| 0000 | HI-Z | HI-Z | 0 | 0 | |
| 0001 | HI-Z | 0 | 0 | 1 | If CPU_DONE or AINT_TKN active |
|  | HI-Z | HI-Z | 0 | 0 | If CPU_DONE and AINT_TKN inactive |
| 0010 | 0 | HI-Z | 1 | 0 | If CPU_DONE or AINT_TKN active |
|  | HI-Z | HI-Z | 0 | 0 | If CPU_DONE and AINT_TKN inactive |
| 0011 | 0 | 0 | 1 | 1 | If CPU_DONE or AINT_TKN active |
|  | HI-Z | HI-Z | 0 | 0 | If CPU_DONE and AINT_TKN inactive |
| 0100 | MTAP_BORROW | HI-Z | 1 | 0 | |
| 0101 | MTAP_BORROW | CPU_DONE | 1 | 1 | |
| 0110 | HI-Z SWBP_DEC | ABP_DET | 0 | 1 | SWBP_DEC or ABP_DET active |
|  |  |  | 0 | 0 | SWBP_DEC and ABP_DET inactive |
| 0111 | CPU_DONE | SWBO_DEC ABP_DET | 1 | 1 | SWBP_DEC or ABP_DET active |
|  |  |  | 0 | 0 | SWBP_DEC and ABP_DET inactive |
| 1000 | MSGFLG | HI-Z | 1 | 0 | |
| 1001 | PSA0 [33] | PSA0 [17] | 1 | 1 | |
| 1010 | PSA1 [33] | PSA1 [17] | 1 | 1 | |
| 1011 | PSA2 [36] | PSA2 [18] | 1 | 1 | |
| 1100 | PSA3 [36] | PSA3 [18] | 1 | 1 | |
| 1101 | PSA4 [33] | PSA4 [17] | 1 | 1 | |
| 1110 | PSA5 [20] | PSA5 [10] | 1 | 1 | |
| 1111 | RESERVED FOR EXPANSION PSA | | | | |

NOTE:
All signals driving EMU0OUT and EMU1OUT are low active versions of the signals specified.
MTAP_BORROW signal is a one clock wide pulse and is defined in a later section.

Referring to Table 54, if the EMUC code selects the HI-Z state for either both of the EMUOE signals, the appropriate EMUOE signals are permanently driven low holding the EMUO driver in the HI-Z state. If the code selects an Open Collector state for one or both pins. the signal selected to drive EMUO also controls the state of EMUOE. If a false condition occurs on EMUO, EMUOE is switched low forcing the EMUO output driver to its HI-Z state. If a true condition occurs on EMUO, EMUOE is switch to a high causing the EMUn pin driver to change from a HI-Z output to the driving state. The execution of the IF_CLRO or IF CLR1 JTAG commands inhibit the signals driving EMUO0 and EMUO1 until the signals return to their inactive state. TRST- causes the EMUC bits to be loaded with zeros.

The EMUC configuration code bits are implemented as shadow bits of the ECR. The configuration bits are updated when the JTAG TAP transitions through the IDLE state. This will allow the new event selection to be synchronized to UCLK thus eliminating the chance of glitching the EMUO signals.

If the Device Mode bits are set to STRAP, the EMU configuration codes are selected by the CPU_EMUC bits of the ACR as defined in an earlier section. The EMUC field is initialized to 0000 by TRST- and the TLR JTAG state.

The Device Mode fields and MCS bit are implemented with shadow bits that are loaded during the UPDATE-DR JTAG state while the MPSD Code and Remote Event fields are not shadowed and are physically within the Emulation Control shift register bits. References to the ECR refer to the shadowed and unshadowed bits that supply functional information to other logic.

Since there is no synchronization when changing the device modes or the MCS bit, to avoid an invalid state caused by glitching the software must assure that when switching modes or the MCS bit all test ports are unlocked and have PAUS applied, or the currently selected clock is disabled (power down).

The mix of shadowed and unshadowed bits in ECR 520 result from the use of the MPSD Code and Remote Event fields with logic which runs on the functional clock (UCLK). These fields are applied directly to logic or registers which are being evaluated with UCLK. Shift register bits updated with respect to the test clock (TCLK) will change asynchronous with respect to UCLK. generating erroneous results in the UCLK controlled logic. The synchronization problem is addressed by inhibiting the use of ECR data by the UCLK controlled logic while the ECR shift register is being scanned. The inhibit has the effect of freezing or locking the state of the functional logic using the non shadowed shift register bits and is generated by emulation software through the use of a functional command. This inhibit process is an alternate form of synchronized shadowing, assuring that functional logic using information scanned by the test clock (TCLK) gives the appearance of being static at all times. The locking process is part of the MPSD Code State Machine and is discussed in a later section which describes the MTAP code state machine.

ECR 520 can not be scanned, even if the host software is just checking the ECR state, without the software first locking the CSM.

MTAP Start Control and Command Control

Referring again to FIG. 35, MTAP Start control logic 540 accepts command directives from the JTAG section of MTAP 305, synchronizes the directive and then, with the aid of MTAP Command Control 560, dispositions the command to MPSD Code State Machine 530 and logic blocks external to MTAP 305. A Domain command is initiated in the JTAG section only when JTAG IR 580 contains an opcode in the range of 0×20–0×2F and the TAP moves to the IDLE state from either UPDATE_IR or UPDATE_DR.

The Domain command request is transferred to MTAP Start Control logic 540 where a state machine generates an IRBUSY signal synchronous to TCLK which inhibits further JTAG instruction register updates. Table 55 is a sequence of events which facilitate the generation of a start pulse for the command to be generated. START_REQT and IRBUSY are reset by the TAP Test Logic Reset (TLR) state while START_REQ1 and START_REQ2 are reset by IRBUSY low.

TABLE 55

Start Pulse Generation

| STATE 0 | The JTAG command request (START_REQT) is driven active. |
| --- | --- |
| STATE 1 | START_REQT is synchronized to UCLK (START_REQI) and sets IRBUSY. |
| STATE 2 | START_REQ1 in turn sets START_REQ2. At this point START_REQT. IRBUSY, START_REQ1, and START_REQ2 are set. |
| STATE 3 | START_REQT is reset by START_REQ2. |
| STATE 4 | START_REQ1 is reset. At this point IRBUSY and START_REQ2 are set and START_REQ2 are set and START_REQT and START_REQ1 are reset. |
| STATE 5 | The combination of START_REQ1 low, START_REQ2 high, and START_OK high generates START provided SWINPROG is false. |
| STATE 6 | START resets START_REQ2. START is only a single clock pulse. |
| STATE 7 | START_REQ2 low and START_REQT low cause IRBUSY to be reset. |

Still referring to FIG. 36, signal SWINPROG inhibits the generation of START if the JTAG opcode is 0×20–0×23, 0×30, 0×32 or 0×24 (all commands targeted at the selection of a domain scan path or the ECR).

A truth table for the START Generation state machine is shown by Table 56.

The command generation process requires that the emulation software be responsible for not issuing a second command until the first one is complete. The IRBUSY SRL, visible through the JTAG IR capture information, allows the busy indicator to be examined by emulation software on the same instruction register scan that loads the next command. Since the capture state occurs before the update state, a logic zero capture of the IRBUSY flag on a command load assures the emulation software the instruction register update will positively occur. Commands scanned into the instruction register should end in the PAUSE_IR state. allowing the emulation software to decide if progression to the JTAG IDLE state is warranted. Certain events which result from the generation of start pulses may be programmed to be seen at the emulation pins as interrupts. These interrupts may be used by the emulation software in lieu of polling the instruction register in some cases. The determination of interrupt applicability is left to the discretion of the programmer.

If the JTAG state machine is driven to the IDLE state with the SGABORT command loaded in JTAG IR 520, or the JTAG state machine is driven to the TEST-LOGIC_RESET state, the Start Generator will be directed to its clear state. The SGABORT command will override IRBUSY and allow the command to be loaded into the JTAG IR.

Referring still to FIG. 35, Command Controller 560 generates all command strobes for CSM 530 and Domains. The state of the lock bit may affect which domains receive a command such as SDAT_HALT. START is a one clock wide pulse generated by the JTAG START Control Logic when a command has been initiated from the JTAG interface. START is sent to the Command Control to be routed to its destination. The Command Control logic combines the START pulse with the JTAG IR value to form a specific command. These specific commands are sent to either MPSD Code State Machine 530 within MTAP 305 or a Domain outside MTAP 305. The commands are listed in Table 57.

TABLE 56

Start Generation State Machine

| | | Clocked on TCLK | | Clocked on UCLK | | |
| --- | --- | --- | --- | --- | --- | --- |
| STATE | TO IDLE | START_REQT | IRBUSY | START_REQ1 | START_REQ2 | START |
| | 0 | 0 | 0 | 0 | 0 | 0 |
| | 0 | 0 | 0 | 0 | 0 | 0 |
| | *1 | 0 | 0 | 0 | 0 | 0 |
| 0 | 0 | *1 | 0 | 0 | 0 | 0 |
| 1 | 0 | 1 | *1 | *1 | 0 | 0 |
| 2 | 0 | 1 | 1 | 1 | *1 | 0 |
| 3 | 0 | *0 | 1 | 1 | 1 | 0 |
| 4 | 0 | 0 | 1 | *0 | 1 | 0 |
| 5 | 0 | 0 | 1 | 0 | 1 | *1 |
| 6 | 0 | 0 | 1 | 0 | *0 | 0 |
| 7 | 0 | 0 | *0 | 0 | 0 | 0 |

*Actual change in state

TABLE 57

Command Control Commands

| | |
|---|---|
| CSM_EXE | (0x20) This command directs the CSM to apply the EXE bit field of the ECR to the MPSD Code Generator, reset the LOCKED state and enter the EXECUTE state. |
| CSM_TERM | (0x21) This command directs the CSM to apply the TERM bit field of the ECR to the MPSD Code Generator, reset the LOCKED state and enter the TERMINATE state. |
| IF_CLR0 | are returned to their inactive state. The pulse catcher on the EMUI0 interface is cleared. |
| IF_CLR1 | (0x23) This command directs the EMU control block within the MTAP to inhibit the signals driving EMUO1 until these signals are resumed to their inactive state. The pulse catcher on the EMUI1 interface is cleared. |
| CSM_LOCK | (0x24) This command directs the CSM to enter the LOCKED state with the current code "frozen" or locked and applied to the MPSD Code Generator. |
| LEVT_CNTR | (0x26) This command initiates a UCLK synchronous load of the MTAP counter's shadow bits. |
| SGABORT | (0x27) While the JTAG state machine is in the IDLE state this command directs the Start Generator to its clear state, which in turn will also cause IRBUSY to be cleared. |
| XAINT | (0x28) This command drives the XAINT signal into the CPU domain which generates an Analysis Interrupt (AINT). |
| XMSGINT | (0x29) This command drives the XMSGINT signal into the CPU domain which generates a Message Interrupt (MSGINT). |
| SDAT_STRM | (0x2A) This command initiates a data stream process. This command directs the CSM to apply the TERM bit field of the ECR to the MPSD Code Generator, reset the LOCKED state and enter the TERMINATE state. It will also enable SHIFT_DR to decrement the MTAP counter. |

MTAP Code State Machine

Still referring to FIG. 35, MPSD Code State Machine (CSM) 530 controls the application of MPSD codes from the EXE and TERM register fields of ECR 520 to MPSD code generator 570(which drives the MPSD bus). It also manages the clock switches required to scan (TCLK) and execute (UCLK) while in emulation mode.

CSM 530 is operational in all modes except ATPG mode. The CSM is used in emulation mode to generate programmable MPSD execution code sequences to the MPSD Code generator. The Execution code sequences are defined as FUNC, CNTL, HALT, and PAUS. The emulation software is required to direct the CSM to apply a PAUS code to the code generator prior to attempting a scan of the DIP Data or Control paths. The CSM uses the execution code to determine the domain clock selection. FUNC, CNTL, or HALT code application requires that domains have UCLK selected while the PAUS code may be applied with either UCLK or TCLK applied. Moving from a FUNC, CNTL. or HALT code to a PAUS causes a clock switch from UCLK to TCLK while a request to move from PAUS to FUNC, CNTL. or HALT causes a clock switch from TCLK to UCLK. All clock switches occur while a PAUS code is applied to unlocked domains.

Figure 37:
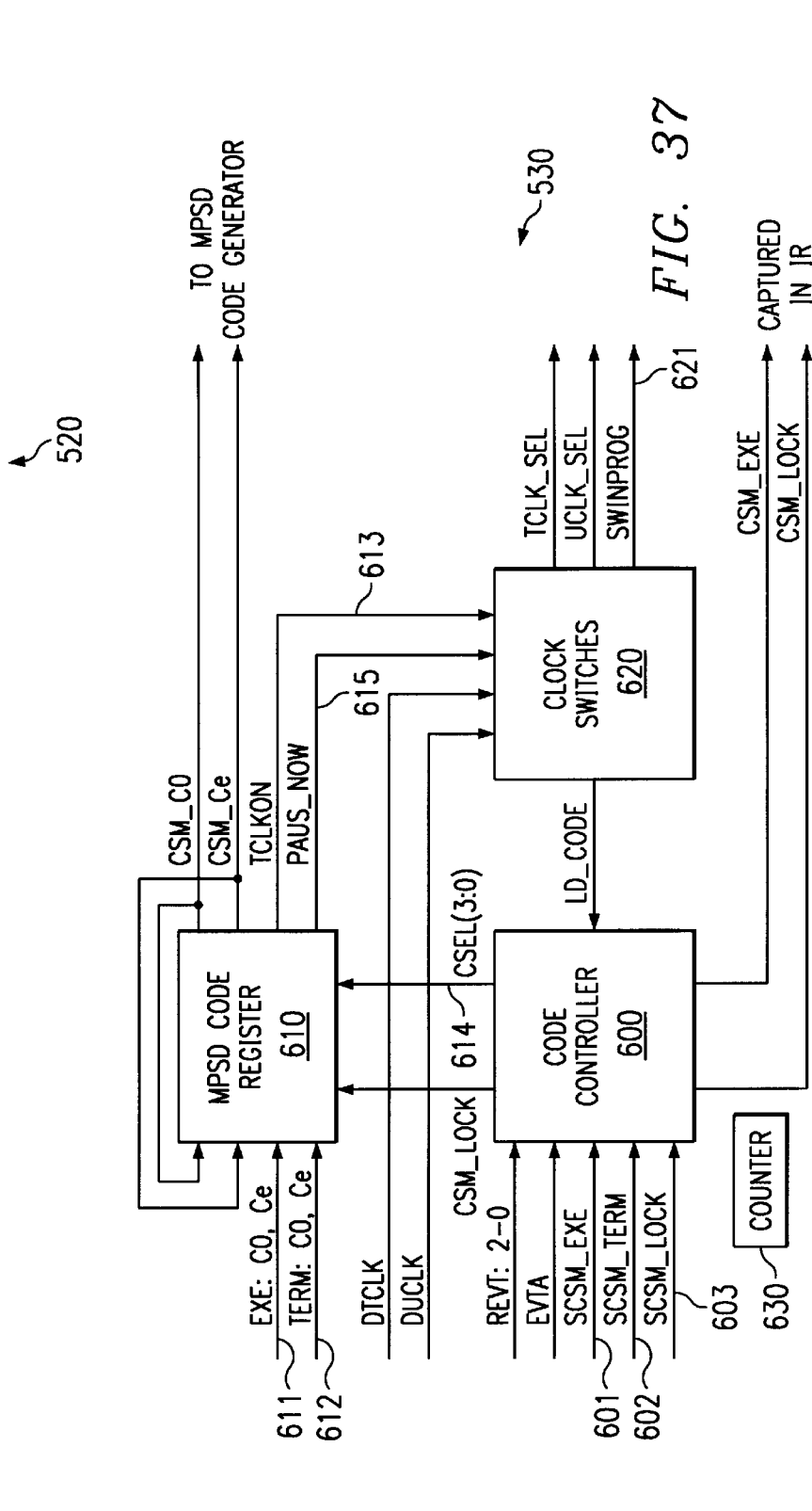
FIG. 37 is a block diagram of a code state machine (CSM) for the MTAP of the processor of FIG. 1.

FIG. 37 is a block diagram of CSM 530. The Code State Machine can be broken into an MPSD code controller 600, a code register 610, and clock switcher 620 sections. The code register section contains a two bit code register, a clock select bit, and a code multiplexer. The clock switcher contains a break before make synchronizing clock switcher with a switch in progress indicator. The code controller contains two state machine SRLs and all combinational logic to accommodate MTAP commands and REVT modes specified in the ECR. The state machine also generates multiplexer controls to select the EXE 611 and TERM 612 codes into the code register and load the clock select bit (TCLKON 613).

The code source for code register 610 is determined by code controller 600. The code register normally feeds back on itself in the absence of another directive. This allows the code controller to select EXE or TERM code fields from the ECR for a period of one clock. The one clock wide select window allows a new code to be entered into the code register after which the code recirculates. This scheme allows the code controller to pass commands directly from MTAP command control 560 to the multiplexer control within the code register block. The CSEL(3:0) 614 signals control the muxes on the code register.

If the next code to be applied by the CSM to the code generator is a run code (CNTL or FUNC), and the present code is PAUS then the CSM will force the HALT code for one clock cycle before the run code is applied. The reason for this is to allow the domains to enable their buses a clock early since buses are enabled (DBENB) for the HALT code.

Code controller 600 derives the multiplexer selects after resolving the priority of all requests. The priority is Clock Switch requests first, MTAP commands second, and Remote Event requests third. Clock switch requests take priority over MTAP commands by inhibiting MTAP START Control while a clock switch is in progress (SWINPROG is true) and a CSM command is specified in the JTAG IR. If a MTAP Command occurs simultaneously with a remote event command the event command is ignored. Any MTAP command or Remote Event can request a clock switch in either direction. The clock polarity required is embedded in the MPSD code with PAUS requesting the application of TCLK to all unlocked domains, while HALT, CNTL, and FUNC request the application of UCLK.

When a code load request is detected, the code controller determines which of three types of loads will occur. They are a code load with no clock switch, a switch from UCLK to TCLK, or a switch from TCLK to UCLK. The code controller treats each of these cases differently. No switch is detected if either of the following occur:

1) The current code is PAUS and the code to be loaded is PAUS, or
2) The current code is not PAUS and the requested code is not PAUS.

A UCLK to TCLK switch is detected if the current code is HALT, CNTL, or FUNC and the requested code is PAUS. A TCLK to UCLK clock switch is detected if the current code is PAUS and the requested code is HALT, CNTL, or FUNC. Processing the types differently assures that all clock switches occur while the MPSD PAUS code is applied to the Domains.

When no clock switch is required, code controller 600 selects the ECR field to be loaded and determines the next CSM state. Code Register 610 is loaded on the next clock along with the clock select bit and the CSM state.

When a code of PAUS is requested to be loaded into the code register while the current value is a HALT, CNTL, or FUNC, the code controller selects the ECR field to be loaded and determines the next CSM state. The code register is loaded to PAUS the next state and the TCLKON bit is loaded to a one. The clock switcher, comparing TCLKON to 305 START Control when the JTAG IR contains 0×20–0× 23, 0×30, 0×32 or 0×24.

FIG. 38 is a schematic of MTAP CSM clock switch circuit 620, which is a break before make switching circuit. A HALT to PAUS truth table is illustrated in Table 58, and a PAUS to HALT truth table is shown in Table 59.

TABLE 58

HALT to PAUS Code Transition

| PAUS_NOW | TCLKON | UCLKSYNC | UCLK_SEL | TCLKSYNC | TCLK_SEL | SWINPROG |
|---|---|---|---|---|---|---|
| 0 | 0 | 1 | 1 | 0 | 0 | 0 |
| 1 | 1 | 1 | 1 | 0 | 0 | 1 |
| 1 | 1 | 0 | 1 | 0 | 0 | 1 |
| 1 | 1 | 0 | 0 | 0 | 0 | 1 |
| 1 | 1 | 0 | 0 | 1 | 0 | 1 |
| 1 | 1 | 0 | 0 | 1 | 1 | 1 |
| 1 | 1 | 0 | 0 | 1 | 1 | |

TABLE 59

PAUS to HALT Code Transition

| PAUS_NOW | TCLKON | UCLKSYNC | UCLK_SEL | TCLKSYNC | TCLK_SEL | SWINPROG |
|---|---|---|---|---|---|---|
| 1 | 1 | 0 | 0 | 1 | 1 | 0 |
| 1 | 0 | 0 | 0 | 1 | 1 | 1 |
| 1 | 0 | 0 | 0 | 0 | 1 | 1 |
| 1 | 0 | 0 | 0 | 0 | 0 | 1 |
| 1 | 0 | 1 | 0 | 0 | 0 | 1 |
| 1 | 0 | 1 | 1 | 0 | 0 | 1 |
| 0 | 0 | 1 | 1 | 0 | 0 | 0 |

TCLK_SEL (Test Clock Select) determines a clock switch is requested and SWINPROG (switch in progress) becomes active. After the clock switch is complete SWINPROG returns inactive and the code controller and MTAP START Control may proceed.

A request requiring a switch from TCLK to UCLK takes special processing by code controller 600 as it must hold the current PAUS code while the clocks are switched, then installing the code that caused the switch to occur. In this case the code controller loads the requested clock state in TCLKON, updates the CSM state, and inhibits the code register 610 load.

TCLKON 613 requests clock switcher 620 to generate the clock switch to functional. The updated CSM 530 state points to the code that must be loaded when the clock switch is completed. Since TCLKON represents a PAUS code, it can be compared to code register 610 contents to see if the clock selection and code value agree. When TCLKON is a zero, and the code register contains a PAUS, a delayed code register load is pending. TCLKON 613 is always sent directly to clock switcher 620 where a clock switch sequence is initiated if required. This assures that the clock is switched while a PAUS code is applied to the domains. Switch in progress (SWINPROG) 621 is generated by the clock switcher if TCLKON disagrees with the output of the clock switcher or PAUS_NOW 615, the decode of the pause code in the code register. When a clock switch from TCLK to UCLK is complete, the switcher generates a LD_CODE signal to the code controller. The code controller combines the LD_CODE signal with the current CSM state to request either the EXE or TERM code field be loaded into the code register. SWINPROG inhibits START generation in MTAP Special CSM considerations with ECR scans are now noted. Since CMS 530 uses ECR 520 fields as static inputs, the ECR can only be scanned while the CSM is in the LOCKED state. Code controller 600 encodes the three code management states of EXECUTE, TERMINATE. and LOCKED indicated by signal 601, 602 and 603 respectively, into the two state register bits. The EXECUTE and TERMINATE states reflect the source of the current code on the code register. These two states may be directed through MTAP commands at any time. The Remote event field may direct either of these two states when the CSM state is not in the LOCKED state. The LOCKED state is directed by MTAP command and cannot be directed by the Remote Event field of the ECR. See Table 57 for command information. The state encoding is shown in Table 60.

TABLE 60

CSM Encoding

| | CSM_LOCK | CSM_EXE |
|---|---|---|
| TERMINATE | 0 | 0 |
| EXECUTE | 0 | 1 |
| LOCKED | 1 | 0 |
| LOCKED | 1 | 1 |

NOTE:
It should be noted that the state shown above with both CSM_LOCK and CSM_EXE set may never exist but if it does then the CSM_LOCK overrides CSM_EXE. The locked state should be entered before a Scan ECR is attempted, see Table 46 concerning the SECR instruction.

MTAP MPSD Code Generator

Referring again to FIG. 35, the MPSD codes supplied to the domains are built in MPSD Code Generator 570. Code generator 570 drives the MPSD bus from either the DTP Data and Control Scan States, the MPSD Code State Machine (CSM) outputs, by mapping the JTAG TAP Controller state directly to MPSD codes, or by forcing the MPSD Strap state (normal operation mode) to the bus.

The generation of codes by code generator 570 has a hierarchy which assures that the device is functional in JTAG test logic reset state (TLR). This hierarchy also allows MTAP 305 to be initialized with emulation software while all Domains receive an MPSD functional run code (FUNC) along with a functional clock select. The code value developed by the MPSD Code Generator is the logical OR of inputs from several sources. It becomes the emulation software's responsibility to apply compatible code sources to achieve the desired code output.

MPSD Code Generator 570 performs a logical OR of code inputs from Code State Machine 530, Strap mode, Scan DTP Data, Scan DTP Control. and ATPG mode. When both device mode bits in ECR 520 are set, STRAP is active. STRAP is ORed with C1, C0, and Ce, forcing them to the logic one state and generating the MPSD code of FUNC. This allows other code sources to be initialized with emulation software prior to resetting the STRAP signal with software. STRAP masks all other inputs to the code generation logic. The device mode bits are set to logic ones by a logic zero on TRST-, the JTAG TAP transition to the Test Logic Reset (TLR) state or by programming the ECR mode bits by an ECR scan.

The DTP Path Scan, MPSD Code State Machine, and ATPG Mode Mapping code generation sources are made mutually exclusive by the emulation software and MPSD code generation hardware. MPSD execution codes of FUNC, CNTL, and HALT can only be generated by the MPSD Code State Machine or, ATPG Mode Mapping logic that converts JTAG TAP states directly to MPSD codes. Only one source for the execute codes is active at a time, with the inactive source supplying logic zeros to the code building function in MPSD Code Generator 570.

Both MPSD execution code sources are to be placed in their inactive state (supplying logic zeros to the MPSD Code Generator) before any DTP Data Control Scans are attempted. The state mapping for ATPG mode is chosen to assure compliance with this rule. The emulation software is responsible for assuring that the MPSD Code State Machine outputs are placed in the inactive state (PAUS, CSM_C0 and CSM_Ce logic zeros) prior to attempting MPSD scans. Since all non scan MPSD codes (FUNC, CNTL, HALT, and PAUS) have C1 a logic one, C1 is generated as NOT SHEFT_DR OR NOT JTAG opcodes (0×20–0×23, 0×30 and 0×32) and C0 generated as SHIFT_DR AND JTAG opcodes (0×22–0×23 and 0×32). This yields a zero on C1 only when actually scanning the MPSD Data or MPSD Control Paths and frees both execution code generators from developing C1.

Code generator 570 takes inputs from the ECR mode bits, the TAP states, decodes of the MPSD Data and MPSD Control opcodes, and the MPSD Code State Machine to form the MPSD codes supplied to the domains. When not in STRAP, C1 is assigned to the inverse of the SHIFT_DR state ANDed with a JTAG opcode of 0×20–0×23 and 0×30 and 0×32 (scanning MPSD Data or MPSD Control paths). This makes the generation of the MPSD scan codes of SDAT and SCTL impossible to generate unless the correct scan path is selected and the data register scan state occurs. C0 is set to a one in the JTAG SHIFT_DR state if the MPSD Control path is selected (a JTAG opcode of 0×22–0×23, 0×30 and 0×32).

An additional constraint is placed on scanning the DTP Data path. The CAPTURE_DR state samples TCLK_SEL and if it is false, the MPSD PAUS code is applied to the DTPs during SHIFT_DR states. In addition the output of the DTP data scan path is forced to a zero. The captured value of TCLK SEL is to be output on the first bit of the DTP Data scan path when TCLK_SEL is false. Scan codes can only be generated when emulation software assures that the CSM_C0 and CSM_Ce outputs of the CSM are a logic zero.

Tables 61, 62 and 63 show the contribution of the various code generator sources. Table 61 shows a truth table for STRAP code, Table 62 shows a truth table for Emulation mode, and Table 63 shows a truth table for ATPG mode.

TABLE 61

STRAP Code Generation OR Term Contributions

|  |  | C1 | C0 | Ce |
|---|---|---|---|---|
| MPSD_STRAP |  | 1 | 1 | 1 |
| CODE STATE MACHINE |  | — | CSM_C0 | CSM_Ce |
| Scan MPSD Data | SHIFT_DR | 0 | — | — |
| Scan MPSD Control | SHIFT_DR | 0 | 1 | — |
| ATPG_TEST |  | — | 0 | 0 |
| Resulting Logical OR |  | 1 | 1 | 1 |

TABLE 62

Emulation Mode OR Term Contributions

|  |  | C1 | C0 | Ce |
|---|---|---|---|---|
| MPSD_STRAP |  | 0 | 0 | 1 |
| CODE STATE MACHINE | (see note) | — | CSM_C0 | CSM_Ce |
| Scan MPSD Data | SHIFT_DR | 0 | — | — |
| Scan MPSD Control | SHIFT_DR | 0 | 1 | — |
| ATPG_TEST |  | — | 0 | 0 |
| No Scan MPSD Data or Control |  | 1 | CSM_C0 | CSM_Ce |
| Scan MPSD Data, CSM_C0 = 0 | CSM_Ce = 0 | 0 | 0 | 0 |
| Scan MPSD Control | CSM_Ce = 0 | 0 | 1 | 0 |

NOTE:
CSM 530 must be programmed to assert a PAUS code prior to scanning MPSD Data or Control. For MPSD DATA and Control scans that occur without a PAUS code in the CSM the C1 and C0 contributions from the JTAG state diagram are inhibited.

TABLE 63

ATPG Mode OR Term Contributions

|  |  | C1 | C0 | Ce |
|---|---|---|---|---|
| MPSD_STRAP |  | 0 | 0 | 0 |
| CODE STATE MACHINE | (see note) | — | X | X |
| Scan MPSD Data | SHIFT_DR | 0 | — | — |
| Scan MPSD Control | SHIFT_DR | 0 | 1 | — |
| ATPG_TEST non | SHIFT_DR | — | MAP_C0 | MAP_Ce |
| No Scan MPSD Data or Control |  | 1 | MAP_C0 | MAP_Ce |
| Scan MPSD Data, CSM_C0 = 0 | CSM_Ce = 0 | 0 | 0 | 0 |
| Scan MPSD Control | CSM_Ce = 0 | 0 | 1 | 0 |

NOTE:
The "—" in the previous tables designates states that a code source does not contribute to the Code Generators output state. The treatment of C1, C0, and Ce for the various modes is shown in Table 64.

TABLE 64

C1, C0 and Ce Treatments

| | |
|---|---|
| MTAP Reset | STRAP, derived from the two ECR mode bits at a logic one value, generates a FUNC code and overrides all other code values |
| Scan MPSD Control and MPSD Data | SCAN_C1 is set to a logic zero when the SHIFT_DR state is generated by the TAP and the JTAG instruction is 0x20–0x23, 0x30 and 0x32 (MPSD Data or MPSD Control is scanned).<br>SCAN_C0 is set to a logic one when the SHIFT_DR state is generated by the TAP and the JTAG instruction register is 0x22–0x23, 0x30 and 0X32 (MPSD Control is scanned). |
| Code State Machine | CSM_C0 and CSM_Ce are generated by the MPSD Code State Machine. The value is programmable and is used to generate codes of PAUS (Scan MPSD Data or Control compatible state), HALT, CNTL, and FUNC.<br>CSM_C1 is a one when not SHIFT_DR or not MPSD Data or Control scans selected. |
| ATPG mode | MAP_C0 is generated from the JTAG state diagram when the ECR mode bits specify ATPG mode. This signal is a logic zero in the SHIFT_DR state, thus avoiding a conflict with SCAN_CO.<br>MAP_Ce is generated from the JTAG state diagram when the ECR mode bits specify the ATPG mode. This signal is a logic zero in the SHIFT_DR state, thus avoiding a conflict with SCAN_Ce.<br>MAP_C1 is a one when not SHIFT_DR or not MPSD Data or Control scans selected. |

In Emulation mode MPSD Code Generator (MCG) 570 controls the C1 bit of the MPSD code that is applied to the MPSD Test Port bus 306 (FIG. 15). The MCG forces C1 high except when a JTAG MPSD data scan is in progress (C1=0). When the CSM outputs an MPSD PAUS state the MCG maps the JTAG TAP states to MPSD scan codes. The JTAG data scan path is coupled directly to the MPSD bus data scan path. All unlocked MPSD Test Ports are then scanned on TCLK with data when the JTAG TAP state is transitioned to the SHIFT_DR state. The MPSD data or control path are selected through the JTAG IR path selects. During the JTAG SHIFT DR state cycle C1 is driven low if either the SDAT_HALT, SDAT_CNTL, SCTL_HALT, or SCTL_CNTL opcode are present (0x20–0x23, 0x30 and 0x32). C0 is driven to a one if SCTL_HALT, or SCTL_CNTL (0x22–0x23 and 0x32) paths are selected or a zero if SDAT_HALT or SDAT_CNTL (0x20–0x21 and 0x30) paths are selected.

In ATPG mode all DTP MPSD codes are mapped directly from the JTAG TAP state controller except the Run-Test/Idle state. In Run-Test/Idle the CSM is utilized to drive MPSD execute code states (CNTL or HALT). The CSM is unlocked and the EXE or TRM state (selected by JTAG IR command) drives the MPSD bus. In Run-Test/Idle, if the JTAG-IR contains a code other than 0x20 or 0x21, the previous mapped state (HALT or PAUS) continues to be applied to the MPSD bus. The previous mapped state also continues to be applied if the CSM is locked (or unlocked but the new MPSD code has not been applied to the MPSD bus). When the Run-TestlIdle state is exited the CSM will be locked and the MPSD code generator will utilize the JTAG state mapping to drive the MPSD bus. As in Emulation mode the DTP scan paths are selected through a DTP scan opcode loaded in the IR. In ATPG mode the mapping of the data scan register group of scan states forces MAP_C0 and MAP_Ce to zeros except for the SHIFT_DR state where the normal JTAG to MPSD shift code conversion occurs. If emulation mode is switched to from ATPG mode (from an ECR scan) the CSM will continue to drive PAUS (the SHIFT_DR mapped state) until the CSM is unlocked.

Table 65 shows the state decode for both Emulation and ATPG modes.

TABLE 65

MPSD Code Generator - JTAG State Mapping

| JTAG STATE | EMULATION MODE MPSD STATE | ATPG MODE MPSD STATE |
|---|---|---|
| Test-Logic-Reset | FUNC | FUNC |
| Run-Test/Idle | PAUS | CSM* |
| Select_DR-Scan | PAUS | HALT |
| Capture_DR-Scan | PAUS | PAUS |
| Shift_DR** | SDAT/SCTL/PAUS | SDAT/SCTL/PAUS** |
| Exit1_DR | PAUS | PAUS |
| Pause_DR | PAUS | PAUS |
| Exit2_DR | PAUS | PAUS |
| Update_DR | PAUS | HALT |
| Select_IR-Scan | PAUS | HALT |
| Capture_IR-Scan | PAUS | HALT |
| Shift_IR | PAUS | HALT |
| Exit1_IR | PAUS | HALT |
| Pause_IR | PAUS | HALT |
| Exit2_IR | PAUS | HALT |
| Update_IR | PAUS | HALT |

*CSM is unlocked and EXE or TRM applied per JTAG IR opcode.
**Path is selected by the opcode in the JTAG IR the same as Emulation mode. There may not be a DTP path selected, hence the inclusion of the PAUS mapping.

In STRAP mode all ECR lock bits are driven inactive, forcing the domains to use current MPSD codes. The MPSD Strap mode also forces the MPSD FUNC code onto MPSD bus 306.

MTAP Domain Clock Management

The Domain clock management is controlled by the Device mode. The UCLK_SEL and TCLK_SEL signals are gated in MCG 570 by the mode bits. In MPSD Strap mode the MCG overrides the Clock Switcher to generate UCLK_SEL. ATPG mode overrides the Clock Switcher to select TCLK. In Emulation mode the UCLK_SEL and TCLK_SEL are sourced at Clock Switcher 620 outputs.

When UCLK_SEL and TCLK_SEL are inactive they gate off the functional and scan clocks sourced from the DTP to the domain. When clock switcher 620 in the CSM detects a condition that requires the domain clock to switch from UCLK to TCLK, UCLK_SEL is driven inactive switching off the master clock while the slave phase is high and the master phase is low. The DTP's clock mux assures that the slave phase remains high at the clock mux output while both clocks are deselected. TCLK_SEL is driven active after a synchronization delay when UCLK_SEL is inactive enabling TCLK (while slave is high and master is low) to the Test Port. This mechanism performs a break before make switch of the functional clock. Switching from TCLK back to UCLK works identically. The CSM applies the PAUS code on the MPSD bus until the clock switch is complete. Also, only Test Ports that are unlocked are clock switched.

When a domain is in the process of being unlocked, the state of the clock switching signals must be such that they match the state of the clocks in the domain being unlocked. If the states do not match then a clock switch without synchronization will occur. This situation will be avoided by the software.

FIG. 39 is a schematic for MTAP Event Generation circuit (EVTA) 590. EVTA is an event which is enabled by unlocked domains. Two types of events can generate EVTA, these are MSGSW and CPU_DONE.

It can be seen from FIG. 39 that either an MSGSW or a CPU_DONE can generate EVTA depending on the state of CPULOCK, i.e. if the CPU is unlocked then the only event which can generate EVTA is DONE. The DONE is also qualified by ANYSTOP such that if the DONE was generated by ANYSTOP then no EVTA is generated, i.e. only MPSD generated DONEs can generate an EVTA. The reason for this is that if ANYSTOP was active there is no reason to generate EVTA and hence alter the state outputted by the CSM and hence the state of the MPSD bus.

MTAP Power Down Support

In emulation mode MTAP commands and scan clock switching relays on an active functional clock. In power down mode this may not be true. Therefore a functional clock request (FCLK_REQ) signal will be generated from MTAP 305 to the megamodule that requests functional clocks be enabled. FCLK_REQ is generated as defined in Table 66.

TABLE 66

FCLK_REQ Generation

| | |
|---|---|
| IRBUSY Active | Drive FCLK_REQ active in case a command requires functional clocks. |
| CSM Output HALT or Paus | It is expected the CSM will apply the MPSD code (if a new code has been initiated by a command) before IRBUSY goes inactive, thus providing overlap between IRBUSY and the CSM state keeping FCLK_REQ is active. |
| ATPG mode | Drive FCLK_REQ active to enable the functional clock is ATPG mode. |
| EMUI Event Active | FCLK_REQ is driven active and latched so the analysis module will capture the EMUI event and allow an analysis halt to be processed by the CPU. The latched FLCK_REQ is cleared by the IF_CLRn command to TLR. |

Also note that CPU_DONE must be driven inactive when the CSM applies CNTL or FUNC if the megamodule is in a power down state. CPU DONE must be driven active when the CSM applies HALT.

FIG. 40 illustrates MTAP Counter circuitry 630, which is located in CSM 530. Counter 631 is a 10 bit down counter that is configurable for different functions (performance analysis, execution control, or data streaming). Counter 631 and its control bits are shadowed for scan. The counter runs off of UCLK. while the shadow bits are run off of TCLK. When the counter's scan path is selected (LEVT_CNTR command), the shadow bits are loaded with the counter's value during the CAPTURE_DR JTAG state (not in Data Streaming Mode) and the counter is loaded from the shift bits during the JTAG IDLE state. Using the IDLE state to perform the counter load will allow a synchronous load to be performed. MTAP_BORROW and XFER_DATA signals are a single clock cycle wide.

The AUX bit is only in the counter's shift path and is utilized as the 16th bit for the ID bus value during a SMM_ID scan. During a SMM_ID scan operation the 16 bits of the counter's shift register is loaded by the CAPTURE DR state with the 16 bit ID bus value.

The counter mode field (CM[1:0]) is utilized to configure counter 631 for the selected function. Table 67 defines the CM bit field of counter 630, and Table 68 defines the CES bit field.

TABLE 67

CM Bit Field Definition

| | |
|---|---|
| 00 | Performance Profile Mode. In this mode the Counter Event Select (CES[2:0]) bits select the event that will decrement the counter while CPU_DONE is inactive. All 10 bits of the counter are utilized as a down counter. The counter will roll over to 0x3FF. In this mode the counter is utilized as a scaler to the TBC's (Test Buss Controller) event counter. The MTAP_BORROW signal may be selected through the ECR's EMUC bits to be driven to the EMUO0 signal. |
| 01 | Execution Control Mode. In this mode the counter 631 is decremented on every functional clock that EXE is applied to the DTPs. starting from the START that applied EXE. All 10 bits of the counter are utilized as a down counter. Once MTAP 305_BORROW signal is generated the counter is disabled. If the REVT field of the ECR is set to 100 the CSM will wait for MTAP_BORROW to apply the TERMINATE state. This mode will allow EXE to be applied for N + 1 functional clocks. |
| 10 | Data Streaming Mode. In this mode the 5 LSBs of event counter631's shift register is used to form the counter. The counter is decremented on every TCLK that SHIFT_DR is active. The counter is enabled by the SDAT_STRM JTAG command. Only 5 bits of the counter are utilized as a down counter. In this mode the counter will roll over to 0x1f. On the 0x01 to 0x00 transition the counter will generate the XFER_DATA signal. This signal will be driven to the CPU domain. If a store instruction is in the CPU's IR, XFER_DATA is utilized to load the DDATA_02 register from the scan register (EDDATA2). If a load instruction is in the CPU's IR, XFER DATA is utilized to update the scan register (EDDATA2) from the DDATA I2 register. If the REVT field of the ECR is set to 101 the CSM will apply EXE (CNTL) for one UCLK and then switch back to TERM (E1ALT). During CAPTURE_DR the shift register is not loaded with the UCLK counter value as in the other modes |

TABLE 68

CES Bit Field Definitions

| | |
|---|---|
| 000 | Select UCLK to decrement counter. |
| 001 | Select STALL signal inactive to decrement counter once per cycle. |
| 010 | Select STALL signal active to decrement counter for every clock the pipeline is stalled. |
| 011 | Select ICNTX signal to decrement counter for duration of interrupt pipeline context switch. |
| 100 | Select JACK signal to decrement counter for each interrupt. Provides interrupt count. |
| 101 | Select BRTK signal to decrement counter for each branch instruction taken. Provides branch count. |
| 110 | Select NOP signal to decrement counter for each NOP in E1 pipeline stage taken. Provides NOP count. |
| 111 | Select NOP- signal to decrement counter for each executed packet (NOP not in E1). Provides packet count. |

Special Emulation (SE) Device Support

Referring again to FIG. 15, megamodule boundary 301 contains signals to support a special emulation device. An SE device includes megamodule 300 and additional control registers in a fourth SE analysis (SEA) domain. The control registers for an SE device are memory mapped.

Referring back to FIG. 11, the program counter value of the execution packet in the DP phase is latched in a register referred to as PCDP. The PCDP can be compared to values held in the emulation logic for exact matches, range comparison, or bit-field masking comparison. If the PCDP matches a particular address set for hardware program breakpoint, the SE emulation logic will set SEE during that cycle.

DADDR, DDATA_I, DDATA_O, DRNW, and DBS are available on the CPU boundary to detect breakpoints on data accesses. Both address and data (qualified by the appropriate strobes) can be used for exact match, range, or mask compares of breakpoint values. Data breakpoints differ from program breakpoints in that data addresses are present at the CPU boundary during the E2 phase. The execute packet causing the breakpoint cannot be halted before entering execution. However, the emulation logic can reconstruct from the PCDP stream the instruction that caused the breakpoint. Some buffering of the PCDP is necessary for this feature.

Trace and Performance Analysis

Memory control and interrupt acknowledge signals are available on the bus for trace. A signal BRTK indicates the address represented by PCDP was a branch target. Eight signals (FU_L1, FU_M1, FU_D1, FU_S1, FU_L2, FU_M2, FU_D2 FU_S2) indicate whether the execute packet in E2 (in E1 during the previous cycle) executed an instruction on the L-,M-,D-, or S-units, on the A- or B- sides, respectively. The unit assignment refers to the decode block used for the decode. This can be used to evaluate parallelism and whether conditions for a particular instruction evaluate as true. Finally, a 3-bit EPSIZE output indicates the size of the execute packet (in words) in DC. This should be zero during interrupt processing and all extra cycles introduced by IDLEs and multi-cycle NOPs.

Figure 41A:
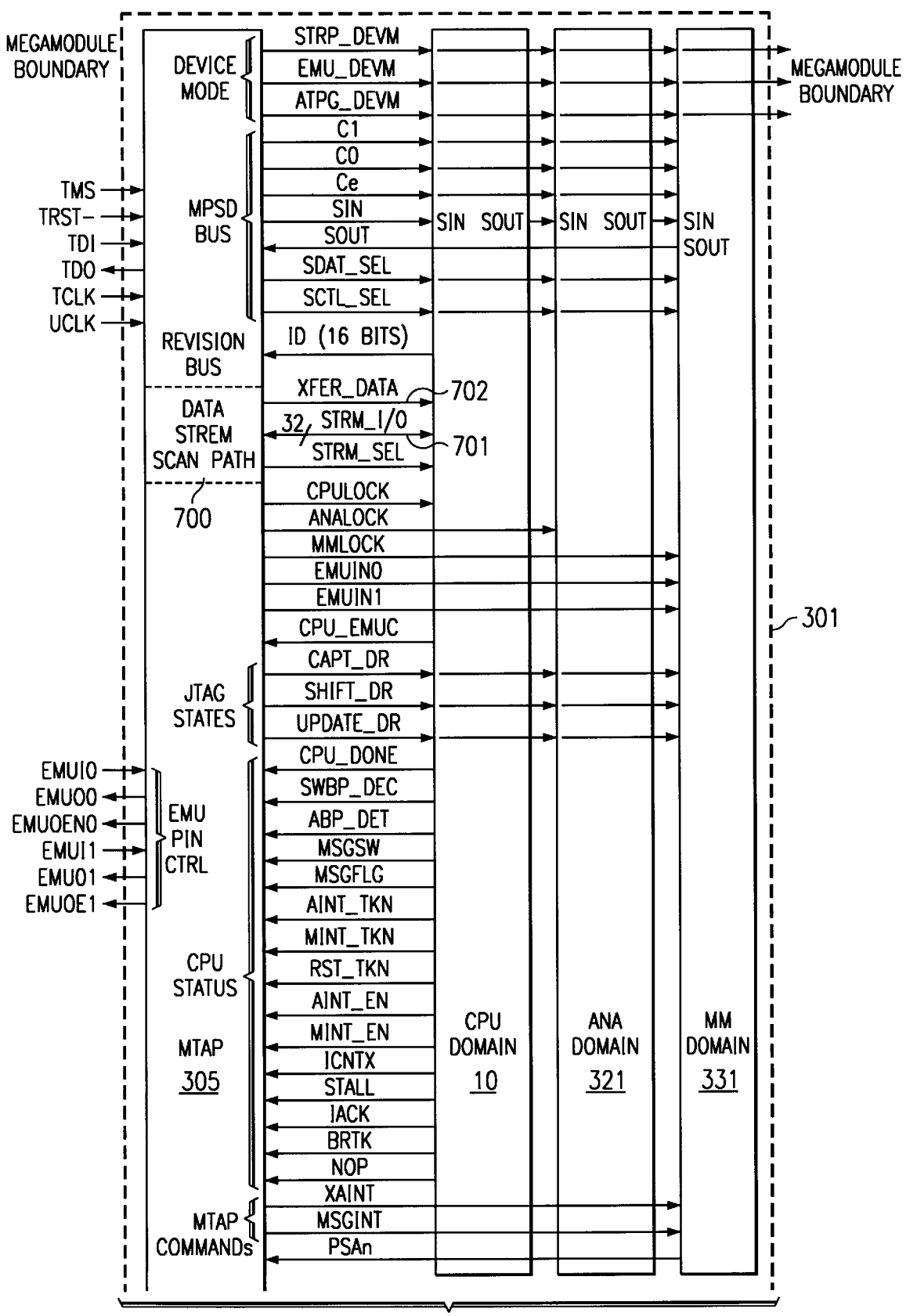
FIG. 41 is a block diagram of domain interconnections for the processor of FIG. 1.
Figure 41B:
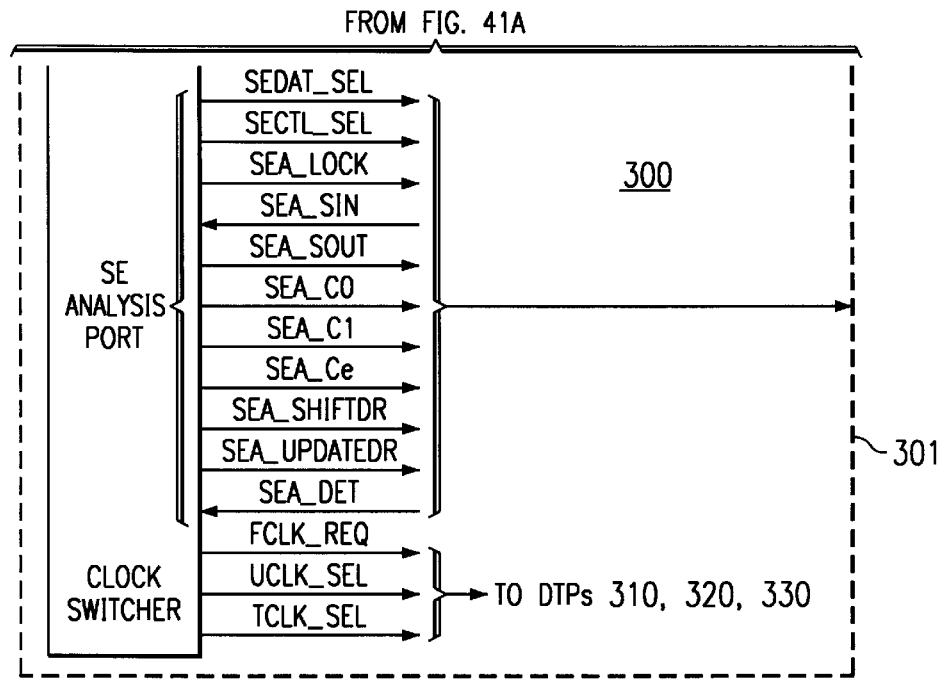

FIG. 41 is an interconnect diagram showing in more detail the interconnect between MTAP 305 and the domains and DTPs of megamodule 300. As indicated on FIG. 33, SE Analysis utilizes an independent scan path 457 and 458, although it shares MTAP MPSD control bus (C0, C1, Ce) with the megamodule DTPs. The signals described in Table 69 interface MTAP 305 to the SE Analysis module.

TABLE 69

MTAP to Sea Module Interconnect

| | |
|---|---|
| SEA_DET | SE Analysis Module Detect. This signal is an input into the MTAP and is used as a status signal to indicate the SE is present. This signal also enables the SEA_SDAT and SEA_SCTL scan paths. |
| SEA_LOCK | SE DTP Lock. This signal is sourced from the ECR and is utilized to lock or unlock the SE's DTP. |
| SEA_SIN | SE MTAP Scan In. The SE's scan port is independent of the megamodule DTP scan port, |
| SEA_SOUT | SE MTAP Scan out. |
| SEA_C0 | SE MPSD C0 bit. This bit is identical to the megamodule DTP MPSD C0 bit. |
| SEA_C1 | SE MPSD C1 bit. This bit is identical to the megamodule DTP MPSD C1 bit. |
| SEA_Ce | SE MPSD Ce bit. This bit is identical to the megamodule DTP MPSD Ce bit. |
| SEA_SHIFTDR | SE JTAG SHIFT_DR state. |
| SEA_UPDATEDR | SE JTAG UPDATE_DR state. |

The SE utilizes a DTP identical to the megamodule DTPs. The SE Analysis C0, C1, and Ce bits are timed such that they are presented to the SE's DTP in parallel with the megamodule DTP's C0, C1 and Ce bits.

Still referring to FIG. 41, MTAP 305 module provides the interface fan out between the JTAG environment and each DTP. The fanout to each DTP consists of an MPSD code (C0, C1, Ce) bus, the signals that control domain clock switching between TCLK and UCLK, the update signals that control the loading of control SRLs in the Test Port, emulation status, and MTAP commands that are not broadcast on the MPSD BUS.

Still referring to FIG. 41, Data Stream Scan Path circuitry 700 includes circuitry to transfer stream data to streaming register 393 (FIG. 30D). A STRM_I/O bus 701 transfers stream data to CPU domain 10. This circuitry is described in detail with respect to FIG. 42.

Figure 42:
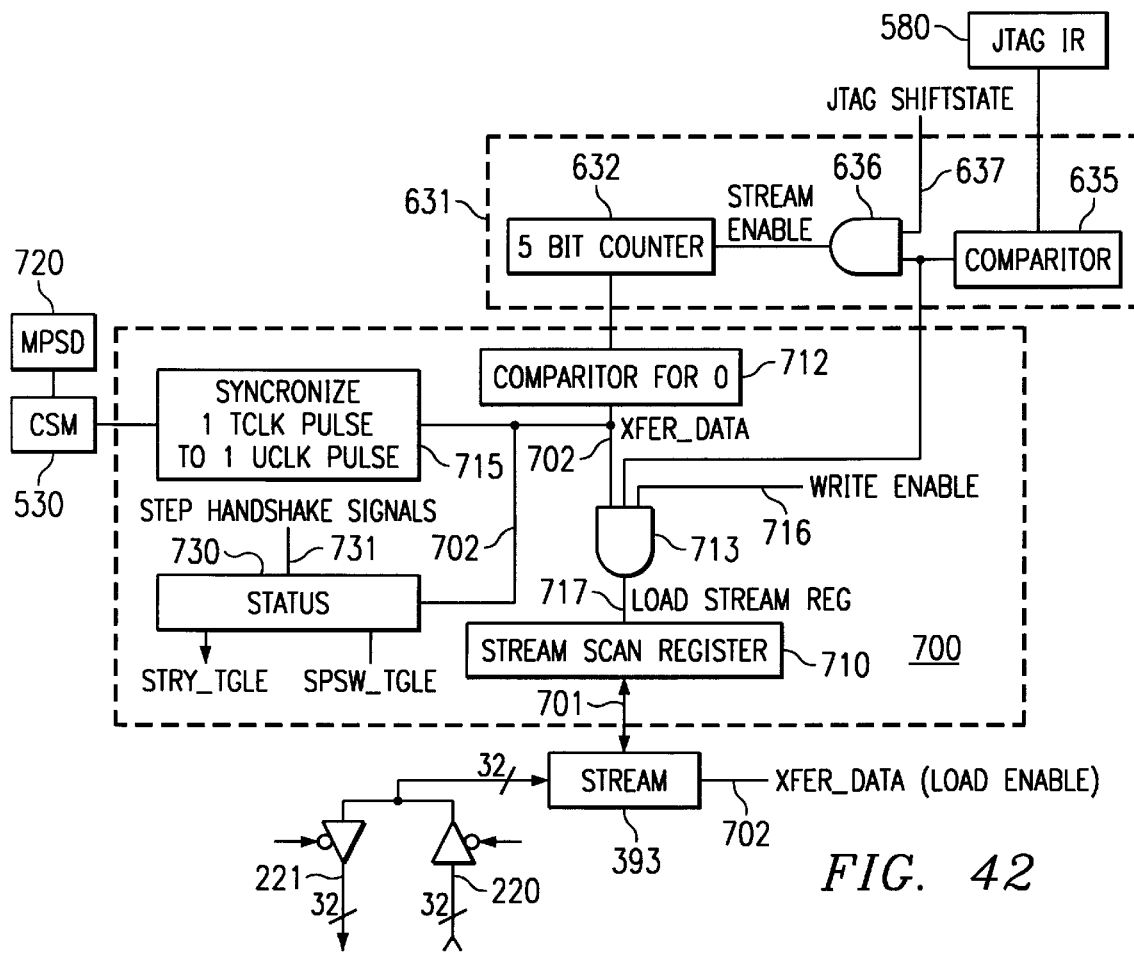
FIG. 42 is a block diagram illustrating a stream scan register within the MTAP of FIG. 41.

FIG. 42 is a schematic showing details of datascan path circuitry 700. Scan register 710 forms a portion of DATA_STRM scan path 456 (FIG. 33). STRM_I/O bus 701 transfers stream data to data streaming register STREAM 393 (described previously with reference to FIG. 30D) which is in CPU domain 10. Stream data can be transferred to and from various storage locations in CPU domain 10 as described previously with reference to Tables 37–41. Five bit counter 632 is a portion of counter 631 which was described with reference to FIG. 40. comparator 635 monitor JTAG IR 580 to determine when a SDAT_STRM JTAG instruction is present in JTAG IR 580. Gate 636 decrements counter 632 in response to each JTAG shift state indicated by signal 637. comparator 712 detects when counter 632 has reached 00 and asserts signal XFER_DATA 702.

As described with reference to Table 64, stream data is transferred from scan register 710 when a load instruction is in CPU 10s instruction register. In this case, STREAM register 393 is loaded in response to signal 702. When a store instruction is in CPU 10s instruction register, data is transferred from STREAM register 393 to scan register 710. In this case, write enable signal is asserted in response to the store instruction and gate 713 asserts signal 717 to load scan register 710 in response to XFER_DATA signal 702.

Still referring to FIG. 42, status circuit 730 forms MTAP status bits STRY_TGLE and STSW_TGLE in response to XFER_DATA signal 702, as described with reference to Table 44. Handshake signals 731 include CPU_DONE and TERM (0, 1) from ECT 520.

Figure 43:
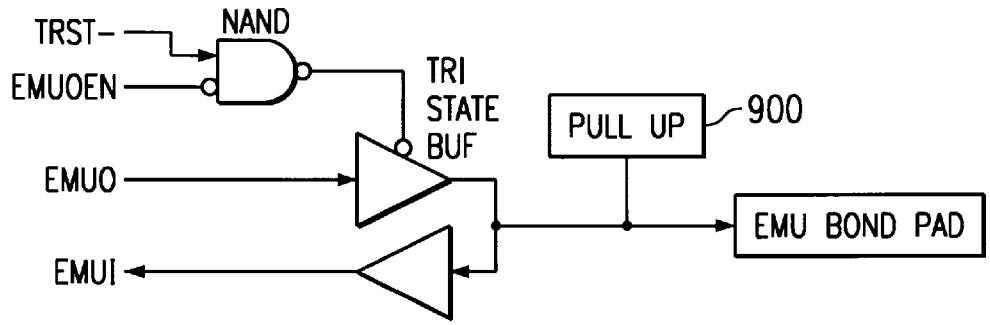
FIG. 43 is a schematic of EMU pin connection for the processor of FIG. 1.

FIG. 43 is a schematic showing EMU pin connections. EMU[1:0] are EMU Input/Output pins. These pins provide emulation event input for multiprocessor support and output for external event detection. All JTAG and emulation pins may be left as no connects in an end system. To facilitate, this the TMS, TCLK, TDI, EMU1, and EMU0 pins have small pull up resistors on them, as indicated by pull-up 900. TRST- has a small internal pull down resistor to assure that the JTAG TAP and boundary logic remains reset if left as a no connect.

Figure 44:
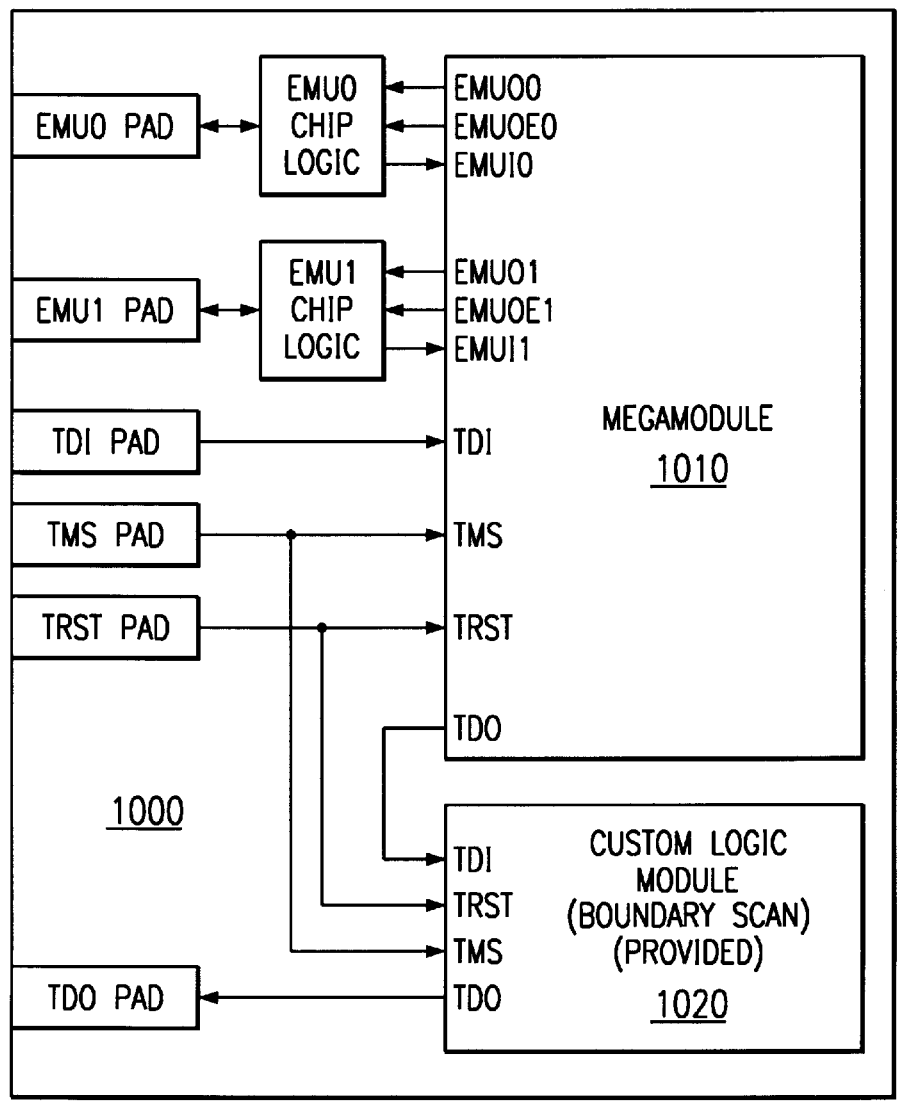
FIG. 44 is a block diagram of a JTAG TAP configuration for the processor of FIG. 1; and, FIG. 45 is a flow chart illustrating a process for accessing internal storage nodes of the processor of FIG. 1 during emulation by scanning in a sequence of instructions to be executed by the processor.

FIG. 44 is a block diagram of an alternative embodiment of a device 1000 which uses aspect of the present invention. There are multiple configurations that can be supported by MTAP 305 JTAG Interface. FIG. 44 is one example which has a megamodule 1010 and a custom logic module 1020. It is important to note that all JTAG module TDO/TDI signals are connected serially and all TMS and TRST signals are connected in parallel. The order of the modules is not important. The module order must be provided for the target systems JTAG device configuration file. This file is utilized by the emulation software to manage multiple JTAG devices and JTAG modules on the same scan chain.

EMU Status

Referring again to FIG. 41, various emulation status bits are generated within the CPU or the on-chip memory system of microprocessor 1. These signals are brought into MTAP 305 as levels. They are latched into JTAG IR 580's shift register during the CAPTURE-IR state. Table 70 describes Stop Mode Emulation status signals. Table 71 describes real time mode emulation status signals. Table 72 describes CPU Emulation Status signals. Table 73 describes CPU Emulation Event signals.

TABLE 70

Stop Mode Emulation Status Signals

| | |
|---|---|
| CPU_DONE | CPU Done. This signal indicates the CPU's instruction pipeline is stalled in the ready state by an emulation event (DTP halt, software breakpoint (SWBP), or an analysis breakpoint (ABP). |
| SWBP_DEC | CPU's instruction pipeline has stalled in the ready state by a software breakpoint (SWBP) in the CPU's decode pipeline stage. |
| ABP_DET | Analysis Breakpoint Detected. This signal indicates the CPU's instruction pipeline has stalled in the ready state by an analysis breakpoint. |

TABLE 71

Real Time Mode Emulation Status Signals

| | |
|---|---|
| RST_RKN | Reset Detect. This signal indicates a megamodule reset has occurred. This signal is not driven active until the context switch is complete and E1 has been loaded with the first valid opcode of the reset service routine |
| MINT_TKN | Message Interrupt Taken. This signal indicates a message interrupt has been taken. This signal in not driven active until the context switch is complete and E1 has been loaded with the first valid opcode of the interrupt service routine. |
| AINT_TKN | Analysis Interrupt Taken. This signal indicates an analysis interrupt has been taken. This signal is not driven active until the context switch is complete and E1 has been loaded with the first valid opcode of the interrupt service routine. |
| MSGFLG | Message Flag. This signal provides a flag for message handshake communications. |
| MSGSW | Message Switch. This signal is utilized as a EVTA CSM event utilized to allow the real time monitor to control the message scan process. |

TABLE 72

CPU Emulation Status Signals

| | |
|---|---|
| MINT_EN | Message Interrupt Enable. This status signal is only true when the interrupt can be taken. Therefore it must be masked with GE, NME, and MSGE. |
| AINT_EN | Message Interrupt Enable. This status signal is only true when the interrupt can be taken. Therefore it must be masked with GE, NMIE and AIE (if PRI is 0). |

TABLE 73

CPU Emulation Event Signals

| | |
|---|---|
| STALL | Instruction pipeline stall. |
| IACK | Interrupt acknowledge. |
| ICNTX | Interrupt Context Switch. This signal is active duration of interrupt pipeline context switch. |
| BRTK | Branch Taken. |
| NOP | NOP in E1 pipeline stage taken. |

As used herein, the terms "applied," "connected," and "connection" mean electrically connected, including where additional elements may be in the electrical connection path.

While the invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modifications of the embodiments as fall within the true scope and spirit of the invention.

What is claimed is:

1. A method for debugging a processor within a data processing system, the processor having a multi-word instruction register, comprising the steps of:

executing system code from the multi-word instruction register in an instruction execution pipeline in a normal operational manner;

halting the normal operation of the processor by saying at least a first partially executed instruction to an external test system;

inhibiting fetching of instructions into the multi-word instruction register;

transferring a first sequence of debug code instructions into the multi-word instruction register from the external test system;

executing the sequence of debug code instructions in the processor's multi-word instruction register to perform a debug operation on the processor; and resuming execution of the system code in the multi-word instruction register by restoring at least the first partially executed instruction to the multi-word instruction register from the external test system, enabling fetching of instructions and starting normal operation of the processor.

2. The method of claim 1, wherein the step of executing debug code further comprises:

executing the sequence of debug code in a normal operational manner to access first data in a first memory circuit internal to the processor and to store the first data in at least a first memory element of the processor; and transferring the first data from the first memory element to a test port on the processor.

3. The method of claim 2, wherein the step of halting the normal operation further comprises receiving a debug command via the test port from the external debug system.

4. The method of claim 3, wherein the step of executing the sequence of debug code in a normal operational manner further comprises sending a notification via the test port to the external test system in response to executing an instruction of the sequence of debug code.

5. The method of claim 4, wherein the steps of halting, executing debug code, and resuming execution of the system code does not cause a previously fetched instruction to be refetched from program memory.

6. The method of claim 5 wherein the step of transferring the first data further comprises transferring the first data from the first memory element via a serial scan path to the test port on the processor.

7. The method of claim 1, wherein the step of halting comprises saving a first state of the contents the instruction execution pipeline.

8. The method of claim 7, wherein the step of halting further comprises stepping the instruction execution pipeline one pipeline phase and saving a second state of the contents the instruction execution pipeline; and repeating the step of stepping one pipeline phase and saving a further state of contents of the instruction execution pipeline until the system code instructions are flushed from the instruction execution pipeline.

9. The method of claim 8, wherein the step of resuming execution comprises restoring the first state of the contents of the instruction pipeline into the instruction pipeline before normal operation of the processor is started.

10. The method of claim 9, wherein the step of executing debug code further comprises executing the sequence of debug code in a normal operational manner to access first data in a first memory circuit internal to the processor and to store the first data in at least a first memory element of the processor.

11. The method of claim 10, further comprising the step of transferring the first data from the first memory element to a test port on the processor.

12. The method of claim 11, wherein the step of executing the sequence of debug code in a normal operational manner further comprises sending a first notification via the test port to the external debug system in response to executing an instruction of the sequence of debug code.

13. The method of claim 12, further comprising the steps of transferring a second sequence of debug code instructions into the multi-word instruction register from the external debug system in response to the first notification and executing the second sequence of debug code while fetching of instruction remains inhibited.

14. The method of claim 13, wherein the steps of halting, executing debug code, and resuming execution of the system code does not cause a previously fetched instruction to be refetched from program memory.

15. The method of claim 14 wherein the step of transferring the first data further comprises transferring the first data from the first memory element via a serial scan path to the test port on the processor.

16. A data processing system comprising a microprocessor which has a multi-word instruction register, the microprocessor further comprising:

an instruction execution pipeline connected to the multi-word instruction register for executing system code from the multi-word instruction register in a normal operational manner;

emulation circuitry connected to the instruction execution pipeline and to the multi-word instruction register for halting the normal operation of the processor by saving at least a first partially executed instruction to an external test system, the emulation circuitry operable to inhibit fetching of instructions into the multi-word instruction register and to transfer a first sequence of debug code into the multi-word instruction register from the external debug system and further operable to restore at least the fit partially executed instruction to the multi-word instruction register from the external test system and to enable fetching of instructions; and wherein the instruction execution pipeline is further operable to execute the first sequence of debug code in the processor's multi-word instruction register to perform a debug operation on the processor and to then resume execution of the restored at least first partially executed instruction in the multi-word instruction register.

17. The data processing system of claim 16, wherein the emulation circuitry is further operable to save a first state of the contents of the instruction execution pipeline after halting the normal operation of the processor.

18. The data processing system of claim 17, wherein the emulation circuitry is further operable to restore the first state of the contents of the instruction pipeline into the instruction pipeline before normal operation of the processor is resumed.

19. The data processing system of claim 18, wherein the instruction execution pipeline circuitry is further operable to execute a software breakpoint instruction in the sequence of debug code and to transfer a second sequence of debug code into the multi-word instruction register from an external test system in response to executing the software breakpoint instruction.

20. The data processing system of claim 19, further comprising program memory for holding program instructions connected to the microprocessor.

21. The data processing system of claim 20, wherein the instruction execution pipeline is further operable to resume execution of system code in a normal operational manner after executing the first sequence of debug code without refetching an instruction from the program memory.

22. The data processing system of claim 21, further comprising a plurality of peripheral devices connected to the microprocessor.

* * * * *